(12) United States Patent
Buyandalai et al.

(10) Patent No.: US 10,811,067 B2
(45) Date of Patent: Oct. 20, 2020

(54) MAGNETIC MEMORY DEVICE WITH NONMAGNETIC LAYER BETWEEN TWO MAGNETIC LAYERS

(71) Applicant: Kabushiki Kaisha Toshiba, Tokyo (JP)

(72) Inventors: Altansargai Buyandalai, Kanagawa (JP); Satoshi Shirotori, Kanagawa (JP); Yuichi Ohsawa, Kanagawa (JP); Hideyuki Sugiyama, Kanagawa (JP); Mariko Shimizu, Tokyo (JP); Hiroaki Yoda, Kanagaw (JP); Katsuhiko Koui, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 16/119,003

(22) Filed: Aug. 31, 2018

(65) Prior Publication Data

US 2019/0287589 A1   Sep. 19, 2019

(30) Foreign Application Priority Data

Mar. 15, 2018 (JP) ................. 2018-048090

(51) Int. Cl.
*G11C 11/16* (2006.01)
*H01L 43/02* (2006.01)
(Continued)

(52) U.S. Cl.
CPC ........ *G11C 11/161* (2013.01); *G11C 11/1675* (2013.01); *H01L 27/228* (2013.01); *H01L 43/02* (2013.01); *H01L 43/12* (2013.01)

(58) Field of Classification Search
CPC .............. G11C 11/161; G11C 11/1675; G11C 11/1659; H01L 43/02; H01L 43/12; H01L 27/228
See application file for complete search history.

(56) References Cited

U.S. PATENT DOCUMENTS 9,076,537 B2   7/2015   Khvalkovskiy et al.
9,105,830 B2   8/2015   Khvalkovskiy et al.
(Continued)

FOREIGN PATENT DOCUMENTS

JP         5104753 B2    12/2012
JP       2014-45196 A     3/2014
JP         6275806 B1     2/2018

*Primary Examiner* — Sultana Begum
(74) *Attorney, Agent, or Firm* — Finnegan, Henderson, Farabow, Garrett & Dunner, L.L.P.

(57) ABSTRACT

According to one embodiment, a magnetic memory device includes a conductive layer, a first magnetic layer, a second magnetic layer, and a first nonmagnetic layer. The conductive layer includes first and second regions, and a third region between the first region and the second region. The second magnetic layer is provided between the third region and the first magnetic layer in a first direction crossing a second direction. The second direction is from the first region toward the second region. The first nonmagnetic layer is provided between the first and second magnetic layers. The second region includes first to third conductive portions. A direction from the first conductive portion toward the second conductive portion is aligned with a third direction. The third direction crosses a plane including the first and second directions. The third conductive portion is between the first and second conductive portions in the third direction.

15 Claims, 33 Drawing Sheets

(51) Int. Cl.
*H01L 27/22* (2006.01)
*H01L 43/12* (2006.01)

(56) References Cited

U.S. PATENT DOCUMENTS

| | | | |
|---|---|---|---|
| 2002/0024766 A1* | 2/2002 | Sasaki | G11B 5/3109 360/125.6 |
| 2012/0133008 A1* | 5/2012 | Yamada | B82Y 10/00 257/421 |
| 2018/0159024 A1 | 6/2018 | Buyandalai et al. | |
| 2019/0088345 A1* | 3/2019 | Quinsat | G11C 19/0841 |

* cited by examiner

FIG. 26
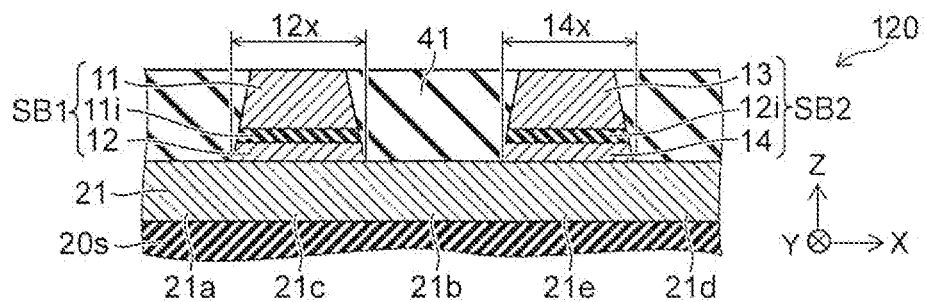
FIG. 27A                    FIG. 27B
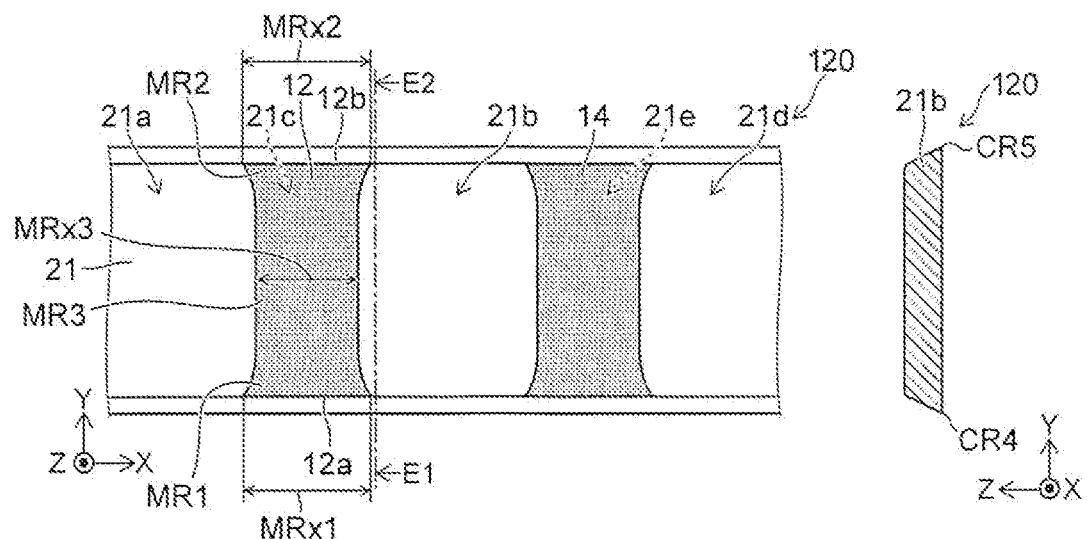
FIG. 28A                    FIG. 28B
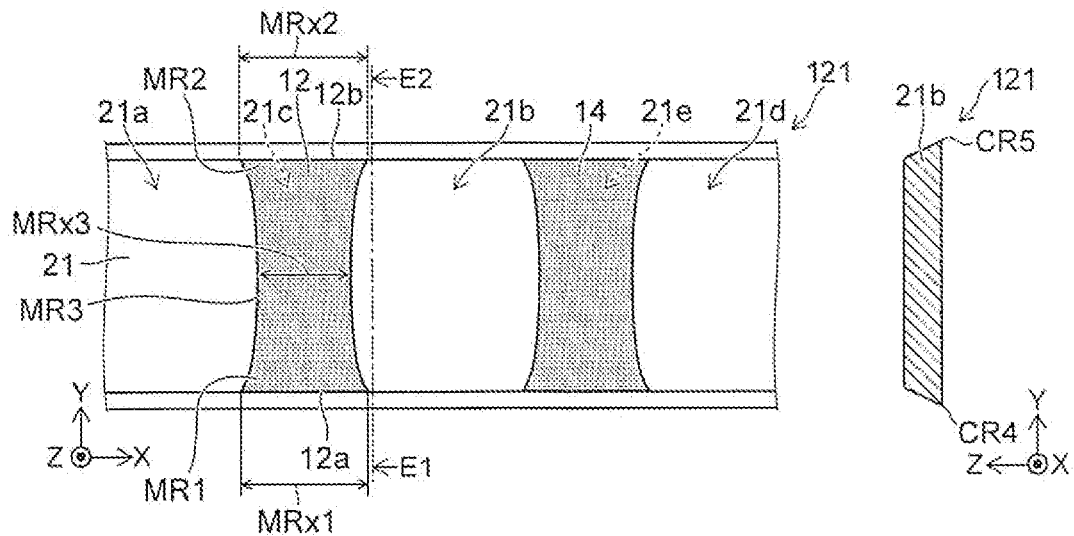

MAGNETIC MEMORY DEVICE WITH NONMAGNETIC LAYER BETWEEN TWO MAGNETIC LAYERS

CROSS-REFERENCE TO RELATED APPLICATIONS

This application is based upon and claims the benefit of priority from Japanese Patent Application No. 2018-048090, filed on Mar. 15, 2018; the entire contents of which are incorporated herein by reference.

FIELD

Embodiments described herein relate generally to a magnetic memory device.

BACKGROUND

Stable operations of a magnetic memory device are desirable.

BRIEF DESCRIPTION OF THE DRAWINGS

FIG. 26 is a schematic cross-sectional view illustrating the magnetic memory device according to the second embodiment;

FIG. 27A and FIG. 27B are schematic views illustrating a portion of the magnetic memory device according to the second embodiment;

FIG. 28A and FIG. 28B are schematic views illustrating a portion of a magnetic memory device according to the second embodiment;

DETAILED DESCRIPTION

Figure 1A:
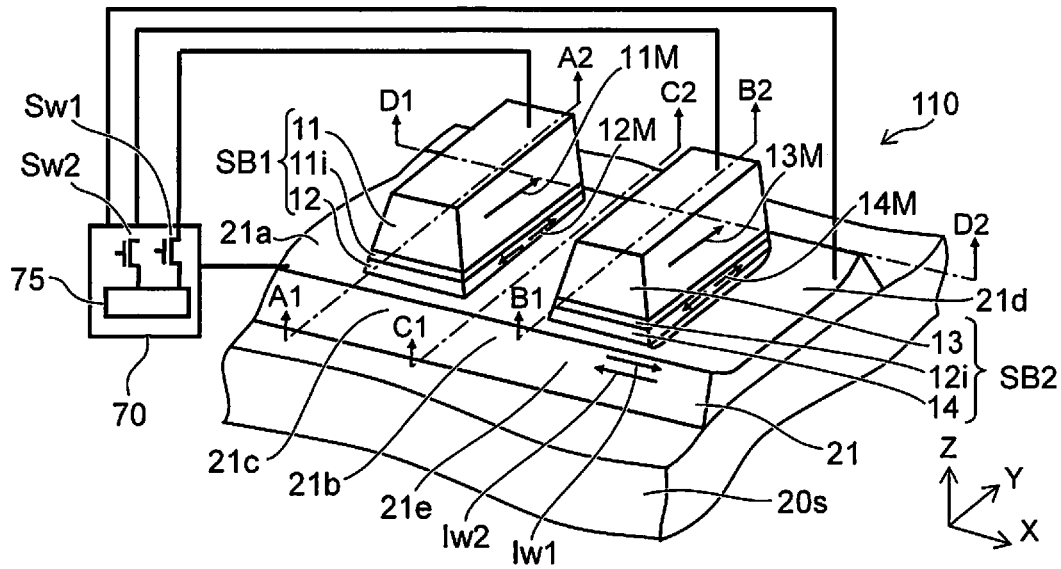
FIG. 1A to FIG. 1D are schematic views illustrating a magnetic memory device according to a first embodiment.

According to one embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The second region includes first to third conductive portions. A direction from the first conductive portion toward the second conductive portion is aligned with a third direction. The third direction crosses a plane including the first direction and the second direction. The third conductive portion is between the first conductive portion and the second conductive portion in the third direction. A thickness along the first direction of the first conductive portion is thicker than a thickness along the first direction of the third conductive portion.

According to another embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The second magnetic layer includes first to third magnetic portions. A direction from the first magnetic portion toward the second magnetic portion is aligned with a third direction. The third direction crosses a plane including the first direction and the second direction. The third magnetic portion is between the first magnetic portion and the second magnetic portion in the third direction. A length along the second direction of the first magnetic portion is longer than a length along the second direction of the third magnetic portion.

According to another embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The second region includes first to third conductive portions. A direction from the first conductive portion toward the second conductive portion is aligned with a third direction. The third direction crosses a plane including the first direction and the second direction. The third conductive portion is between the first conductive portion and the second conductive portion in the third direction. A thickness along the first direction of the first conductive portion is thinner than a thickness along the first direction of the third conductive portion. The second magnetic layer includes a first end portion and a second end portion. A direction from the first end portion toward the second end portion is aligned with the third direction. A position in the third direction of at least a portion of the first conductive portion is between a position in the third direction of the first end portion and a position in the third direction of the second end portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a magnetic memory device according to a first embodiment.

Figure 2:
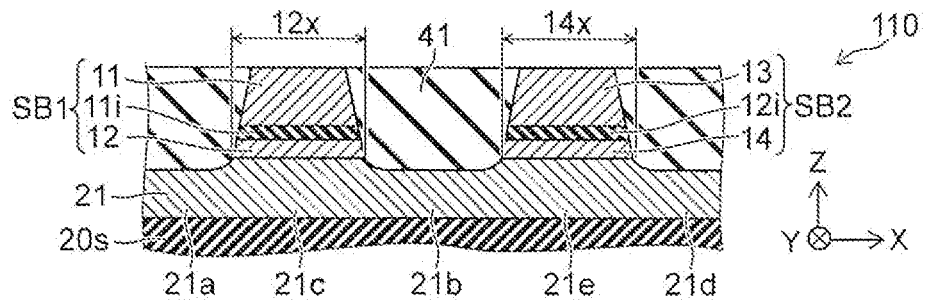
FIG. 2 is a schematic cross-sectional view illustrating the magnetic memory device according to the first embodiment.

FIG. 2 is a schematic cross-sectional view illustrating the magnetic memory device according to the first embodiment.

Figure 1B:
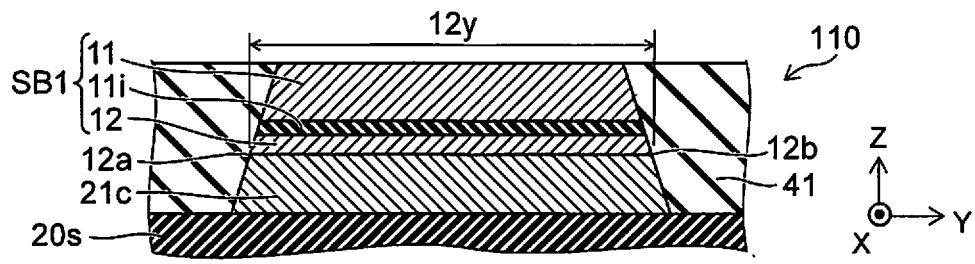
Figure 1C:
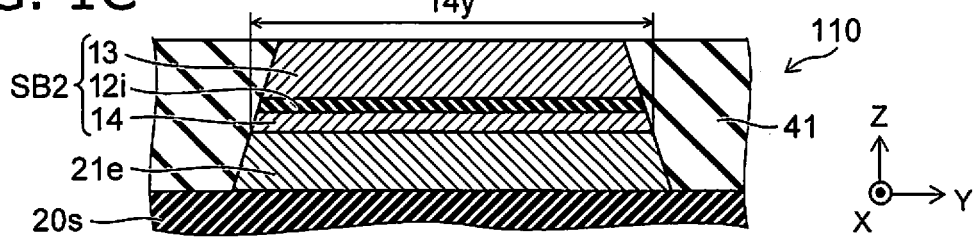
Figure 1D:
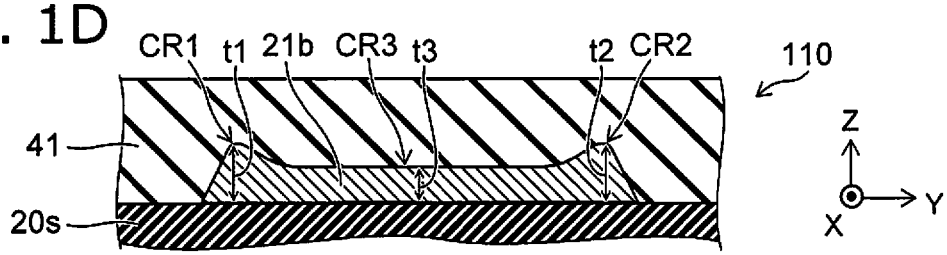

FIG. 1A is a perspective view. FIG. 1B is a line A1-A2 cross-sectional view of FIG. 1A. FIG. 1C is a line B1-B2 cross-sectional view of FIG. 1A. FIG. 1D is a line C1-C2 cross-sectional view of FIG. 1A. In FIG. 1A, the insulating portions (described below) that are included in the magnetic memory device are not illustrated for easier viewing of the drawing. FIG. 2 is a line D1-D2 cross-sectional view of FIG. 1A.

As shown in FIG. 1A, the magnetic memory device 110 according to the embodiment includes a conductive layer 21, a first magnetic layer 11, a second magnetic layer 12, and a first nonmagnetic layer 11i. A third magnetic layer 13, a fourth magnetic layer 14, and a second nonmagnetic layer 12i are further provided in the example.

For example, the conductive layer 21 is provided on a base body 20s. The base body 20s may be at least a portion of a substrate. The base body 20s is, for example, insulative. The base body 20s may include, for example, at least one of silicon oxide or aluminum oxide. The silicon oxide may be, for example, thermally-oxidized silicon.

The conductive layer 21 includes first to third regions 21a to 21c. The third region 21c is positioned between the first region 21a and the second region 21b. For example, the third region 21c is continuous with the first region 21a and the second region 21b. In the example, the conductive layer 21 further includes a fourth region 21d and a fifth region 21e. The second region 21b is provided between the first region 21a and the fourth region 21d. The fifth region 21e is provided between the second region 21b and the fourth region 21d. These regions are continuous with each other.

The conductive layer 21 includes a metallic element. The metallic element includes, for example, Ta. Other examples of the material of the conductive layer 21 are described below.

The first magnetic layer 11 is separated from the third region 21c in a first direction. The second magnetic layer 12 is provided between the third region 21c and the first magnetic layer 11 in the first direction. The first nonmagnetic layer 11i is provided between the first magnetic layer 11 and the second magnetic layer 12. Another layer may be provided between the first magnetic layer 11 and the first nonmagnetic layer 11i. Another layer may be provided between the second magnetic layer 12 and the first nonmagnetic layer 11i.

The first direction is, for example, a Z-axis direction. One direction perpendicular to the Z-axis direction is taken as an X-axis direction. A direction perpendicular to the Z-axis direction and the X-axis direction is taken as a Y-axis direction.

The first direction crosses a second direction from the first region 21a toward the second region 21b. In the example, the second direction corresponds to the X-axis direction.

The first magnetic layer 11 is, for example, ferromagnetic. The second magnetic layer 12 is, for example, ferromagnetic or soft magnetic. The first magnetic layer 11 and the second magnetic layer 12 include, for example, at least one selected from the group consisting of Fe and Co. The first nonmagnetic layer 11i includes, for example, MgO. The first nonmagnetic layer 11i may include, for example, Cu. Other examples of the materials of the first magnetic layer 11, the second magnetic layer 12, and the first nonmagnetic layer 11i are described below.

The first magnetic layer 11, the second magnetic layer 12, and the first nonmagnetic layer 11i are included in a first stacked body SB1. For example, the first stacked body SB1 corresponds to one memory portion (memory cell).

The first magnetic layer 11 is, for example, a fixed magnetic layer. The second magnetic layer 12 is, for example, a free magnetic layer. A first magnetization 11M of the first magnetic layer 11 does not change easily compared to a second magnetization 12M of the second magnetic layer 12. For example, the first magnetic layer 11 functions as a reference layer. For example, the second magnetic layer 12 functions as a memory layer.

For example, the first stacked body SB1 functions as a magnetic variable resistance element. For example, a TMR (Tunnel Magnetoresistance) effect occurs in the first stacked body SB1. For example, the electrical resistance of a path including the first magnetic layer 11, the first nonmagnetic layer 11i, and the second magnetic layer 12 changes according to the difference between the orientation of the first magnetization 11M and the orientation of the second magnetization 12M. The first stacked body SB1 includes, for example, a magnetic tunnel junction (MTJ). For example, the first stacked body SB1 corresponds to a MTJ element. For example, the first stacked body SB1 may correspond to a GMR element.

For example, the second magnetic layer 12 is provided on the conductive layer 21. The first nonmagnetic layer 11i is provided on the second magnetic layer 12. The first magnetic layer 11 is provided on the first nonmagnetic layer 11i. For example, the conductive layer 21 and the second magnetic layer 12 contact each other.

On the other hand, the third magnetic layer 13 is separated from the fifth region 21e in the first direction (the Z-axis direction). The direction from the first magnetic layer 11 toward the third magnetic layer 13 is aligned with the X-axis direction. The fourth magnetic layer 14 is provided between the fifth region 21e and the third magnetic layer 13 in the first direction. The second nonmagnetic layer 12i is provided between the third magnetic layer 13 and the fourth magnetic layer 14. Another layer may be provided between the third magnetic layer 13 and the second nonmagnetic layer 12i. Another layer may be provided between the fourth magnetic layer 14 and the second nonmagnetic layer 12i.

The configurations of the first magnetic layer 11 and the second magnetic layer 12 are applicable respectively to the third magnetic layer 13 and the fourth magnetic layer 14. The configuration of the first nonmagnetic layer 11i is applicable to the second nonmagnetic layer 12i.

The third magnetic layer 13, the fourth magnetic layer 14, and the second nonmagnetic layer 12i are included in a second stacked body SB2. For example, the second stacked body SB2 corresponds to another one memory portion (memory cell). For example, the conductive layer 21 and the fourth magnetic layer 14 contact each other.

A third magnetization 13M of the third magnetic layer 13 does not change easily compared to a fourth magnetization 14M of the fourth magnetic layer 14. For example, the third magnetic layer 13 functions as a reference layer. For example, the fourth magnetic layer 14 functions as a memory layer.

The fourth magnetization 14M of the fourth magnetic layer 14 changes due to a current (e.g., a first current Iw1, a second current Iw2, or the like) flowing in the conductive layer 21.

The magnetic memory device 110 may further include a controller 70. The controller 70 is electrically connected to the first region 21a and the second region 21b. In the example, the controller 70 is electrically connected to the first region 21a and the fourth region 21d.

The controller 70 is further electrically connected to the first magnetic layer 11. The controller 70 is further electrically connected to the third magnetic layer 13. For example, a drive circuit 75 is provided in the controller 70. The drive circuit 75 is electrically connected to the first magnetic layer 11 by a first interconnect 70a. In the example, a first switch Sw1 (e.g., a transistor) is provided in a current path between the drive circuit 75 and the first magnetic layer 11. On the other hand, a second switch Sw2 (e.g., a transistor) is provided in a current path between the drive circuit 75 and the third magnetic layer 13. These switches are included in the controller 70. The drive circuit 75 and the third magnetic layer 13 are electrically connected by a second interconnect 70b.

In a first operation (a first program operation), the controller 70 supplies the first current Iw1 (a first program current) to the conductive layer 21. Thereby, a first state is formed. The first current Iw1 is a current from the first region 21a toward the second region 21b (or the fourth region 21d). In a second operation (a second program operation), the controller 70 supplies the second current Iw2 (a second program current) to the conductive layer 21. Thereby, a second state is formed. The second program current Iw2 is a current from the second region 21b (or the fourth region 21d) toward the first region 21a.

A first electrical resistance between the first magnetic layer 11 and the conductive layer 21 after the first operation (in the first state) is different from a second electrical resistance between the first magnetic layer 11 and the conductive layer 21 after the second operation (in the second state). The electrical resistance may be, for example, the electrical resistance between the first region 21a of the conductive layer 21 and the magnetic layer. The electrical resistance may be, for example, the electrical resistance between the magnetic layer and any portion (e.g., the second region 21b, the fourth region 21d, etc.) of the conductive layer 21.

For example, the electrical resistance difference is based on the difference of the states of the second magnetization 12M between the first state and the second state.

In a read operation, the controller 70 may detect a characteristic (which may be a voltage, a current, or the like) corresponding to the electrical resistance between the first magnetic layer 11 and the conductive layer 21 (e.g., the first region 21a).

For example, the second magnetic layer 12 functions as a layer that stores information. For example, the first state in which the second magnetization 12M is oriented in one direction corresponds to first information to be stored. The second state in which the second magnetization 12M is oriented in another direction corresponds to second information to be stored. For example, the first information corresponds to one of "0" or "1." The second information corresponds to the other of "0" or "1."

For example, the second magnetization 12M can be controlled by the current (the program current) flowing in the conductive layer 21. For example, the orientation of the second magnetization 12M can be controlled by the orientation of the current (the program current) of the conductive layer 21. For example, the conductive layer 21 functions as a Spin Orbit Layer (SOL). For example, the orientation of the second magnetization 12M can be changed by the spin-orbit torque generated between the conductive layer 21 and the second magnetic layer 12. The spin-orbit torque is based on the current (the program current) flowing in the conductive layer 21. The current (the program current) is supplied by the controller 70 (e.g., the drive circuit 75).

A third state is formed in the second stacked body SB2 when the controller 70 supplies the first current Iw1 to the conductive layer 21. A fourth state is formed in the second stacked body SB2 when the controller 70 supplies the second current Iw2 to the conductive layer 21. A third electrical resistance between the third magnetic layer 13 and the conductive layer 21 in the third state is different from a fourth electrical resistance between the third magnetic layer 13 and the conductive layer 21 in the fourth state.

For example, the electrical resistance difference is based on the difference of the states of the fourth magnetization 14M between the third state and the fourth state.

In a read operation, the controller 70 may detect a characteristic (which may be a voltage, a current, or the like) corresponding to the electrical resistance between the third magnetic layer 13 and the conductive layer 21.

At least one of the first stacked body SB1 (the first memory cell) or the second stacked body SB2 (the second memory cell) is selected by the operations of the first switch Sw1 and the second switch Sw2 recited above. The program operation and the read operation are performed for the desired memory cell. Examples of the operations of the controller 70 are described below.

As shown in FIG. 1B, the second magnetic layer 12 has a length 12y along the Y-axis direction. As shown in FIG. 2, the second magnetic layer 12 has a length 12x along the X-axis direction. In the example, the length 12y is longer than the length 12x. For example, the orientation of the magnetization 12M is stable.

As shown in FIG. 1C, the fourth magnetic layer 14 has a length 14y along the Y-axis direction. As shown in FIG. 2, the fourth magnetic layer 14 has a length 14x along the X-axis direction. In the example, the length 14y is longer than the length 14x. For example, the orientation of the magnetization 14M is stable.

As shown in FIG. 1B to FIG. 1D and FIG. 2, an insulating portion 41 is provided around the first stacked body SB1 and the second stacked body SB2. The insulating portion 41 is not illustrated in FIG. 1A.

As shown in FIG. 1B, FIG. 1C, and FIG. 2, the conductive layer 21 includes a region (an overlap region) overlapping the stacked body. The overlap region is, for example, the third region 21c, the fifth region 21e, etc. As shown in FIG. 1B, FIG. 1C, and FIG. 2, the thickness of the conductive layer 21 is substantially constant in the overlap region (the third region 21c and the fifth region 21e).

As shown in FIG. 1D and FIG. 2, the conductive layer 21 includes a region (a non-overlap region) that does not overlap the second magnetic layer 12 or the fourth magnetic layer 14. The non-overlap region is, for example, the first region 21a, the second region 21b, the fourth region 21d, etc. For example, the non-overlap region contacts the insulating portion 41.

In the embodiment, the thickness of the non-overlap region of the conductive layer 21 is not constant. The second region 21b of the conductive layer 21 for such a configuration will now be described. The description recited below is applicable to other non-overlap regions (the first region 21a, the fourth region 21d, etc.).

As shown in FIG. 1D, the second region 21b includes first to third conductive portions CR1 to CR3. The direction from the first conductive portion CR1 toward the second conductive portion CR2 is aligned with a third direction. The third direction crosses a plane including the first direction and the second direction. The third direction is, for example, the Y-axis direction. The third conductive portion CR3 is between the first conductive portion CR1 and the second conductive portion CR2 in the third direction (the Y-axis direction).

The thickness along the first direction (the Z-axis direction) of the first conductive portion CR1 is taken as a first thickness t1. The thickness along the first direction of the second conductive portion CR2 is taken as a second thickness t2. The thickness along the first direction of the third conductive portion CR3 is taken as a third thickness t3. In the first embodiment, the first thickness t1 is thicker than the third thickness t3. In the example, the second thickness t2 also is thicker than the third thickness t3.

In the embodiment, such a thickness difference is provided in the non-overlap portion of the conductive layer 21. The electrical resistance of the first conductive portion CR1 is lower than the electrical resistance of the third conductive portion CR3 due to the thickness difference. The electrical resistance of the second conductive portion CR2 is lower than the electrical resistance of the third conductive portion CR3. For example, when the current (the first current Iw1, the second current Iw2, etc., recited above) flows in the conductive layer 21, the current density (the amount of current for a unit y-width) of the first conductive portion CR1 is higher than the current density (the amount of current for the unit y-width) of the third conductive portion CR3. Similarly, the current density (the amount of current for the unit y-width) of the second conductive portion CR2 is higher than the current density (the amount of current for the unit y-width) of the third conductive portion CR3.

For example, the difference between the current densities (the amounts of current for the unit y-width) in the non-overlap region causes a difference to occur between the current densities in the overlap region. In the example, the current density of the portion of the overlap region (e.g., the third region 21c) overlapping the first conductive portion CR1 in the X-axis direction is higher than the current density of the portion of the overlap region (e.g., the third region 21c) overlapping the third conductive portion CR3.

For example, the change of the orientation of the magnetization of the memory layer (e.g., the second magnetic layer 12, the fourth magnetic layer 14, etc.) corresponds to the current density of the conductive layer 21 overlapping the memory layer. For example, the orientation of the magnetization changes easily when the current density is high.

For example, the magnetization does not change easily at the end portion of the memory layer. In the embodiment, the current density is relatively high in the portions (the first conductive portion CR1 and the second conductive portion CR2) of the conductive layer 21 corresponding to the end portions of the memory layer. Thereby, the change of the magnetization occurs stably. According to the embodiment, a magnetic memory device can be provided in which stable operations are obtained.

For example, the current density for the reversal of the magnetization of the second magnetic layer 12 can be reduced. For example, the power consumption can be reduced. For example, the reversal of the magnetization of the second magnetic layer 12 can be faster. For example, a high-speed operation is obtained.

In the embodiment, for example, the first thickness t1 (the thickness along the first direction (the Z-axis direction) of the first conductive portion CR1) is not less than 1.02 times and not more than 1.5 times the third thickness t3 (the thickness along the first direction of the third conductive portion CR3). By such thicknesses, for example, a current density difference is obtained effectively. For example, the second thickness t2 is not less than 1.02 times and not more than 1.5 times the third thickness t3.

Figure 3A:
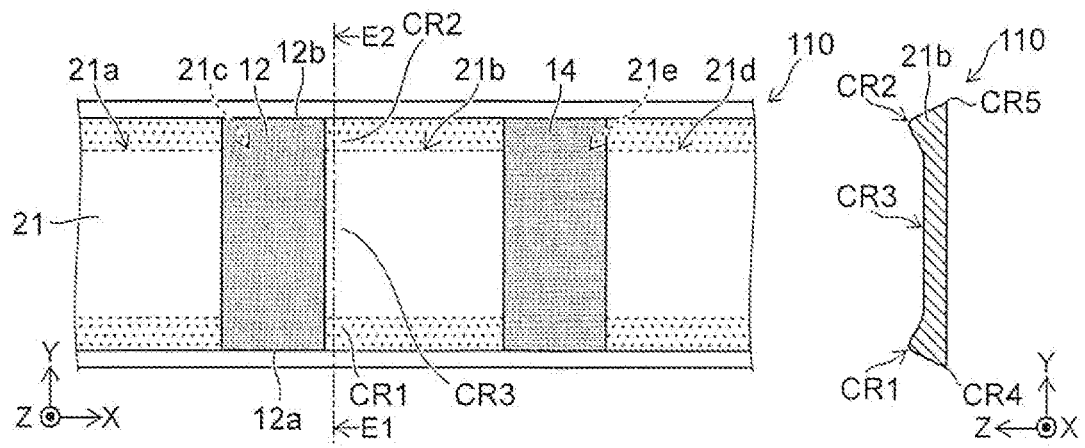
FIG. 3A and FIG. 3B are schematic views illustrating a portion of the magnetic memory device according to the first embodiment.
Figure 3B:
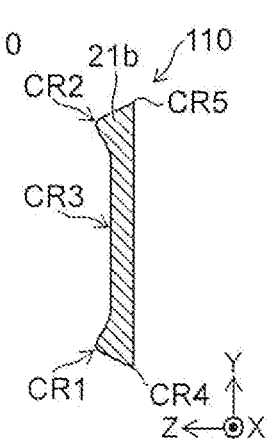

FIG. 3A and FIG. 3B are schematic views illustrating a portion of the magnetic memory device according to the first embodiment.

FIG. 3A is a plan view. In FIG. 3A, the conductive layer 21, the second magnetic layer 12, and the fourth magnetic layer 14 are illustrated; and the other components are not illustrated. FIG. 3B is a line E1-E2 cross-sectional view of FIG. 3A. The conductive layer 21 is not illustrated in FIG. 3B.

In the example as shown in FIG. 3A, the first conductive portion CR1 and the second conductive portion CR2 (the thick portions) overlap the second magnetic layer 12 and the fourth magnetic layer 14 in the X-axis direction.

For example, the second magnetic layer 12 includes a first end portion 12a and a second end portion 12b (referring to FIG. 1B and FIG. 3A). The direction from the first end portion 12a toward the second end portion 12b is aligned with the third direction (the Y-axis direction). The position in the third direction (the Y-axis direction) of at least a portion of the first conductive portion CR1 is between the position in the third direction of the first end portion 12a and the position in the third direction of the second end portion 12b. In such a case, for example, a strong spin torque based on the high current density in the portion of the overlap region (the third region 21c and the fifth region 21e) corresponding to the first conductive portion CR1 acts easily on the memory layers (the second magnetic layer 12, the fourth magnetic layer 14, etc.). Stable operations are obtained more easily. As described below, in the embodiment, the first conductive portion CR1 and the second conductive portion CR2 (the thick portions) may not overlap the second magnetic layer 12 and the fourth magnetic layer 14.

In the example as shown in FIG. 1A, FIG. 1D, and FIG. 3B, the side surface of the conductive layer 21 has a forward-tapered configuration. As shown in FIG. 3B, the second region 21b further includes a fourth conductive portion CR4 and a fifth conductive portion CR5. The first conductive portion CR1 is between the fourth conductive portion CR4 and the fifth conductive portion CR5 in the third direction (the Y-axis direction). The fourth conductive portion CR4 and the fifth conductive portion CR5 are, for example, end portions. The third conductive portion CR3 is between the first conductive portion CR1 and the fifth conductive portion CR5 in the third direction (the Y-axis direction). The second conductive portion CR2 is between the third conductive portion CR3 and the fifth conductive portion CR5 in the third direction (the Y-axis direction).

For example, the thickness along the first direction (the Z-axis direction) of at least a portion of the fourth conductive portion CR4 is thinner than the first thickness t1 (the thickness along the first direction of the first conductive portion CR1). For example, the thickness along the first direction of at least a portion of the fourth conductive portion CR4 is thinner than the second thickness t2. For example, the thickness along the first direction of at least a portion of the fourth conductive portion CR4 is thinner than the third thickness t3. Because the side surface of the conductive layer 21 has a forward-tapered configuration, for example, the configuration of the conductive layer 21 is stabilized.

In the example as shown in FIG. 3A, at least one of the first to third conductive portions CR1 to CR3 contacts the third region 21c. Thereby, the current density difference based on the thickness difference of the first to third conductive portions CR1 to CR3 is reflected easily in the overlap region (e.g., the third region 21c).

As described below, at least one of the first to third conductive portions CR1 to CR3 may be separated from the third region 21c. In such a case, it is favorable for the distance between the third region 21c and these conductive portions to be short.

Figure 4A:
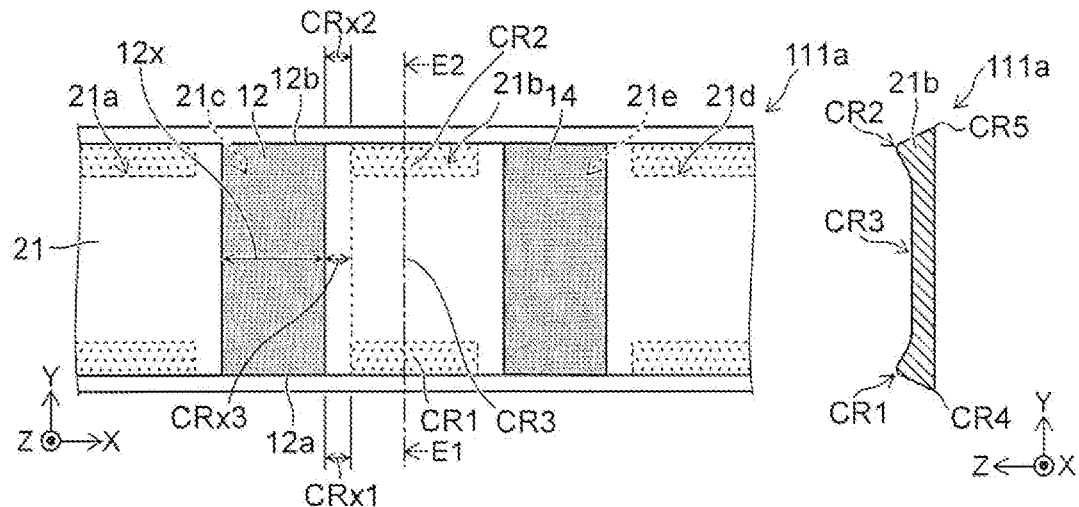
FIG. 4A and FIG. 4B are schematic views illustrating a portion of a magnetic memory device according to the first embodiment.
Figure 4B:
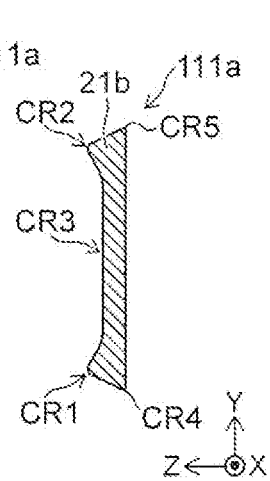

FIG. 4A and FIG. 4B are schematic views illustrating a portion of a magnetic memory device according to the first embodiment.

FIG. 4A is a plan view. In FIG. 4A, the conductive layer 21, the second magnetic layer 12, and the fourth magnetic layer 14 are illustrated; and the other components are not illustrated. FIG. 4B is a line E1-E2 cross-sectional view of FIG. 4A. The conductive layer 21 is not illustrated in FIG. 4B.

As shown in FIG. 4A and FIG. 4B, the first to third conductive portions CR1 to CR3 are provided in a magnetic memory device 111a as well. In the magnetic memory device 111a, at least one of the first to third conductive portions CR1 to CR3 is separated from the third region 21c. Otherwise, the configuration of the magnetic memory device 111a is the same as the configuration of the magnetic memory device 110.

In the magnetic memory device 111a, a distance CRx1 along the second direction (the X-axis direction) between the first conductive portion CR1 and the third region 21c and a distance CRx2 along the second direction between the second conductive portion CR2 and the third region 21c are not more than ½ of the length 12x along the second direction of the second magnetic layer 12. For example, the distance CRx1 and the distance CRx2 each may be ¼ of the length 12x or less. As described above, for example, the current density is high in the thick first conductive portion CR1. Even in the case where the first conductive portion CR1 is separated from the third region 21c, the high current density causes the current density of the overlap portion to change. Therefore, the first conductive portion CR1 may be separated from the third region 21c by a short distance.

In the embodiment, at least one of the distance CRx1, the distance CRx2, or the distance along the second direction between the third conductive portion CR3 and the third region 21c may be ½ of the length 12x or less. At least one of the distances recited above may be ¼ of the length 12x or less.

Several examples of the magnetic memory device according to the embodiment will now be described. Some of the components included in the magnetic memory device are not illustrated in the following drawings. In the following description, a description is omitted for configurations similar to those of the magnetic memory device 110.

FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, and FIG. 14B are schematic views illustrating portions of magnetic memory devices according to the first embodiment.

FIG. 5A, FIG. 6A, FIG. 7A, FIG. 8A, FIG. 9A, FIG. 10A, FIG. 11A, FIG. 12A, FIG. 13A, and FIG. 14A are plan views. FIG. 5B, FIG. 6B, FIG. 7B, FIG. 8B, FIG. 9B, FIG. 10B, FIG. 11B, FIG. 12B, FIG. 13B, and FIG. 14B are line E1-E2 cross-sectional views respectively of FIG. 5A, FIG. 6A, FIG. 7A, FIG. 8A, FIG. 9A, FIG. 10A, FIG. 11A, FIG. 12A, FIG. 13A, and FIG. 14A.

Figure 5A:
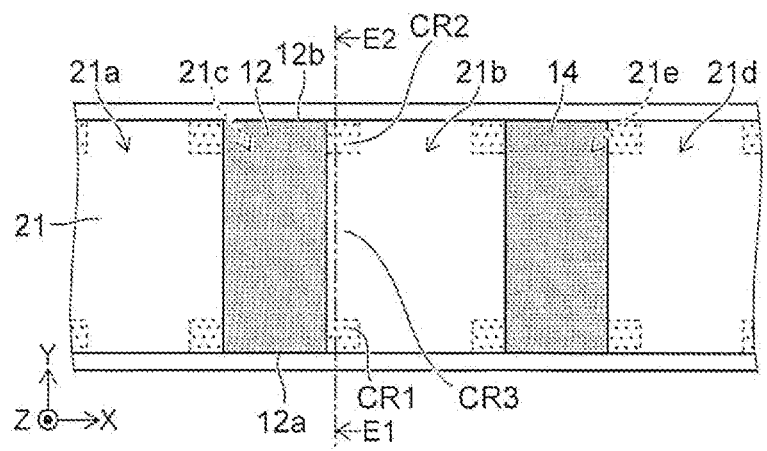
FIG. 5A and FIG. 5B are schematic views illustrating a portion of a magnetic memory device according to the first embodiment.
Figure 5B:
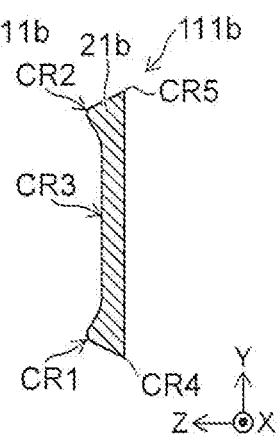

In a magnetic memory device 111b shown in FIG. 5A and FIG. 5B, the first conductive portion CR1 and the second conductive portion CR2 are provided partially at the vicinity of the overlap regions (the third region 21c and the fifth region 21e). On the other hand, in the magnetic memory device 110 described above, the first conductive portion CR1 is continuous between the two overlap regions (the third region 21c and the fifth region 21e). Conversely, in the magnetic memory device 111b, two first conductive portions CR1 that are arranged in the X-axis direction are provided between the two overlap regions (the third region 21c and the fifth region 21e). The two first conductive portions CR1 are discontinuous between the two overlap regions (the third region 21c and the fifth region 21e). A thin region (the third conductive portion CR3) is provided between the two first conductive portions CR1 in the X-axis direction. The third conductive portion CR3 is provided between the first conductive portion CR1 and the second conductive portion CR2 in the Y-axis direction.

Figure 6A:
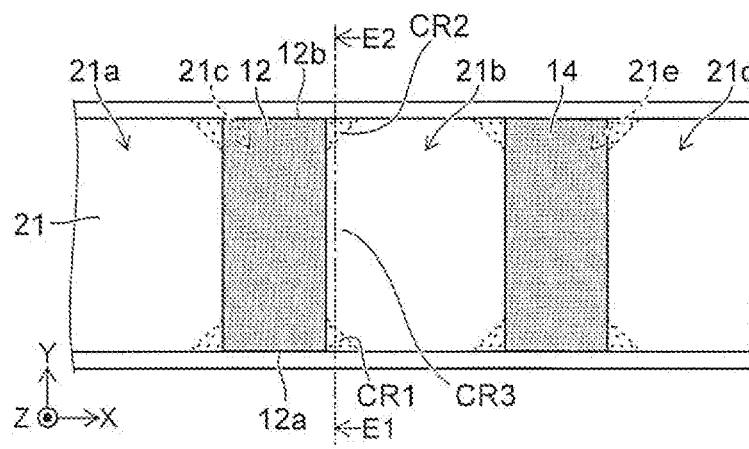
FIG. 6A and FIG. 6B are schematic views illustrating a portion of a magnetic memory device according to the first embodiment.
Figure 6B:
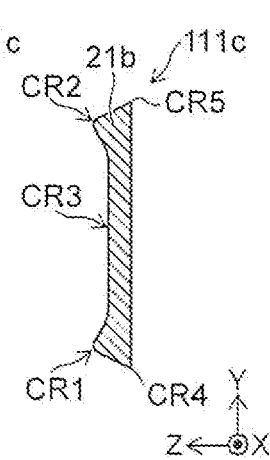

In a magnetic memory device 111c shown in FIG. 6A and FIG. 6B as well, the two first conductive portions CR1 that are arranged in the X-axis direction are provided between the two overlap regions (the third region 21c and the fifth region 21e). The two first conductive portions CR1 are discontinuous between the two overlap regions (the third region 21c and the fifth region 21e). A thin region (the third conductive portion CR3) is provided between the two first conductive portions CR1 in the X-axis direction. The third conductive portion CR3 is provided between the first conductive portion CR1 and the second conductive portion CR2 in the Y-axis direction. The length in the X-axis direction of the first conductive portion CR1 increases toward the end in the Y-axis direction.

Figure 7A:
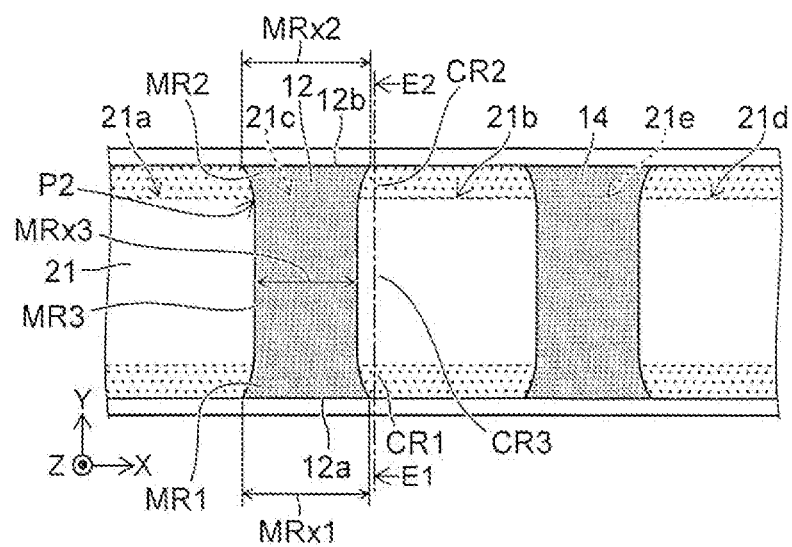
FIG. 7A and FIG. 7B are schematic views illustrating a portion of a magnetic memory device according to the first embodiment.
Figure 7B:
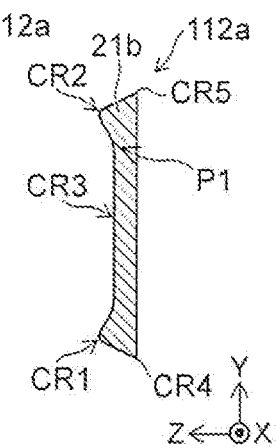

In a magnetic memory device 112a shown in FIG. 7A and FIG. 7B, the two side surfaces of the second magnetic layer 12 are concave. The direction from one of the two side surfaces toward the other of the two side surfaces is aligned with the X-axis direction. For example, the second magnetic layer 12 includes first to third magnetic portions MR1 to MR3. The direction from the first magnetic portion MR1 toward the second magnetic portion MR2 is aligned with the third direction (e.g., the Y-axis direction). The third magnetic portion MR3 is between the first magnetic portion MR1 and the second magnetic portion MR2 in the third direction. For example, the first magnetic portion MR1 and the second magnetic portion MR2 are end portions. The third magnetic portion MR3 is, for example, a central portion.

As shown in FIG. 7A, the length along the second direction (e.g., the X-axis direction) of the first magnetic portion MR1 is taken as a length MRx1. The length along the second direction of the second magnetic portion MR2 is taken as a length MRx2. The length along the second direction of the third magnetic portion MR3 is taken as a length MRx3. In the magnetic memory device 112a, the length MRx1 is longer than the length MRx3. For example, the length MRx2 is longer than the length MRx3.

By such lengths, compared to the third magnetic portion MR3, the current from the first region 21a reaches the first magnetic portion MR1 or the second magnetic portion MR2 faster. The current flows from the first magnetic portion MR1 toward the third magnetic portion MR3 or from the second magnetic portion MR2 toward the third magnetic portion MR3. For example, spin is generated in a direction crossing the orientation of the magnetization of the second magnetic layer 12. Therefore, magnetization reversal is promoted in the second magnetic layer 12.

In the embodiment, for example, the length MRx1 is not less than 1.05 times and not more than 1.5 times the length MRx3. For example, the length MRx2 is not less than 1.05 times and not more than 1.5 times the length MRx3. By such lengths, for example, it is difficult to generate a domain wall in the second magnetic layer 12. Thereby, a stable magnetization reversal operation is obtained easily.

The change of the thickness of the conductive layer 21 and the change of the width of the second magnetic layer 12 may be interrelated. For example, the second region 21b includes a portion including the first conductive portion CR1 and the third conductive portion CR3. The position in the third direction (the Y-axis direction) of the region where the thickness along the first direction (the Z-axis direction) of this portion starts to change is taken as a position P1 (referring to FIG. 7B). On the other hand, the position in the third direction (the Y-axis direction) of the region where the length (the width) along the second direction (the X-axis direction) of the portion of the second magnetic layer 12 including the first magnetic portion MR1 and the third magnetic portion MR3 starts to change is taken as a position P2 (referring to FIG. 7A). The position P1 overlaps the position P2.

Figure 8A:
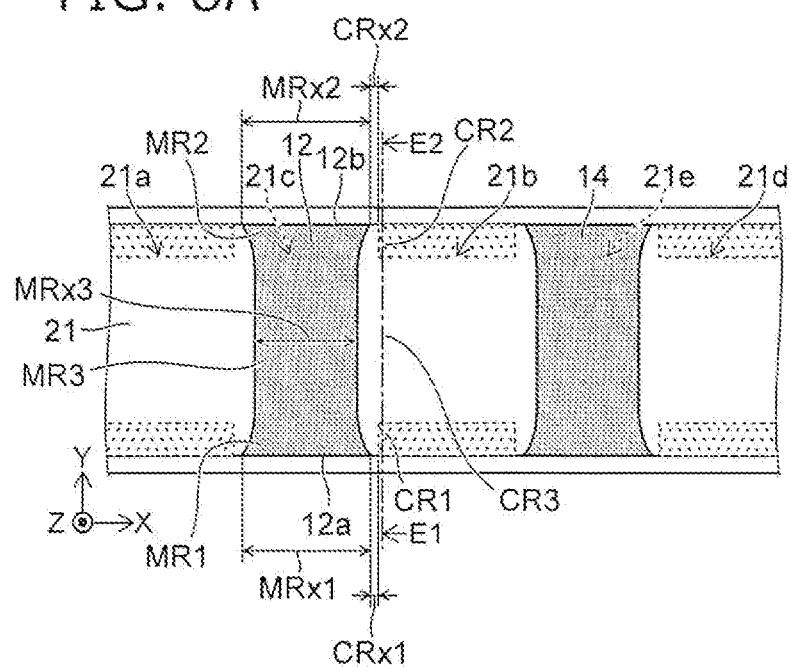
FIG. 8A and FIG. 8B are schematic views illustrating a portion of a magnetic memory device according to the first embodiment.
Figure 8B:
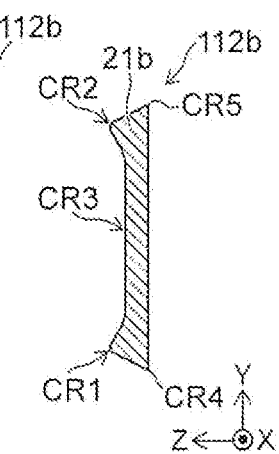
Figure 9A:
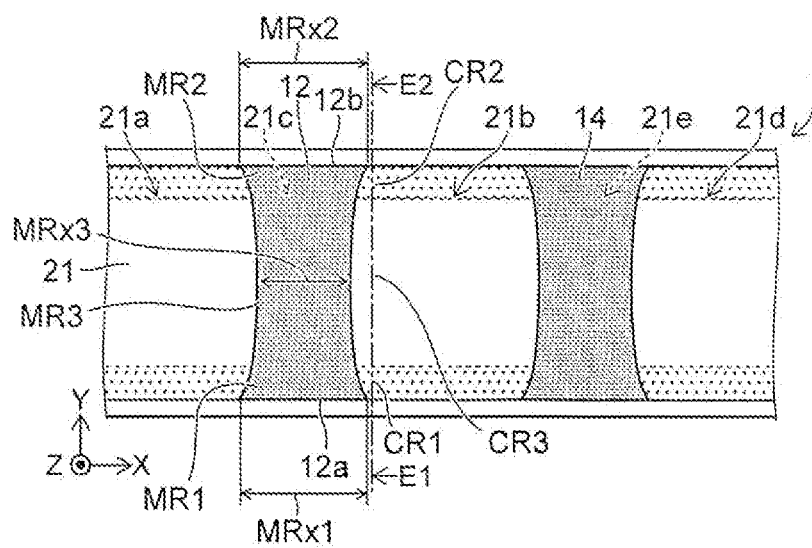
FIG. 9A and FIG. 9B are schematic views illustrating a portion of a magnetic memory device according to the first embodiment.
Figure 9B:
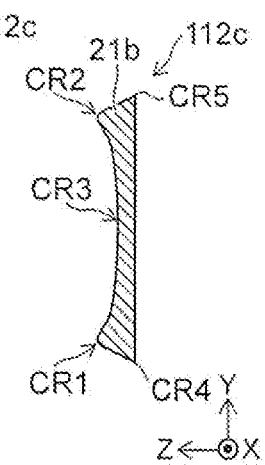
Figure 10A:
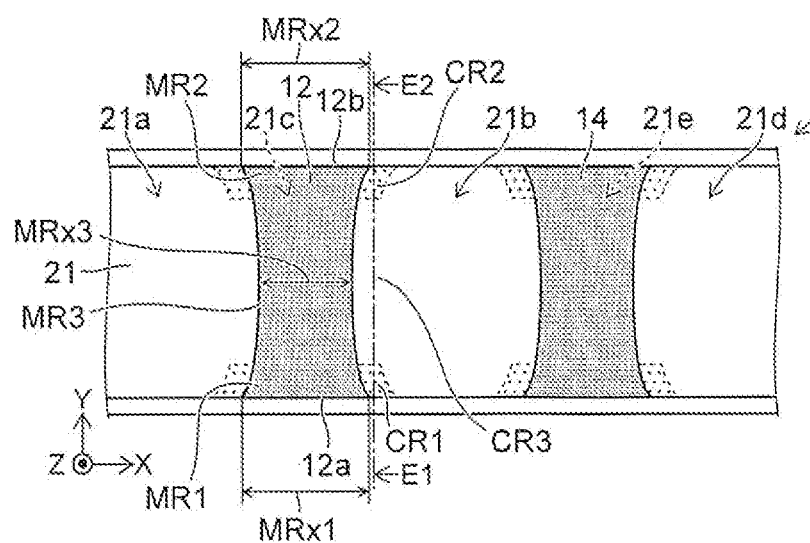
FIG. 10A and FIG. 10B are schematic views illustrating a portion of a magnetic memory device according to the first embodiment.
Figure 10B:
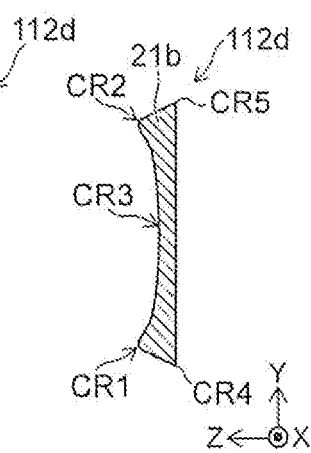
Figure 11A:
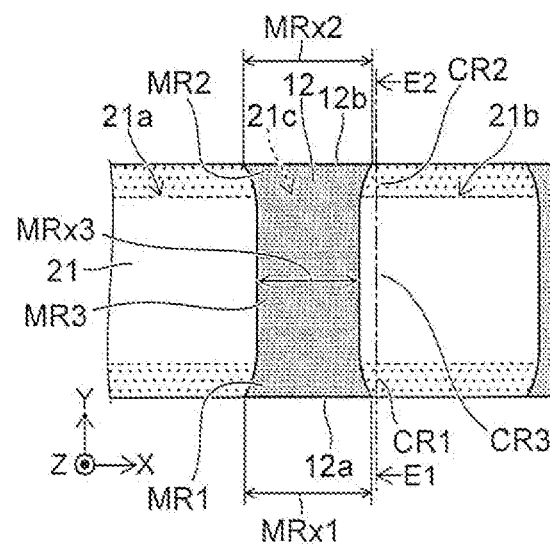
FIG. 11A and FIG. 11B are schematic views illustrating a portion of a magnetic memory device according to the first embodiment.
Figure 11B:
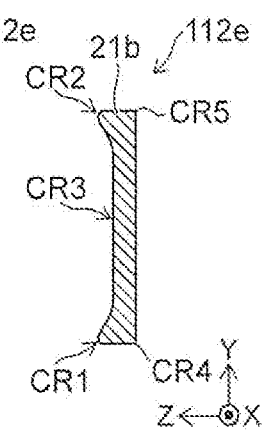
Figure 12A:
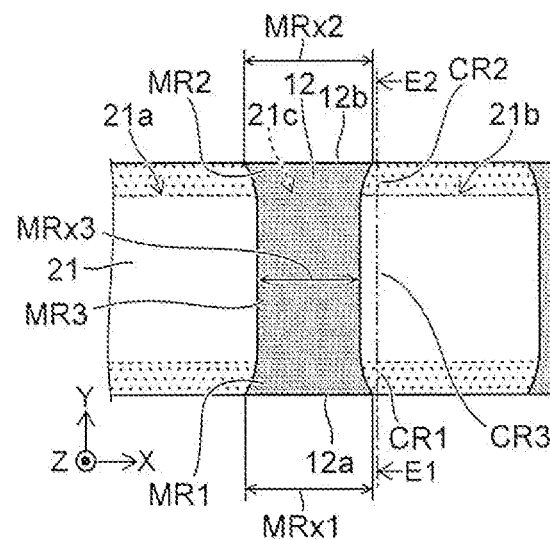
FIG. 12A and FIG. 12B are schematic views illustrating a portion of a magnetic memory device according to the first embodiment.
Figure 12B:
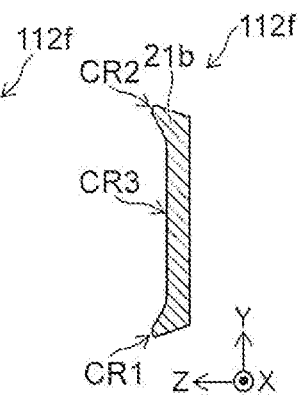

In a magnetic memory device 112b shown in FIG. 8A and FIG. 8B as well, the length MRx1 is longer than the length MRx3. For example, the length MRx2 is longer than the length MRx3. In the magnetic memory device 112b as well, the distance CRx1 and the distance CRx2 may be ½ of the length 12x or less. For example, the distance CRx1 and the distance CRx2 each may be ¼ of the length 12x or less.

In magnetic memory devices 112c to 112f shown in FIG. 9A, FIG. 9B, FIG. 10A, FIG. 10B, FIG. 11A, FIG. 11B, FIG. 12A, and FIG. 12B as well, the length MRx1 is longer than the length MRx3. For example, the length MRx2 is longer than the length MRx3.

In the magnetic memory device 112c, the side surface of the second magnetic layer 12 changes curvilinearly. The length along the X-axis direction of the second magnetic layer 12 changes continuously.

In the magnetic memory device 112d, the two first conductive portions CR1 that are arranged in the X-axis direction are provided between the two overlap regions (the third region 21c and the fifth region 21e). The two first conductive portions CR1 are discontinuous between the two overlap regions (the third region 21c and the fifth region 21e). A thin region (the third conductive portion CR3) is provided between the two first conductive portions CR1 in the X-axis direction. The third conductive portion CR3 is provided between the first conductive portion CR1 and the second conductive portion CR2 in the Y-axis direction.

In the magnetic memory device 112e, the side surfaces of the fourth conductive portion CR4 and the fifth conductive portion CR5 of the conductive layer 21 are substantially aligned with the Z-axis direction.

In the magnetic memory device 112f, the side surfaces of the end portions of the conductive layer 21 have reverse-tapered configurations.

Figure 13A:
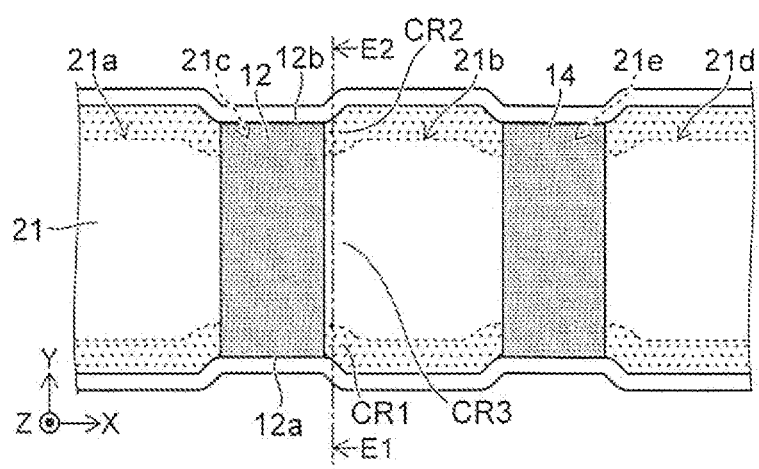
FIG. 13A and FIG. 13B are schematic views illustrating a portion of a magnetic memory device according to the first embodiment.
Figure 13B:
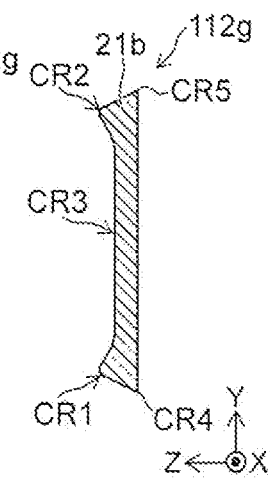

In a magnetic memory device 112g shown in FIG. 13A and FIG. 13B, the length (e.g., the maximum length) along the Y-axis direction of the non-overlap region (e.g., the second region 21b) is longer than the length (e.g., the maximum length) along the Y-axis direction of the overlap region (e.g., the third region 21c). In the magnetic memory device 112g, for example, when the current enters the third region 21c from the first region 21a, the current has a component in a direction crossing (e.g., tilted with respect to) the X-axis direction. For example, spin is generated that crosses the orientation of the magnetization of the second magnetic layer 12. Thereby, magnetization reversal is promoted in the second magnetic layer 12.

In the example, the position in the third direction (the Y-axis direction) of the first end portion 12a is between the position in the third direction (the Y-axis direction) of at least a portion of the first conductive portion CR1 and the position in the third direction (the Y-axis direction) of at least a portion of the second conductive portion CR2. The position in the third direction (the Y-axis direction) of the second end portion 12b is between the position in the third direction (the Y-axis direction) of at least a portion of the first conductive portion CR1 and the position in the third direction (the Y-axis direction) of at least a portion of the second conductive portion CR2.

Figure 14A:
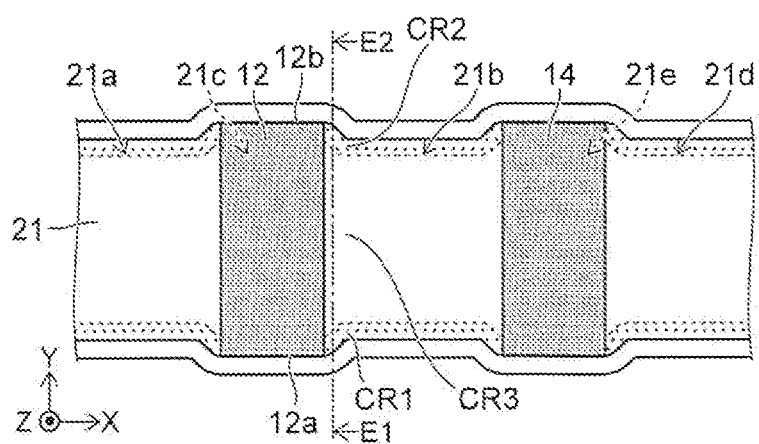
FIG. 14A and FIG. 14B are schematic views illustrating a portion of a magnetic memory device according to the first embodiment.
Figure 14B:
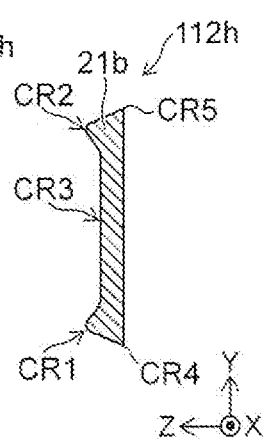

In a magnetic memory device 112h shown in FIG. 14A and FIG. 14B, the length (e.g., the maximum length) along the Y-axis direction of the non-overlap region (e.g., the second region 21b) is shorter than the length (e.g., the maximum length) along the Y-axis direction of the overlap region (e.g., the third region 21c).

In the magnetic memory device 112h, for example, when the current enters the third region 21c from the first region 21a, the current has a component in a direction crossing (e.g., tilted with respect to) the X-axis direction. A spin is generated that crosses the orientation of the magnetization of the second magnetic layer 12. Thereby, magnetization reversal is promoted in the second magnetic layer 12.

Figure 15A:
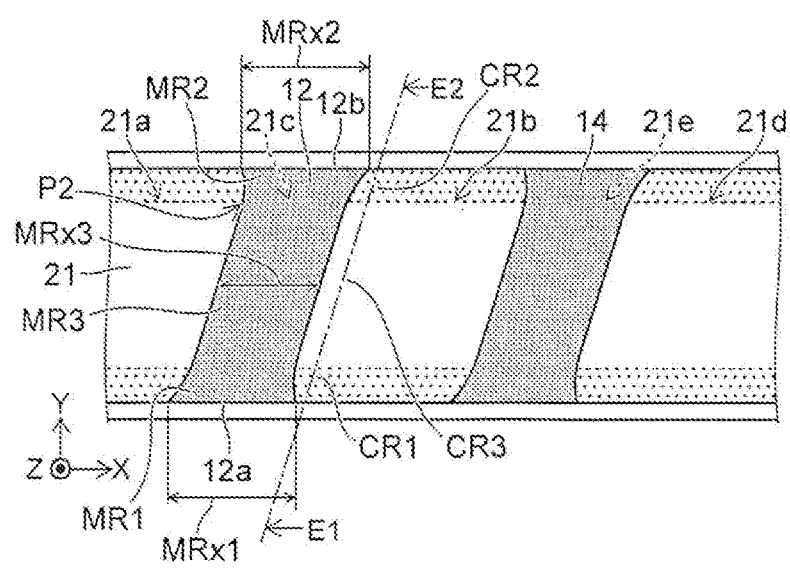
FIG. 15A and FIG. 15B are schematic views illustrating a portion of a magnetic memory device according to the first embodiment.
Figure 15B:
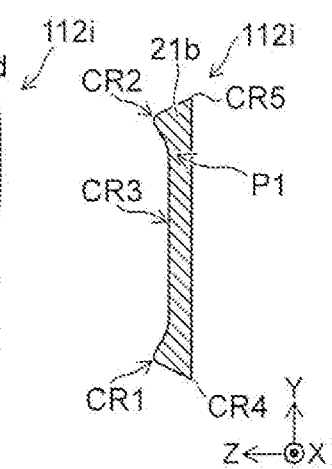

In a magnetic memory device 112i shown in FIG. 15A and FIG. 15B, the major axis (and the minor axis) of the second magnetic layer 12 are tilted with respect to the X-axis direction. The major axis (and the minor axis) are aligned with the X-Y plane. The current has a component in a direction crossing (e.g., tilted with respect to) the X-axis direction. A spin is generated that crosses the orientation of the magnetization of the second magnetic layer 12. Thereby, magnetization reversal is promoted in the second magnetic layer 12.

FIG. 16A to FIG. 16F are schematic views illustrating a portion of a magnetic memory device according to the first embodiment.

Figure 16A:
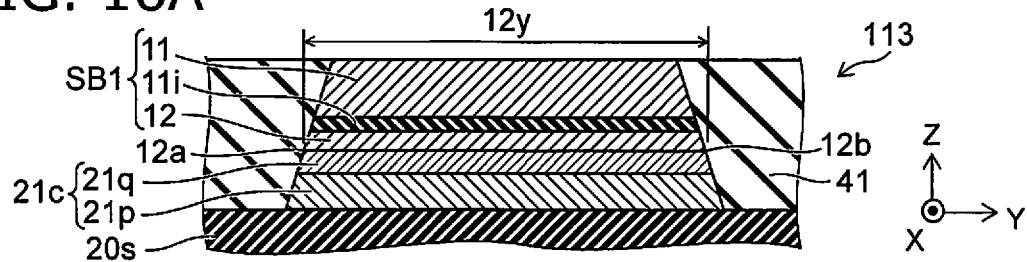
FIG. 16A to FIG. 16F are schematic views illustrating a portion of a magnetic memory device according to the first embodiment.
Figure 16B:
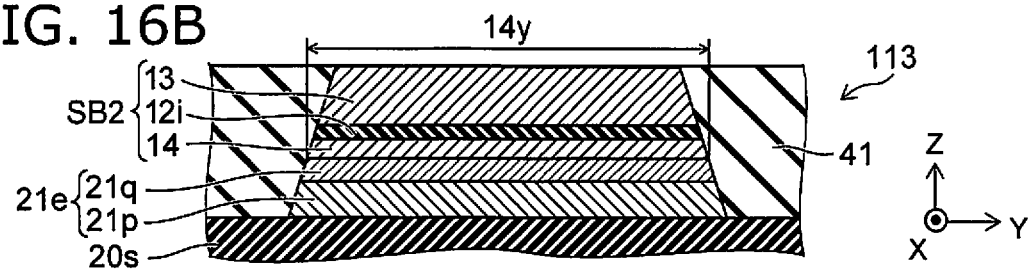
Figure 16C:
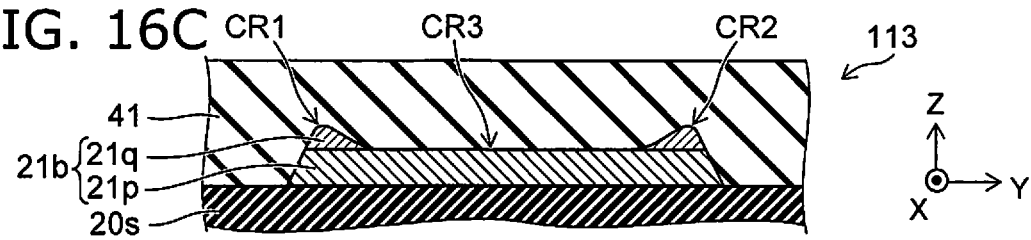
Figure 16D:
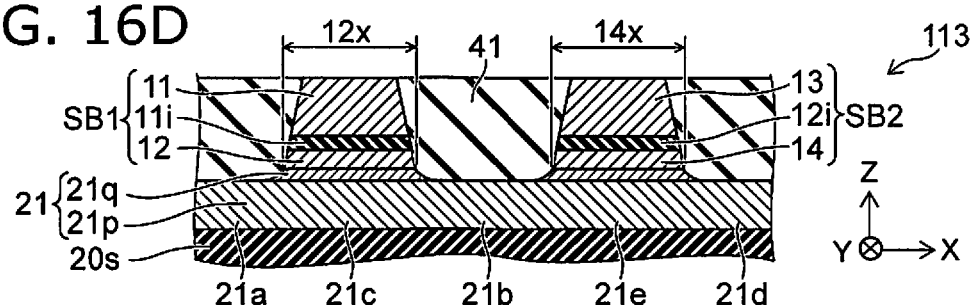
Figure 16E:
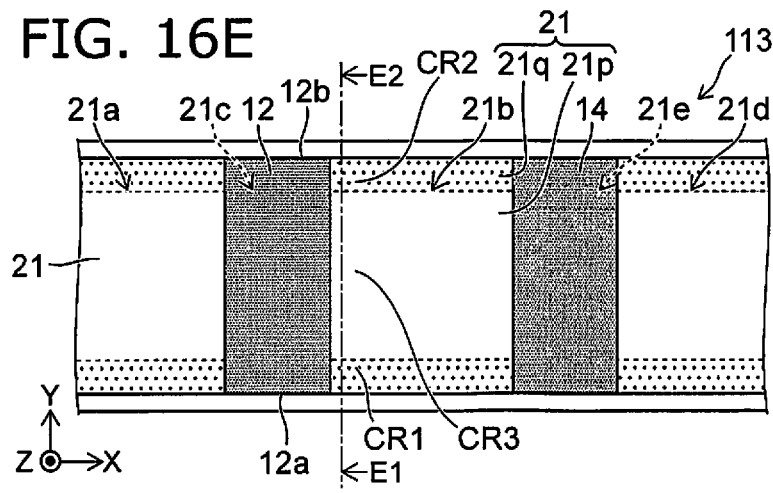
Figure 16F:
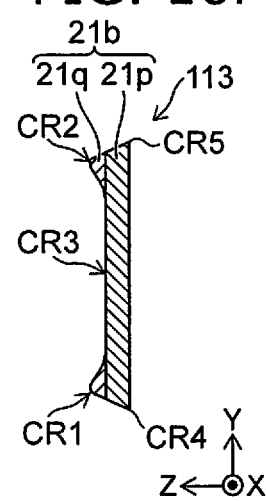

FIG. 16A is a cross-sectional view corresponding to line A1-A2 of FIG. 1A. FIG. 16B is a cross-sectional view corresponding to line B1-B2 of FIG. 1A. FIG. 16C is a cross-sectional view corresponding to line C1-C2 of FIG. 1A. FIG. 16D is a cross-sectional view corresponding to line D1-D2 of FIG. 1A. FIG. 16E is a plan view. FIG. 16F is a line E1-E2 cross-sectional view of FIG. 16E.

In a magnetic memory device 113 shown in these drawings, the conductive layer 21 includes multiple layers. Otherwise, the configuration of any of the magnetic memory devices recited above is applicable. An example of the conductive layer 21 of the magnetic memory device 113 will now be described.

At least a portion of the conductive layer 21 includes a first layer 21p and a second layer 21q. A portion of the second layer 21q is between the first layer 21p and the second magnetic layer 12. Another portion of the second layer 21q is included in the first conductive portion CR1.

As shown in FIG. 16A and FIG. 16B, the first layer 21p and the second layer 21q are provided in the overlap region (the third region 21c and the fifth region 21e). As shown in FIG. 16C and FIG. 16D, at least a portion of the second layer 21q is not provided in at least a portion of the non-overlap region (the first region 21a, the second region 21b, and the fourth region 21d). For example, the first conductive portion CR1 and the second conductive portion CR2 are formed of a portion of the second layer 21q in the non-overlap region.

For example, the second layer 21q includes a second metallic element that is different from a first metallic element included in the first layer 21p. The first metallic element includes at least one selected from the group consisting of tantalum and tungsten. For example, the second metallic element includes hafnium.

For example, a large spin polarization is obtained for the first metallic element. For example, a large spin Hall angle (absolute value) is obtained. For example, a large MR ratio is obtained for the second metallic element.

For example, the first layer 21p includes Ta. For example, the second layer 21q includes HfB.

Different etching rates are obtained easily by using multiple layers of different materials. The thickness difference of the conductive layer 21 is easily formed stably.

In the example, at least a portion of the third conductive portion CR3 does not include the second layer 21q. As described below, at least a portion of the third conductive portion CR3 may include the second layer 21q. In such a case, the thickness of the second layer 21q included in the third conductive portion CR3 is thinner than the thickness of the second layer 21q included in the first conductive portion CR1.

In the magnetic memory device 113, the first conductive portion CR1 and the second conductive portion CR2 contact the overlap region (e.g., the third region 21c).

FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, FIG. 24A, and FIG. 24B are schematic views illustrating portions of magnetic memory devices according to the first embodiment.

FIG. 17A, FIG. 18A, FIG. 19A, FIG. 20A, FIG. 21A, FIG. 22A, FIG. 23A, and FIG. 24A are plan views. FIG. 17B, FIG. 18B, FIG. 19B, FIG. 20B, FIG. 21B, FIG. 22B, FIG. 23B, and FIG. 24B are line E1-E2 cross-sectional views respectively of FIG. 17A, FIG. 18A, FIG. 19A, FIG. 20A, FIG. 21A, FIG. 22A, FIG. 23A, and FIG. 24A.

Figure 17A:
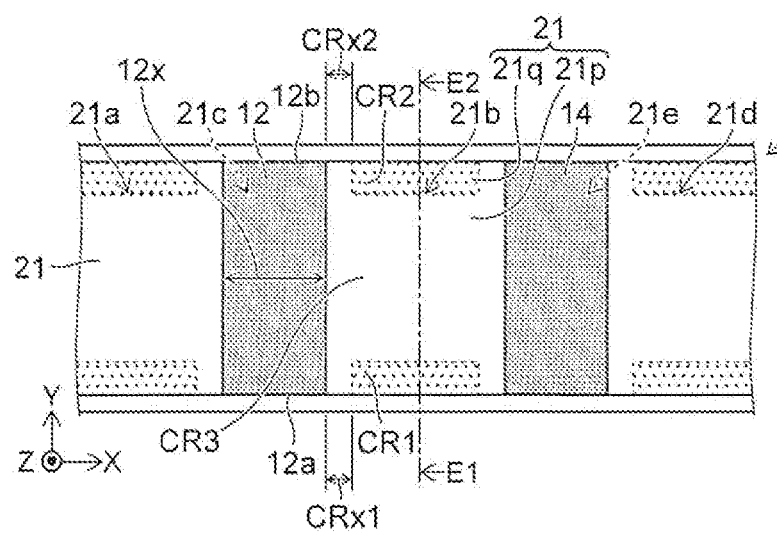
FIG. 17A and FIG. 17B are schematic views illustrating a portion of a magnetic memory device according to the first embodiment.
Figure 17B:
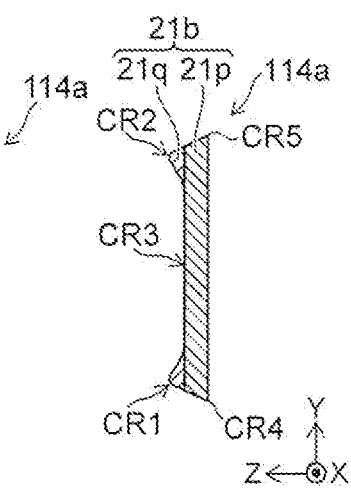
Figure 18A:
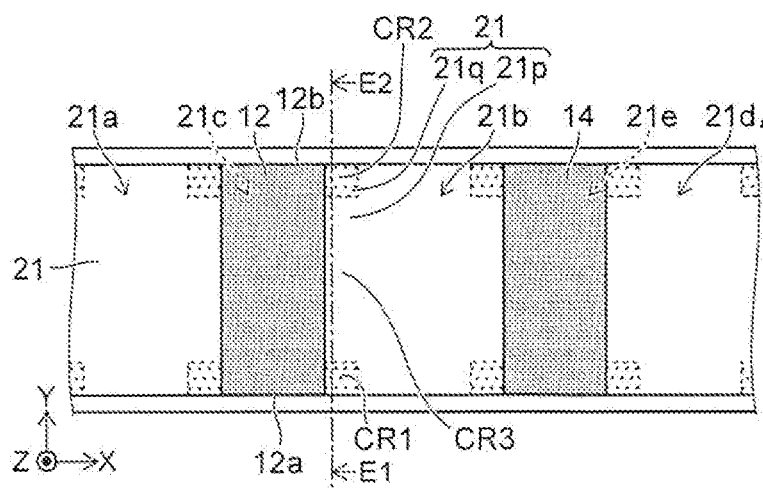
FIG. 18A and FIG. 18B are schematic views illustrating a portion of a magnetic memory device according to the first embodiment.
Figure 18B:
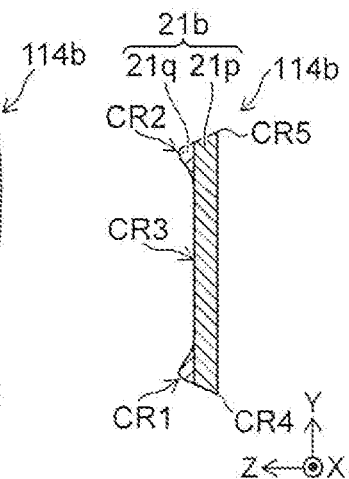
Figure 19A:
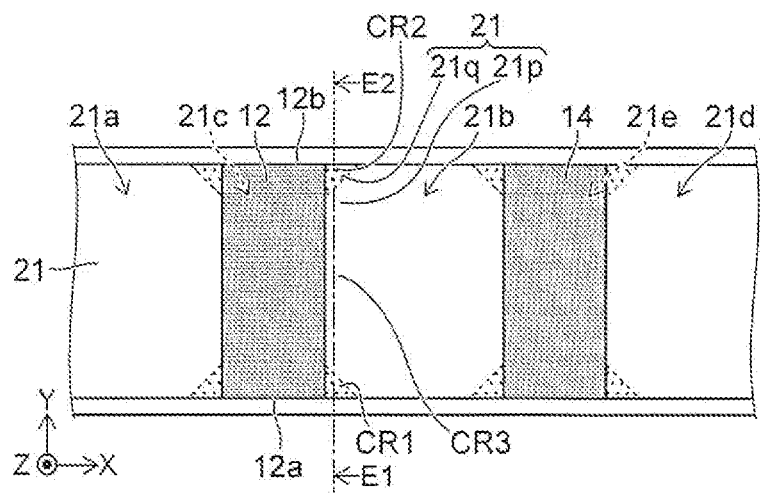
FIG. 19A and FIG. 19B are schematic views illustrating a portion of a magnetic memory device according to the first embodiment.
Figure 19B:
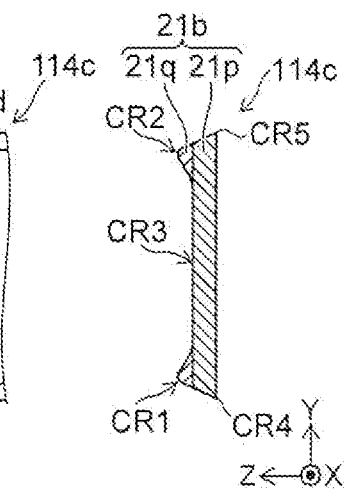
Figure 20A:
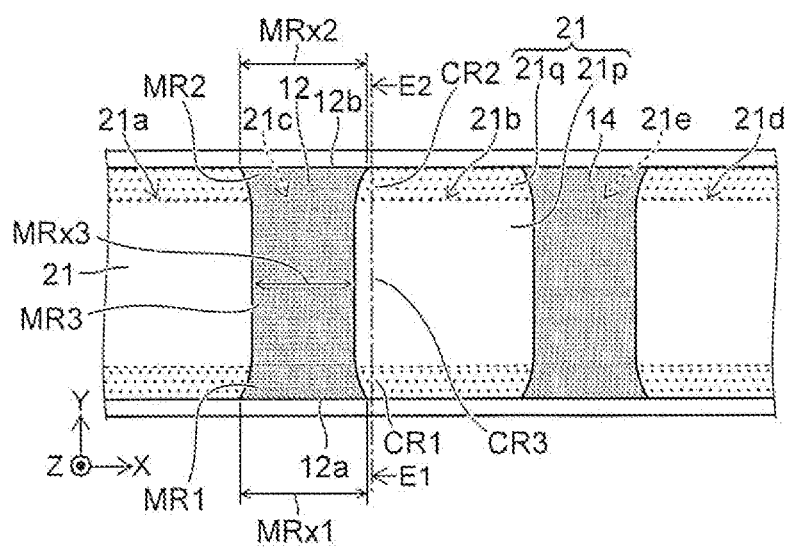
FIG. 20A and FIG. 20B are schematic views illustrating a portion of a magnetic memory device according to the first embodiment.
Figure 20B:
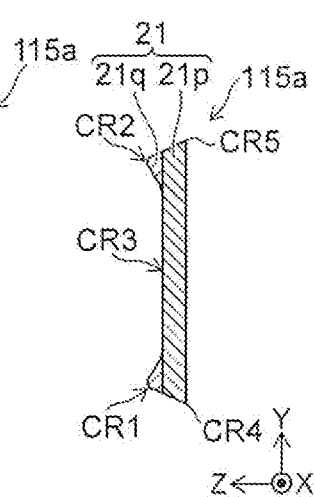
Figure 21A:
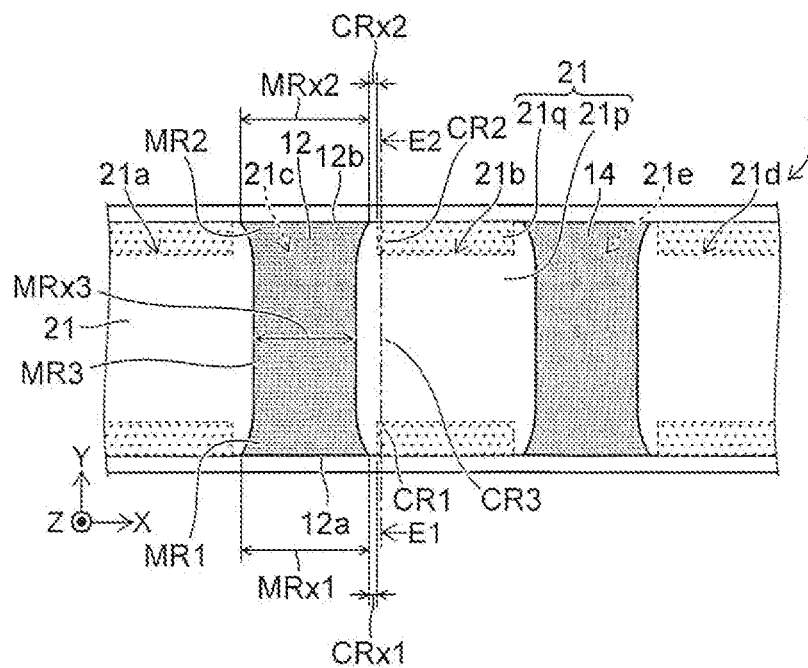
FIG. 21A and FIG. 21B are schematic views illustrating a portion of a magnetic memory device according to the first embodiment.
Figure 21B:
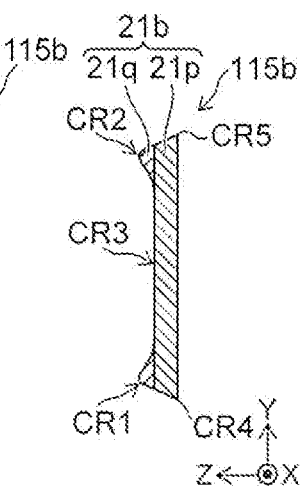
Figure 22A:
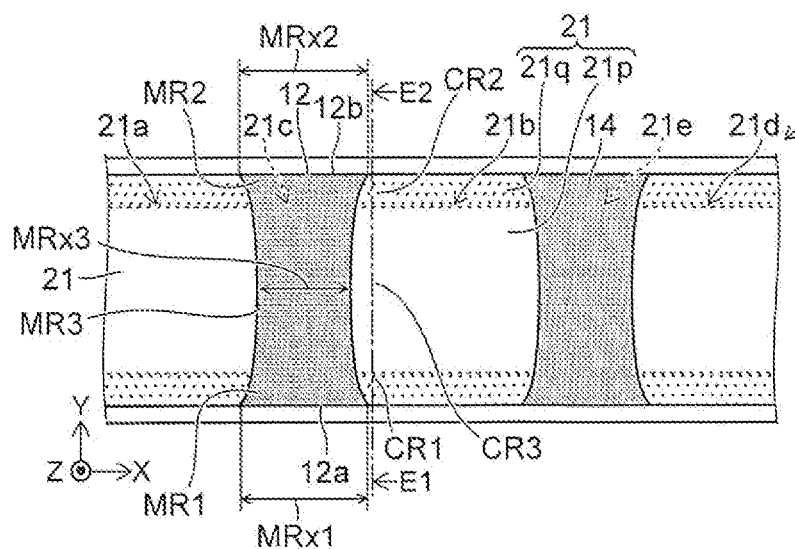
FIG. 22A and FIG. 22B are schematic views illustrating a portion of a magnetic memory device according to the first embodiment.
Figure 22B:
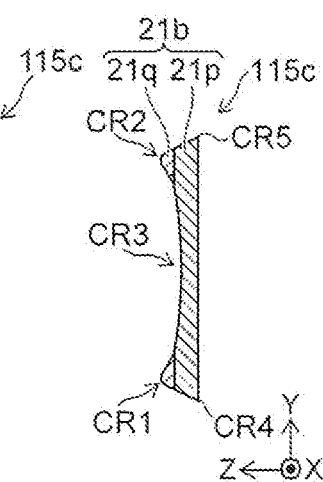
Figure 23A:
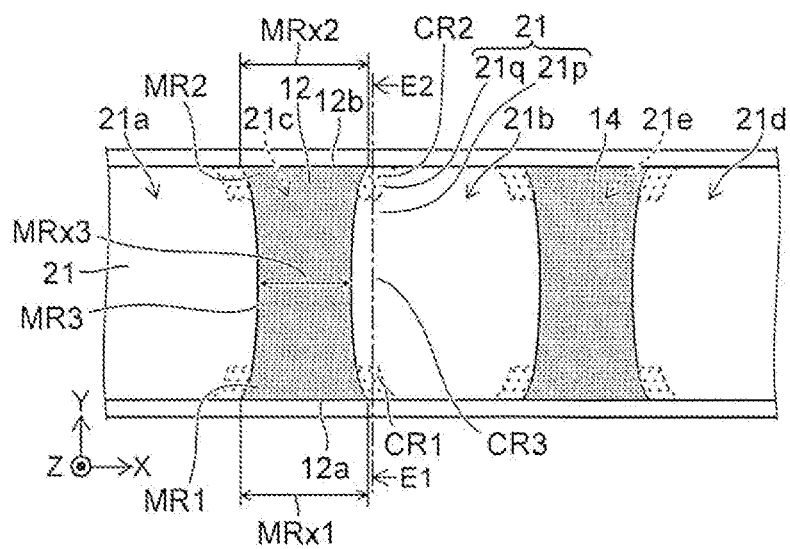
FIG. 23A and FIG. 23B are schematic views illustrating a portion of a magnetic memory device according to the first embodiment.
Figure 23B:
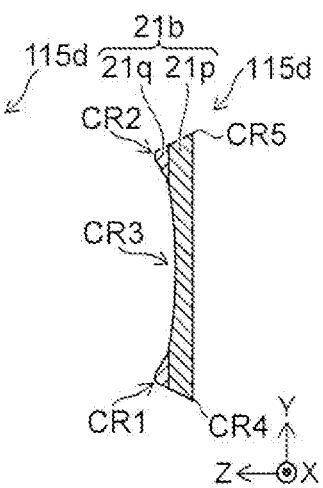
Figure 24A:
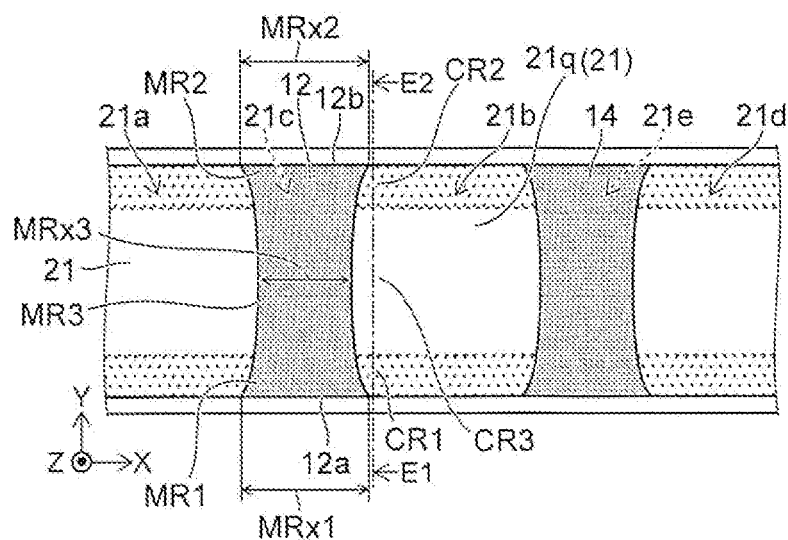
FIG. 24A and FIG. 24B are schematic views illustrating a portion of a magnetic memory device according to the first embodiment.
Figure 24B:
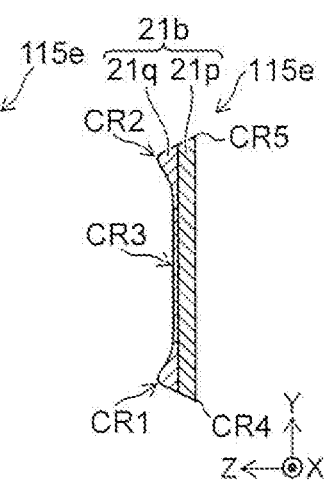

In a magnetic memory device 114a shown in FIG. 17A and FIG. 17B, at least one of the first to third conductive portions CR1 to CR3 is separated from the third region 21c. The distance CRx1 and the distance CRx2 are ½ of the length 12x or less. At least one of the distance CRx1, the distance CRx2, or the distance along the second direction between the third conductive portion CR3 and the third region 21c may be ½ of the length 12x or less. At least one of the distances recited above may be ¼ of the length 12x or less.

In magnetic memory devices 114b and 114c shown in FIG. 18A, FIG. 18B, FIG. 19A, and FIG. 19B, the two first conductive portions CR1 that are arranged in the X-axis direction and separated from each other are provided between the two overlap regions (the third region 21c and the fifth region 21e).

In magnetic memory devices 115a to 115e shown in FIG. 20A, FIG. 20B, FIG. 21A, FIG. 21B, FIG. 22A, FIG. 22B, FIG. 23A, and FIG. 23B, the length MRx1 is longer than the length MRx3. For example, the length MRx2 is longer than the length MRx3.

In the magnetic memory devices 114a to 114c, 115a, and 115b, the portion where the second layer 21q is provided is used to form the first conductive portion CR1 and the second conductive portion CR2; and the thickness of the first layer 21p is substantially constant other than at the end portions. In the magnetic memory devices 115c and 115d, the thickness of the first layer 21p is different between the first conductive portion CR1 and the third conductive portion CR3. In the magnetic memory device 115e, the upper surface of the first layer 21p is covered with the second layer 21q; and the thickness of the second layer 21q is different between the first conductive portion CR1 and the third conductive portion CR3.

Thus, at least a portion of the third conductive portion CR3 does not include the second layer 21q. Or, the thickness along the first direction (the Z-axis direction) of the second layer 21q included in at least a portion of the third conductive portion CR3 is thinner than the thickness along the first direction of the second layer 21q included in the first conductive portion CR1.

Second Embodiment

FIG. 25A to FIG. 25D are schematic views illustrating a magnetic memory device according to a second embodiment.

FIG. 26 is a schematic cross-sectional view illustrating the magnetic memory device according to the second embodiment.

FIG. 27A and FIG. 27B are schematic views illustrating a portion of the magnetic memory device according to the second embodiment.

Figure 25A:
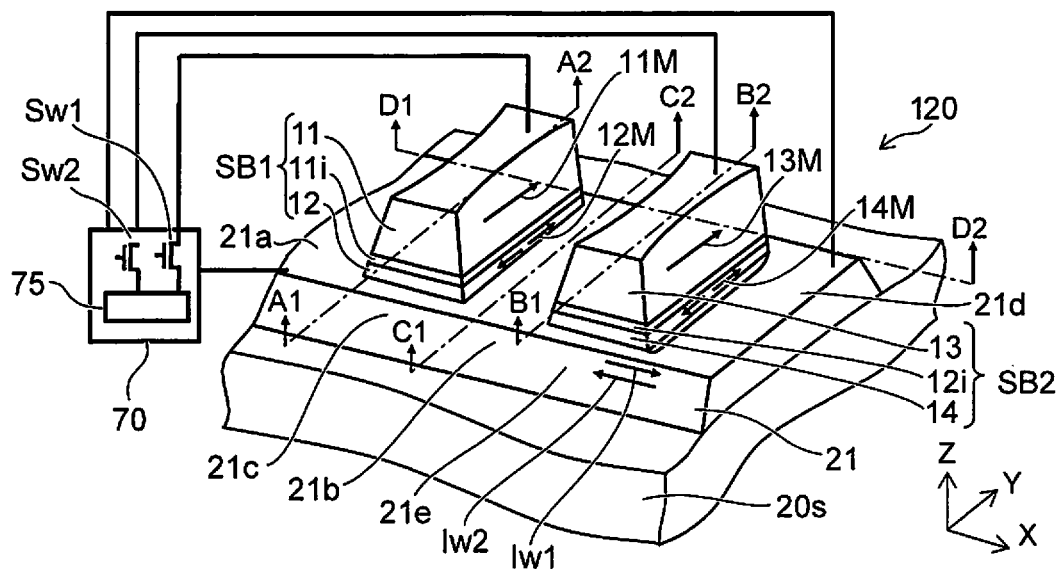
FIG. 25A to FIG. 25D are schematic views illustrating a magnetic memory device according to a second embodiment.
Figure 25B:
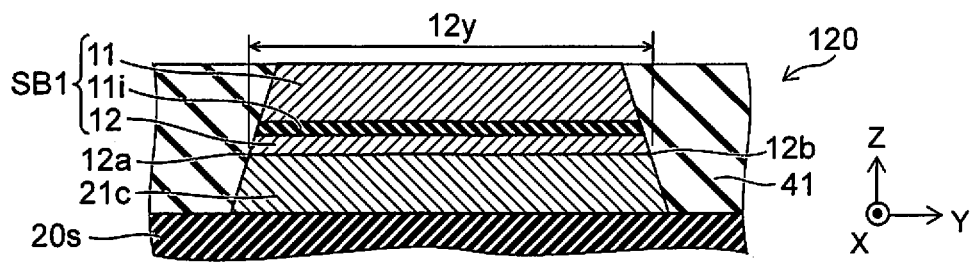
Figure 25C:
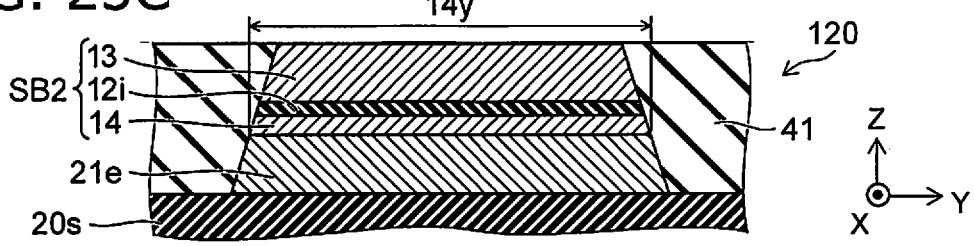
Figure 25D:
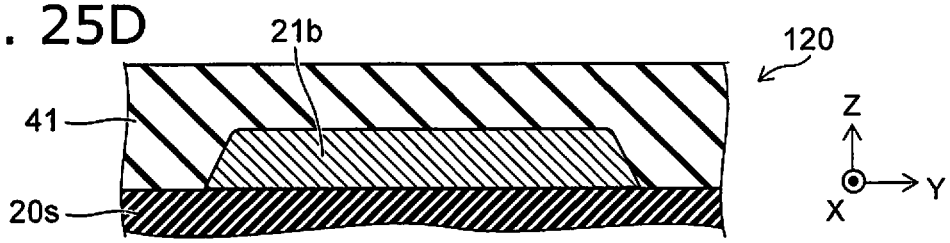

FIG. 25A is a perspective view. FIG. 25B is a line A1-A2 cross-sectional view of FIG. 25A. FIG. 25C is a line B1-B2 cross-sectional view of FIG. 25A. FIG. 25D is a line C1-C2 cross-sectional view of FIG. 25A. In FIG. 25A, the insulating portion 41 is not illustrated for easier viewing of the drawing. FIG. 26 is a line D1-D2 cross-sectional view of FIG. 25A. FIG. 27A is a plan view. In FIG. 27A, the conductive layer 21, the second magnetic layer 12, and the fourth magnetic layer 14 are illustrated; and the other components are not illustrated. FIG. 27B is a line E1-E2 cross-sectional view of FIG. 27A. The conductive layer 21 is not illustrated in FIG. 27B.

As shown in FIG. 25A, the magnetic memory device 120 also includes the conductive layer 21, the first magnetic layer 11, the second magnetic layer 12, the first nonmagnetic layer 11i, and the controller 70. The third magnetic layer 13, the fourth magnetic layer 14, and the second nonmagnetic layer 12i are provided in the example as well.

The conductive layer 21 includes the first to fifth regions 21a to 21e. The second magnetic layer 12 is provided between the third region 21c and the first magnetic layer 11 in the first direction (the Z-axis direction) crossing the second direction (e.g., the X-axis direction) from the first region 21a toward the second region 21b. The first nonmagnetic layer 11i is provided between the first magnetic layer 11 and the second magnetic layer 12. The fourth magnetic layer 14 is provided between the fifth region 21e and the third magnetic layer 13 in the first direction. The second nonmagnetic layer 12i is provided between the third magnetic layer 13 and the fourth magnetic layer 14. In the example, the side surfaces of the second magnetic layer 12 and the fourth magnetic layer 14 are concave. On the other hand, the upper surface of the conductive layer 21 is substantially flat. Examples of the second magnetic layer 12 will now be described. The description recited below is applicable also to the fourth magnetic layer 14.

As shown in FIG. 27A, the second magnetic layer 12 includes the first to third magnetic portions MR1 to MR3. The direction from the first magnetic portion MR1 toward the second magnetic portion MR2 is aligned with the third direction. The third direction crosses a plane (e.g., the Z-X plane) including the first direction (the Z-axis direction) and the second direction (e.g., the X-axis direction). The third magnetic portion MR3 is between the first magnetic portion MR1 and the second magnetic portion MR2 in the third direction (the Y-axis direction). The length (the length MRx1) along the second direction of the first magnetic portion MR1 is longer than the length (the length MRx3) along the second direction of the third magnetic portion MR3. The length (the length MRx2) along the second direction of the second magnetic portion MR2 is longer than the length MRx3.

By such lengths, compared to the third magnetic portion MR3, the current from the first region 21a reaches the first magnetic portion MR1 or the second magnetic portion MR2 faster. The current flows from the first magnetic portion MR1 toward the third magnetic portion MR3 or from the second magnetic portion MR2 toward the third magnetic portion MR3. For example, spin is generated in a direction crossing the orientation of the magnetization of the second magnetic layer 12. Therefore, magnetization reversal is promoted in the second magnetic layer 12.

In the embodiment, for example, the length MRx1 is not less than 1.05 times and not more than 1.5 times the length MRx3. For example, the length MRx2 is not less than 1.05 times and not more than 1.5 times the length MRx3. By such lengths, for example, it is difficult to generate a domain wall in the second magnetic layer 12; thereby, a stable magnetization reversal operation is obtained easily.

FIG. 28A and FIG. 28B are schematic views illustrating a portion of a magnetic memory device according to the second embodiment.

FIG. 28A is a plan view. In FIG. 28A, the conductive layer 21, the second magnetic layer 12, and the fourth magnetic layer 14 are illustrated; and the other components are not illustrated. FIG. 28B is a line E1-E2 cross-sectional view of FIG. 28A. The conductive layer 21 is not illustrated in FIG. 28B.

In the magnetic memory device 121, the side surface (the side surface crossing the Z-X plane) of the second magnetic layer 12 has a continuous curved-surface configuration. In the magnetic memory device 121 as well, the length MRx1 is longer than the length MRx3. The length MRx2 is longer than the length MRx3.

FIG. 29A to FIG. 29F are schematic views illustrating portions of a magnetic memory device according to the second embodiment.

Figure 29A:
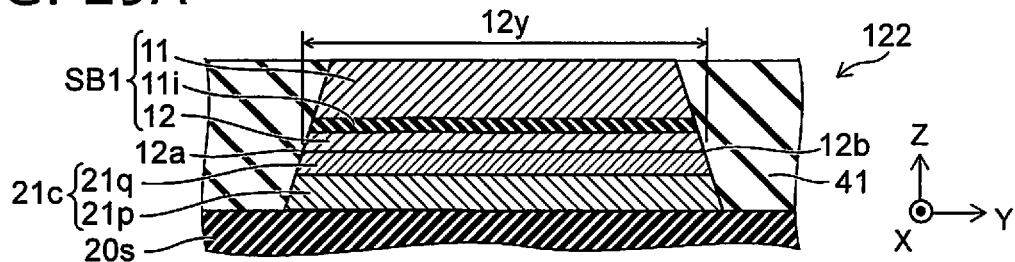
FIG. 29A to FIG. 29F are schematic views illustrating portions of a magnetic memory device according to the second embodiment.
Figure 29B:
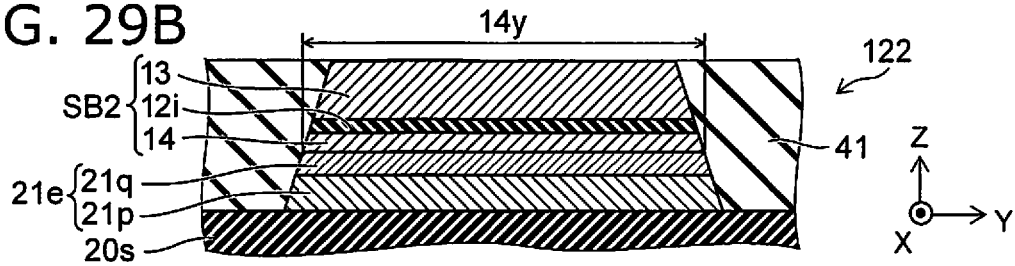
Figure 29C:
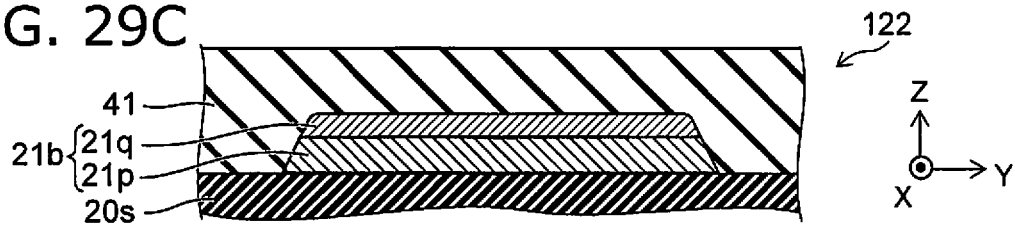
Figure 29D:
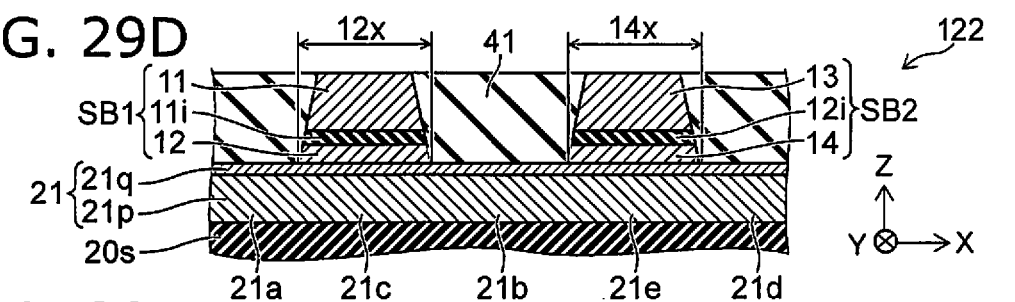
Figure 29E:
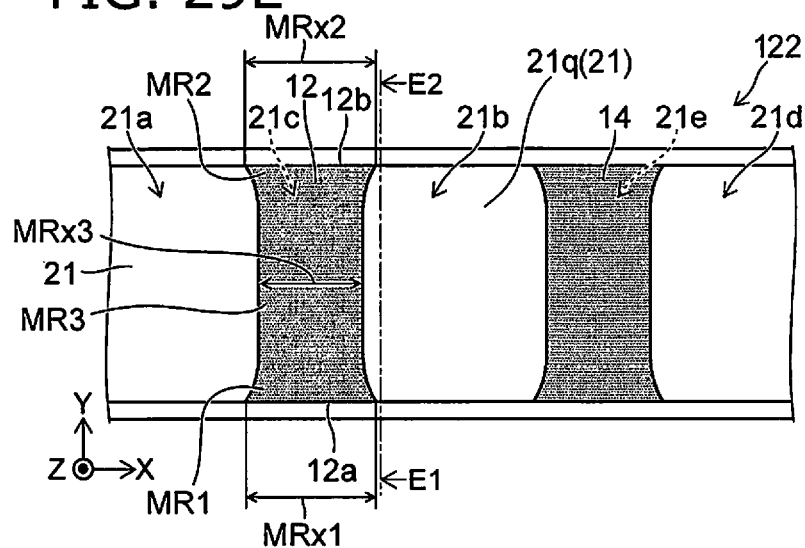
Figure 29F:
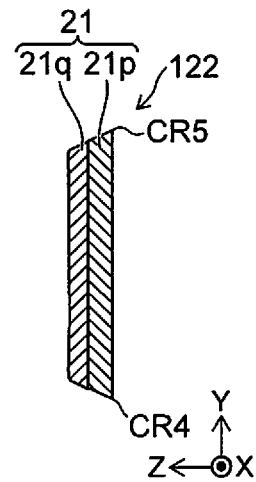

FIG. 29A is a cross-sectional view corresponding to line A1-A2 of FIG. 25A. FIG. 29B is a cross-sectional view corresponding to line B1-B2 of FIG. 25A. FIG. 29C is a cross-sectional view corresponding to line C1-C2 of FIG. 25A. FIG. 29D is a cross-sectional view corresponding to line D1-D2 of FIG. 25A. FIG. 29E is a plan view. FIG. 29F is a line E1-E2 cross-sectional view of FIG. 29E.

In the magnetic memory device 122 shown in these drawings, at least a portion of the conductive layer 21 includes the first layer 21p and the second layer 21q. A portion of the second layer 21q is between the first layer 21p and the second magnetic layer 12.

The second layer 21q includes the second metallic element that is different from the first metallic element included in the first layer 21p. For example, the first metallic element includes at least one selected from the group consisting of tantalum and tungsten. For example, the second metallic element includes hafnium.

For example, a large spin polarization is obtained for the first metallic element. For example, a large spin Hall angle (absolute value) is obtained. For example, a large MR ratio is obtained for the second metallic element.

Figure 30:
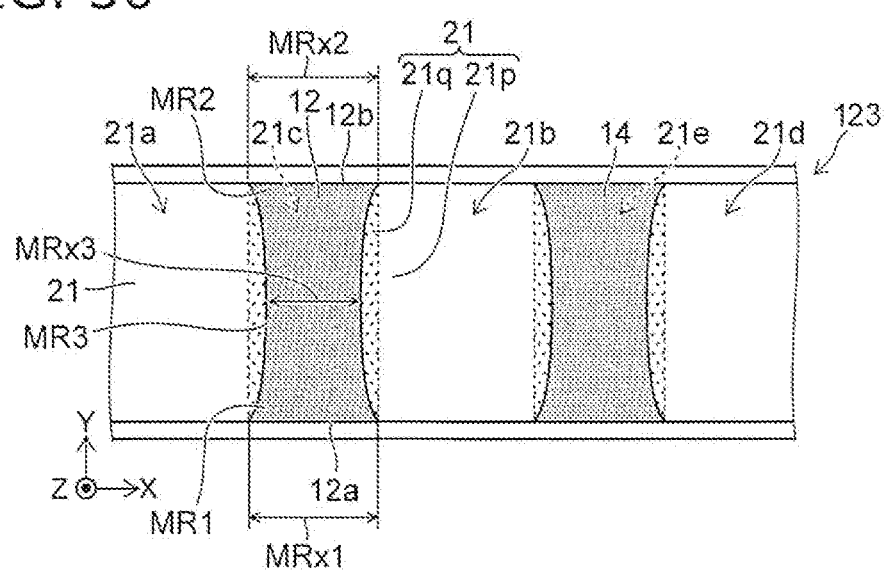
FIG. 30 is a schematic plan view illustrating a portion of a magnetic memory device according to the second embodiment.

FIG. 30 is a schematic plan view illustrating a portion of a magnetic memory device according to the second embodiment.

As shown in FIG. 30, in the magnetic memory device 123 as well, the length MRx1 is longer than the length MRx3 in the second magnetic layer 12. The length MRx2 is longer than the length MRx3. The first layer 21p and the second layer 21q are provided in the magnetic memory device 123 as well. The second layer 21q is provided at the concave portion of the side surface of the second magnetic layer 12. Thus, the second layer 21q may be provided at a portion of the conductive layer 21.

Third Embodiment

FIG. 31A to FIG. 31D are schematic views illustrating a magnetic memory device according to a third embodiment.

Figure 32:
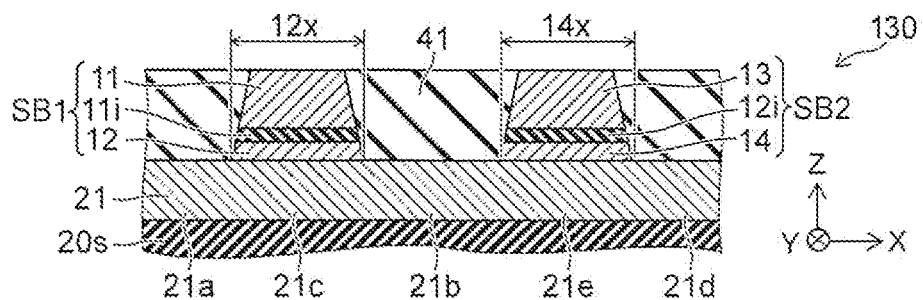
FIG. 32 is a schematic cross-sectional view illustrating the magnetic memory device according to the third embodiment.

FIG. 32 is a schematic cross-sectional view illustrating the magnetic memory device according to the third embodiment.

Figure 33A:
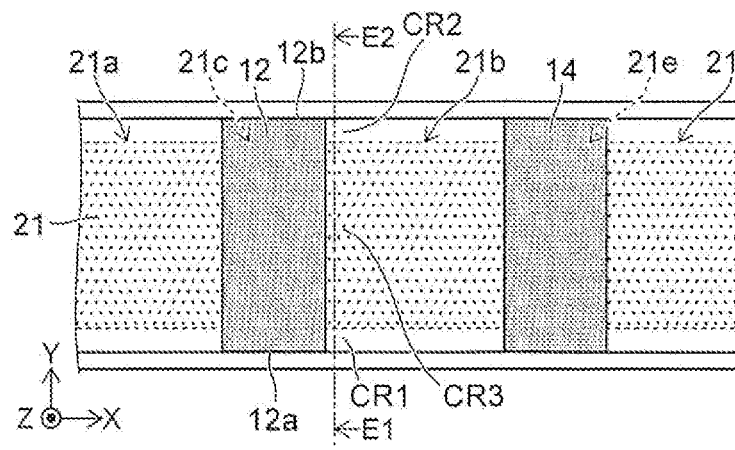
FIG. 33A and FIG. 33B are schematic views illustrating a portion of the magnetic memory device according to the third embodiment.
Figure 33B:
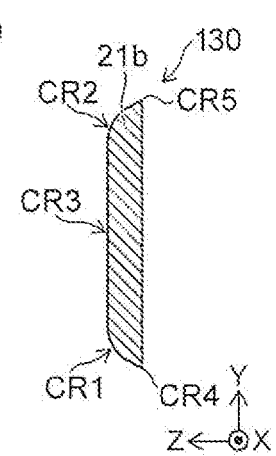

FIG. 33A and FIG. 33B are schematic views illustrating a portion of the magnetic memory device according to the third embodiment.

Figure 31A:
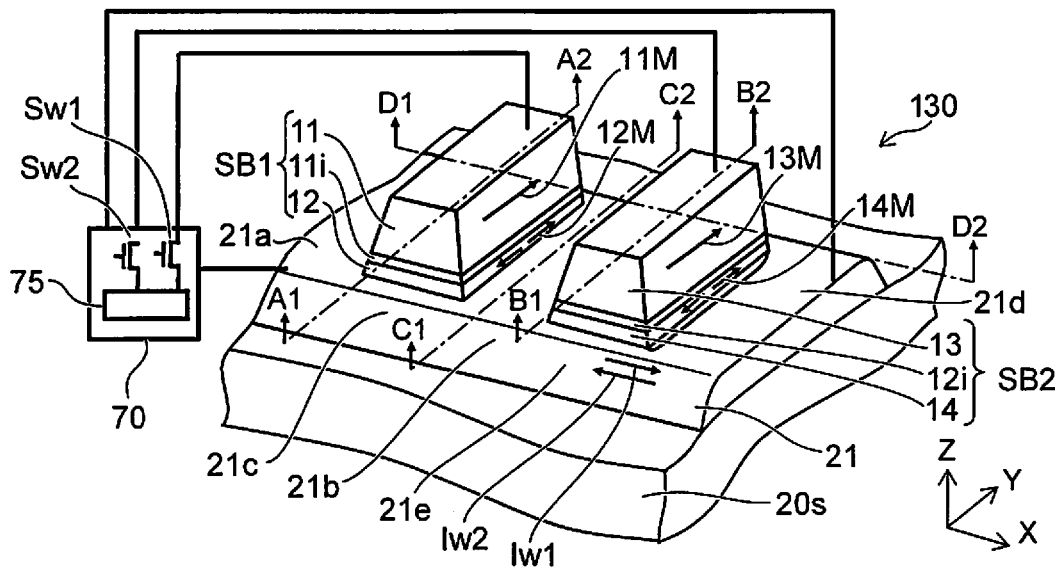
FIG. 31A to FIG. 31D are schematic views illustrating a magnetic memory device according to a third embodiment.
Figure 31B:
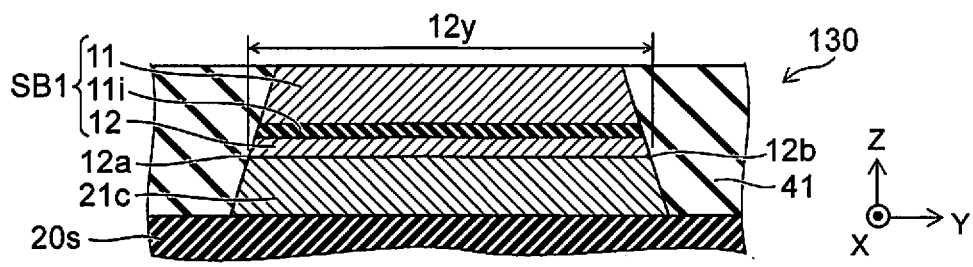
Figure 31C:
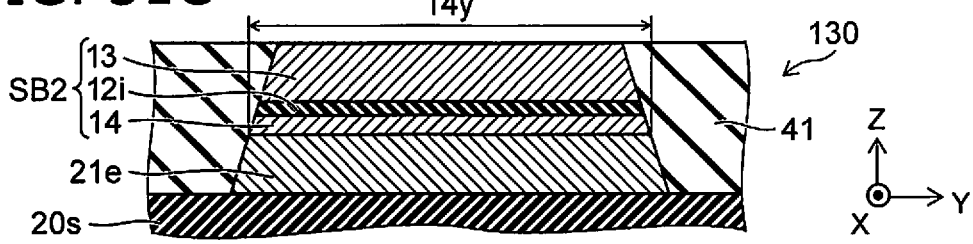
Figure 31D:
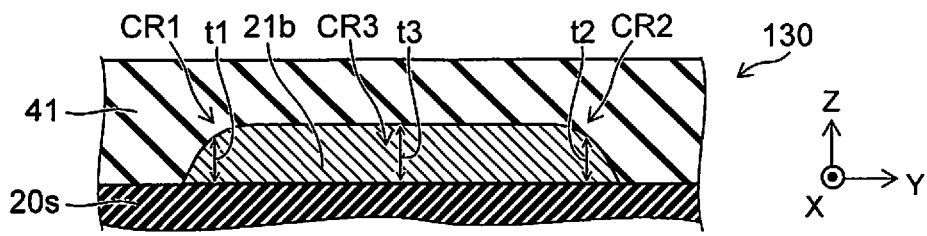

FIG. 31A is a perspective view. FIG. 31B is a line A1-A2 cross-sectional view of FIG. 31A. FIG. 31C is a line B1-B2 cross-sectional view of FIG. 31A. FIG. 31D is a line C1-C2 cross-sectional view of FIG. 31A. In FIG. 31A, the insulating portion 41 is not illustrated for easier viewing of the drawing. FIG. 32 is a line D1-D2 cross-sectional view of FIG. 31A. In FIG. 31A, the insulating portion 41 is not illustrated for easier viewing of the drawing. FIG. 33A is a plan view. In FIG. 33A, the conductive layer 21, the second magnetic layer 12, and the fourth magnetic layer 14 are illustrated; and the other components are not illustrated. FIG. 33B is a line E1-E2 cross-sectional view of FIG. 33A. The conductive layer 21 is not illustrated in FIG. 33B.

As shown in FIG. 31A, the magnetic memory device 130 also includes the conductive layer 21, the first magnetic layer 11, the second magnetic layer 12, the first nonmagnetic layer 11i, and the controller 70. The third magnetic layer 13, the fourth magnetic layer 14, and the second nonmagnetic layer 12i are provided in the example as well.

In the magnetic memory device 130 as shown in FIG. 31D, the central portion in the Y-axis direction of the conductive layer 21 is convex in the second region 21b (the non-overlap region) of the conductive layer 21.

The second region 21b of the conductive layer 21 includes the first to third conductive portions CR1 to CR3. The direction from the first conductive portion CR1 toward the second conductive portion CR2 is aligned with the third direction. The third direction crosses a plane (e.g., the Z-X plane) including the first direction (the Z-axis direction) and the second direction (e.g., the X-axis direction). The third direction is, for example, the Y-axis direction. The third conductive portion CR3 is between the first conductive portion CR1 and the second conductive portion CR2 in the third direction.

As shown in FIG. 31D, the thickness (the first thickness t1) along the first direction of the first conductive portion CR1 is thinner than the thickness (the third thickness t3) along the first direction of the third conductive portion CR3. The thickness (the second thickness t2) along the first direction of the second conductive portion CR2 is thinner than the third thickness t3.

As shown in FIG. 31B and FIG. 33A, the second magnetic layer 12 includes the first end portion 12a and the second end portion 12b. The direction from the first end portion 12a toward the second end portion 12b is aligned with the third direction (e.g., the Y-axis direction).

As shown in FIG. 33A, the position in the third direction (e.g., the Y-axis direction) of at least a portion of the first conductive portion CR1 is between the position in the third direction of the first end portion 12a and the position in the third direction of the second end portion 12b. For example, a high-density spin is generated in the central portion of the third region 21c by the current concentrating in the third conductive portion CR3. Thereby, for example, the magnetization reversal is promoted in the central portion of the second magnetic layer 12.

In the magnetic memory device 130, at least one of the first to third conductive portions CR1 to CR3 contacts the third region 21c (the overlap region).

FIG. 34A, FIG. 34B, FIG. 35A, FIG. 35B, FIG. 36A, FIG. 36B, FIG. 37A, FIG. 37B, FIG. 38A, FIG. 38B, FIG. 39A, FIG. 39B, FIG. 40A, FIG. 40B, FIG. 41A, FIG. 41B, FIG. 42A, and FIG. 42B are schematic views illustrating portions of magnetic memory devices according to the third embodiment.

FIG. 34A, FIG. 35A, FIG. 36A, FIG. 37A, FIG. 38A, FIG. 39A, FIG. 40A, FIG. 41A, and FIG. 42A are plan views. FIG. 34B, FIG. 35B, FIG. 36B, FIG. 37B, FIG. 38B, FIG. 39B, FIG. 40B, FIG. 41B, and FIG. 42B are line E1-E2 cross-sectional views respectively of FIG. 34A, FIG. 35A, FIG. 36A, FIG. 37A, FIG. 38A, FIG. 39A, FIG. 40A, FIG. 41A, and FIG. 42A.

Figure 34A:
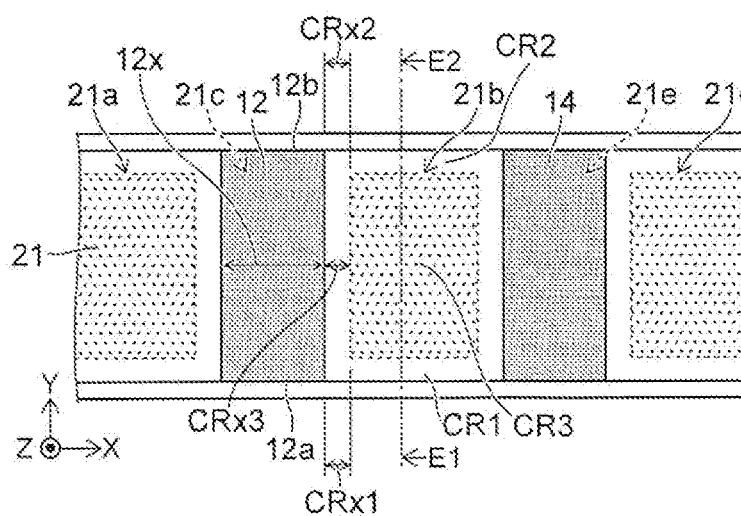
FIG. 34A and FIG. 34B are schematic views illustrating a portion of magnetic memory devices according to the third embodiment.
Figure 34B:
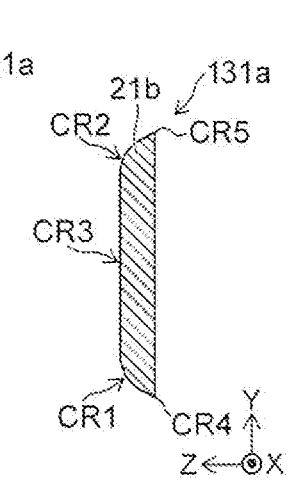

In a magnetic memory device 131a shown in FIG. 34A and FIG. 34B, the third conductive portion CR3 is separated from the third region 21c (the overlap region).

The distance along the second direction (the X-axis direction) between the third conductive portion CR3 and the third region 21c is taken as a distance CRx3. The distance CRx3 is not more than ½ of the length 12x along the second direction of the second magnetic layer 12. The distance CRx3 may be ¼ of the length 12x or less. By providing the third conductive portion CR3 (the thick portion) to be proximal to the third region 21c, the high current density of the third conductive portion CR3 causes the current density of the overlap portion to change. Therefore, the third conductive portion CR3 may be separated from the third region 21c by a short distance.

The distance along the second direction (the X-axis direction) between the first conductive portion CR1 and the third region 21c is taken as the distance CRx1. The distance along the second direction between the second conductive portion CR2 and the third region 21c is taken as the distance CRx2. In the embodiment, at least one of the distance CRx1, the distance CRx2, or the distance CRx3 may be ½ of the length 12x or less. At least one of the distance CRx1, the distance CRx2, or the distance CRx3 may be ¼ of the length 12x or less.

Figure 35A:
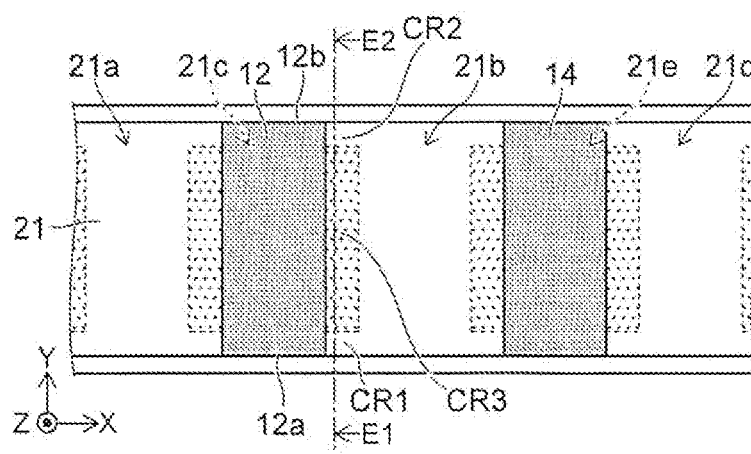
FIG. 35A and FIG. 35B are schematic views illustrating a portion of magnetic memory devices according to the third embodiment.
Figure 35B:
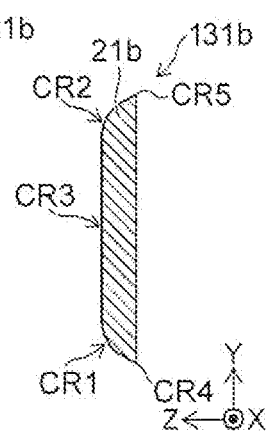

In a magnetic memory device 131b shown in FIG. 35A and FIG. 35B, the two third conductive portions CR3 that are separated from each other in the X-axis direction are provided between the two overlap regions (the third region 21c and the fifth region 21e). One third conductive portion CR3 is provided between the first conductive portion CR1 and the second conductive portion CR2 in the Y-axis direction.

Figure 36A:
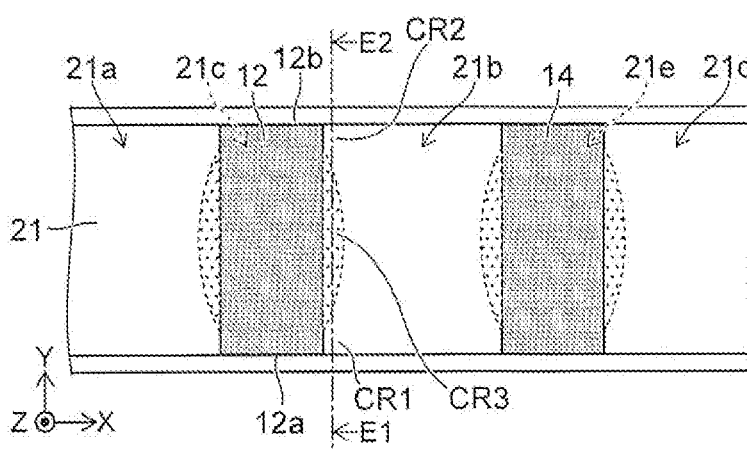
FIG. 36A and FIG. 36B are schematic views illustrating a portion of magnetic memory devices according to the third embodiment.
Figure 36B:
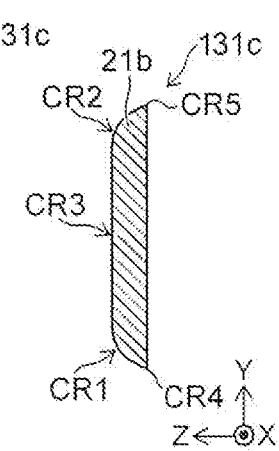
Figure 37A:
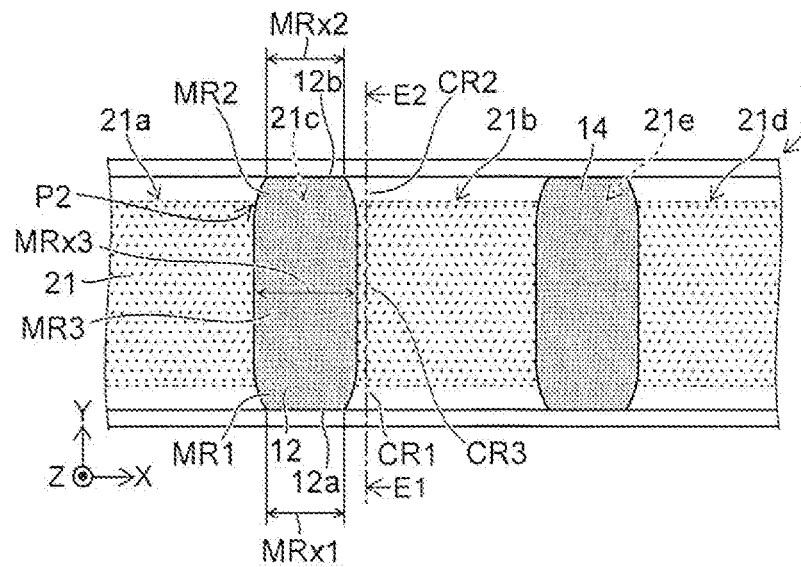
FIG. 37A and FIG. 37B are schematic views illustrating a portion of magnetic memory devices according to the third embodiment.
Figure 37B:
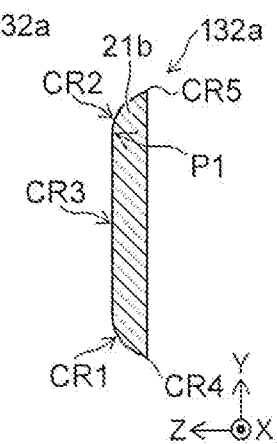
Figure 38A:
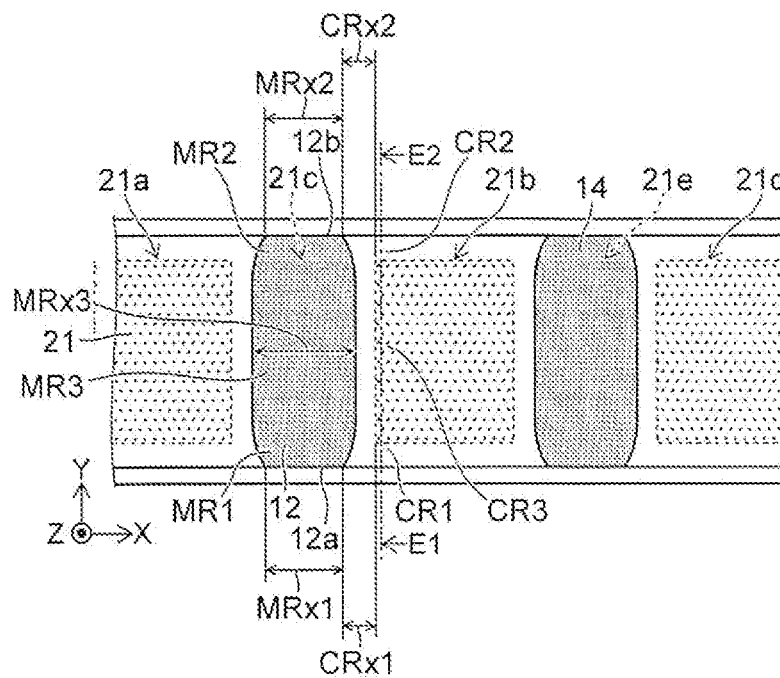
FIG. 38A and FIG. 38B are schematic views illustrating a portion of magnetic memory devices according to the third embodiment.
Figure 38B:
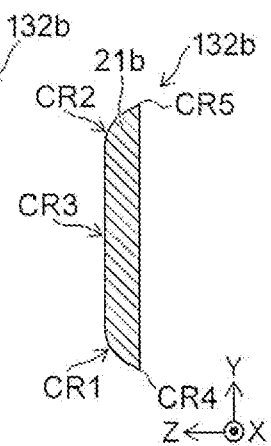
Figure 39A:
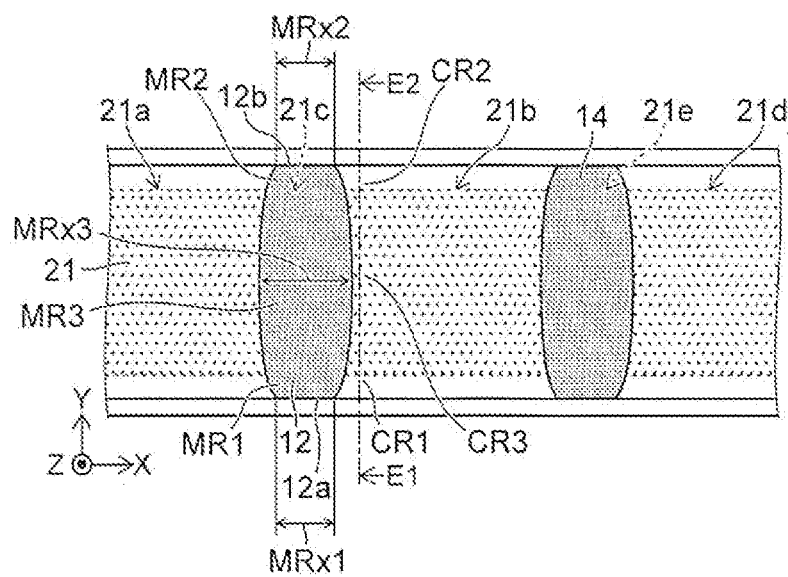
FIG. 39A and FIG. 39B are schematic views illustrating a portion of magnetic memory devices according to the third embodiment.
Figure 39B:
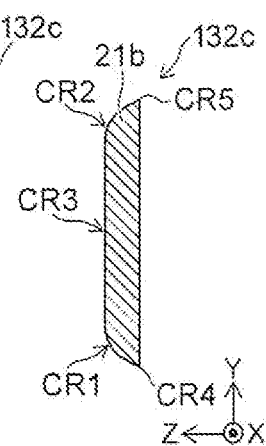
Figure 40A:
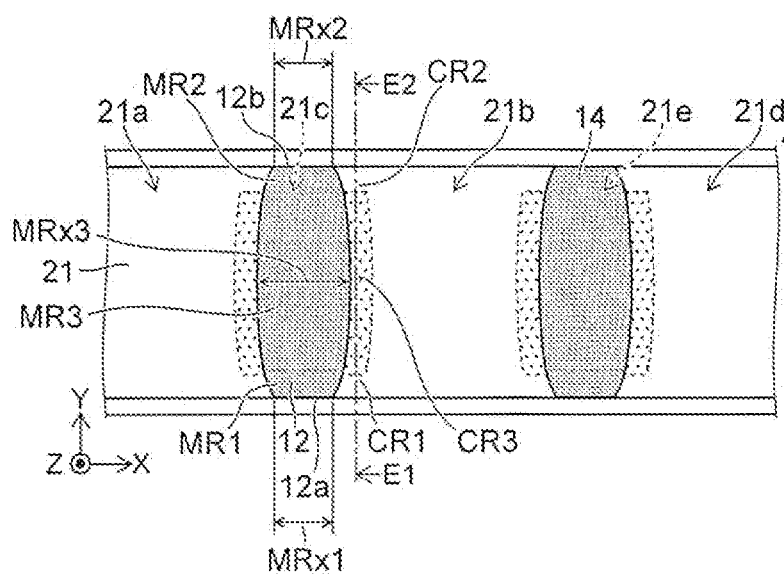
FIG. 40A and FIG. 40B are schematic views illustrating a portion of magnetic memory devices according to the third embodiment.
Figure 40B:
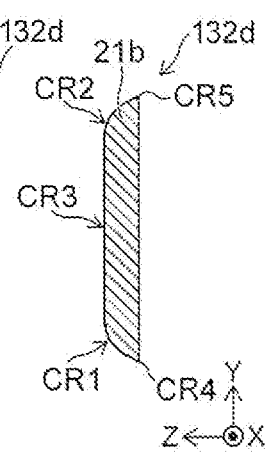
Figure 41A:
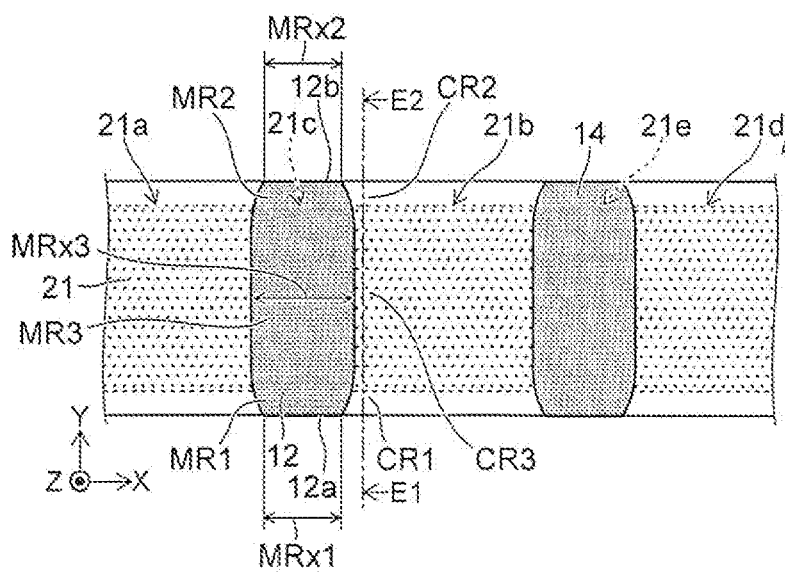
FIG. 41A and FIG. 41B are schematic views illustrating a portion of magnetic memory devices according to the third embodiment.
Figure 41B:
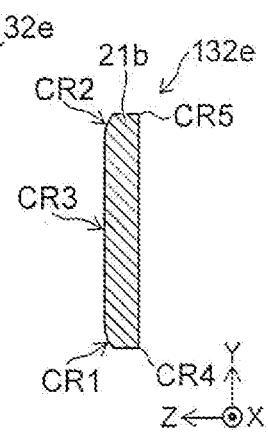
Figure 42A:
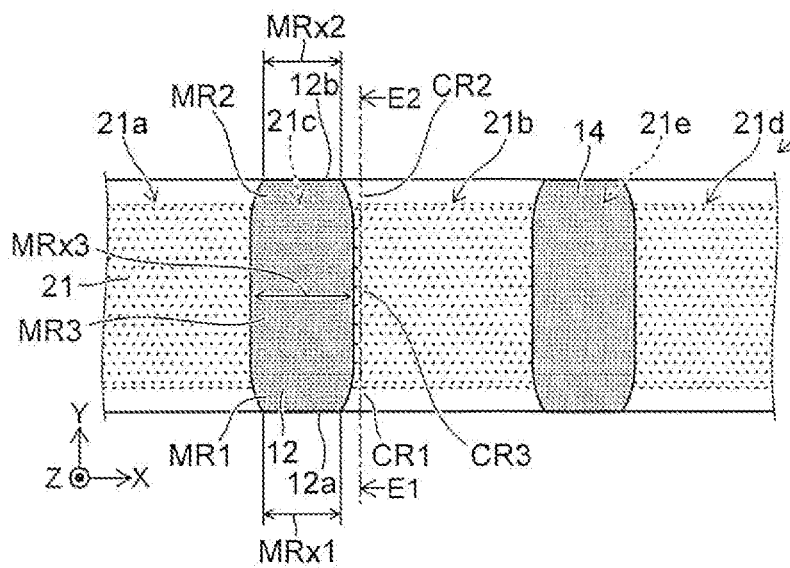
FIG. 42A and FIG. 42B are schematic views illustrating a portion of magnetic memory devices according to the third embodiment.
Figure 42B:
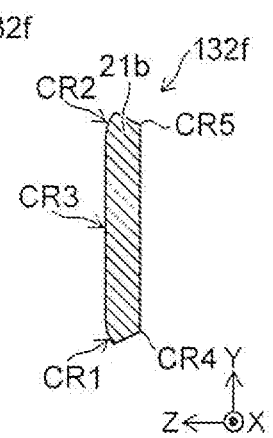

In a magnetic memory device 131c shown in FIG. 36A and FIG. 36B, the side surface (a surface crossing the Z-X plane) of the third conductive portion CR3 is convex.

In magnetic memory devices 132a to 132f as shown in FIG. 37A, FIG. 38A, FIG. 39A, FIG. 40A, FIG. 41A, and FIG. 42A, the side surface (a surface crossing the Z-X plane) of the second magnetic layer 12 is convex.

For example, the length along the second direction (e.g., the X-axis direction) of the first magnetic portion MR1 is taken as the length MRx1. The length along the second direction of the second magnetic portion MR2 is taken as the length MRx2. The length along the second direction of the third magnetic portion MR3 is taken as the length MRx3. In the magnetic memory devices 132a to 132f, the length MRx1 is shorter than the length MRx3. For example, the length MRx2 is shorter than the length MRx3.

In the magnetic memory devices 132a to 132f, the change of the thickness of the conductive layer 21 and the change of the width of the second magnetic layer 12 may be interrelated. For example, the second region 21b includes a portion including the first conductive portion CR1 and the third conductive portion CR3. The position in the third direction (the Y-axis direction) of the region where the thickness along the first direction (the Z-axis direction) of this portion starts to change is taken as the position P1 (referring to FIG. 37B). On the other hand, the position in the third direction (the Y-axis direction) of the region where the length (the width) along the second direction (the X-axis direction) of the portion including the first magnetic portion MR1 and the third magnetic portion MR3 of the second magnetic layer 12 starts to change is taken as the position P2 (referring to FIG. 37A). The position P1 overlaps the position P2.

Figure 43A:
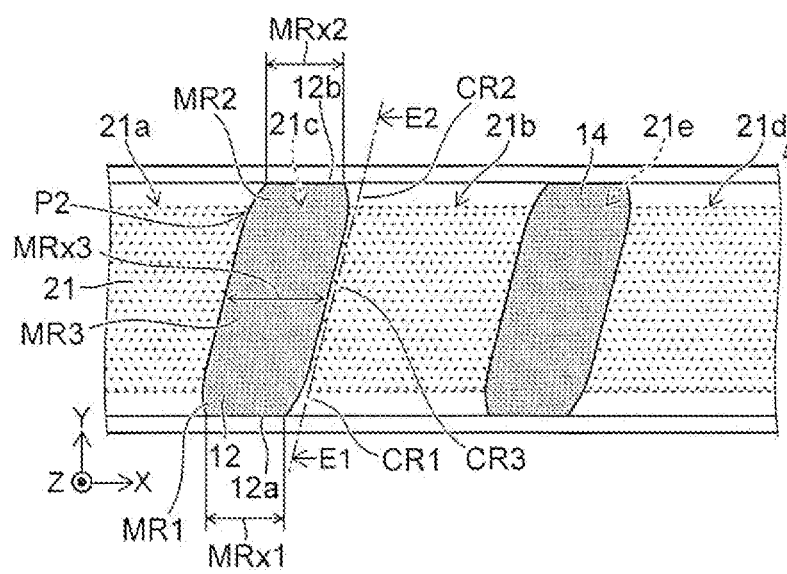
FIG. 43A and FIG. 43B are schematic views illustrating a portion of a magnetic memory device according to the third embodiment.
Figure 43B:
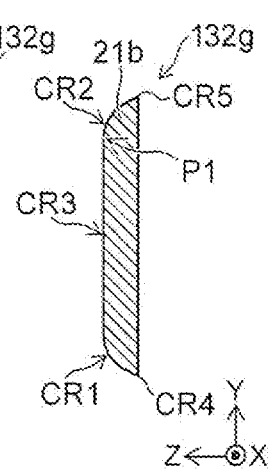

In a magnetic memory device 132g shown in FIG. 43A and FIG. 43B, the major axis (and the minor axis) of the second magnetic layer 12 are tilted with respect to the X-axis direction. The major axis (and the minor axis) are aligned with the X-Y plane. The current has a component in a direction crossing (e.g., tilted with respect to) the X-axis direction. A spin is generated that crosses the orientation of the magnetization of the second magnetic layer 12. Thereby, magnetization reversal is promoted in the second magnetic layer 12.

FIG. 44A to FIG. 44F are schematic views illustrating portions of a magnetic memory device according to the third embodiment.

Figure 44A:
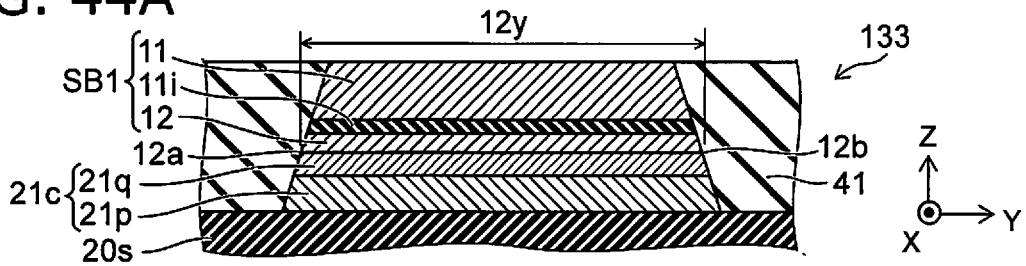
FIG. 44A to FIG. 44F are schematic views illustrating portions of a magnetic memory device according to the third embodiment.
Figure 44B:
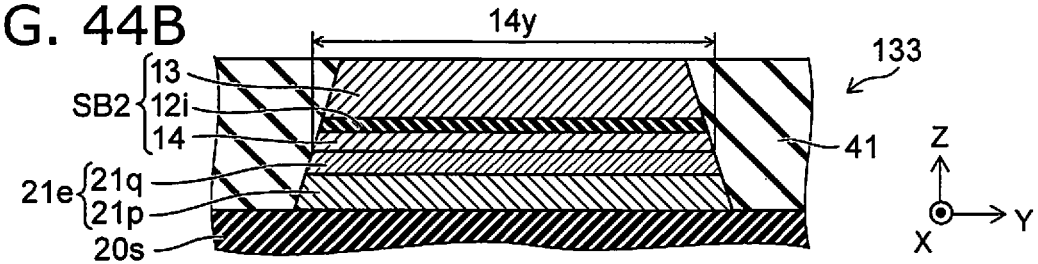
Figure 44C:
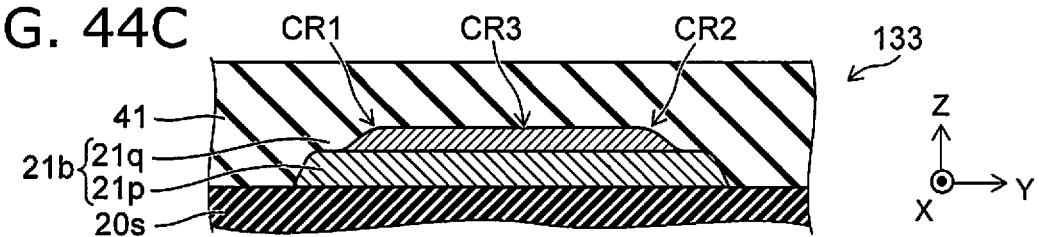
Figure 44D:
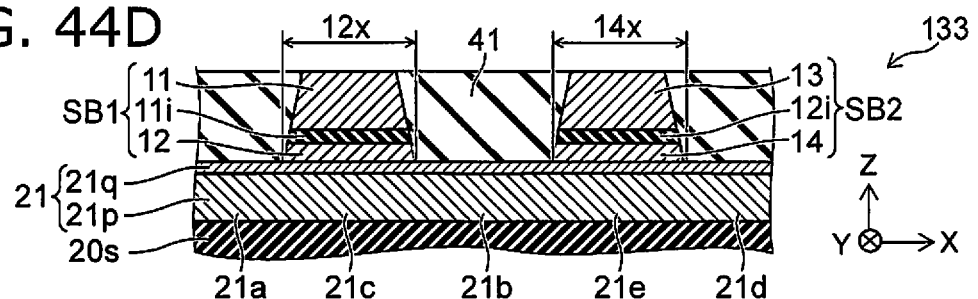
Figure 44E:
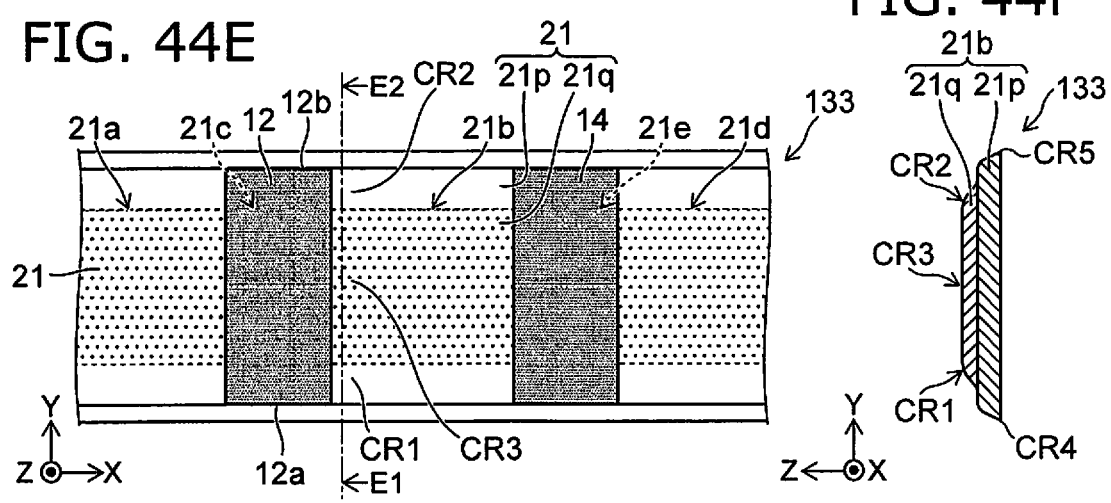
Figure 44F:
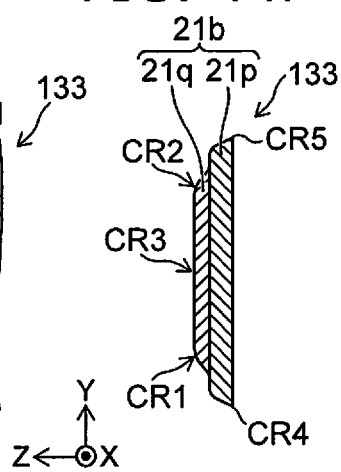

FIG. 44A is a cross-sectional view corresponding to line A1-A2 of FIG. 31A. FIG. 44B is a cross-sectional view corresponding to line B1-B2 of FIG. 31A. FIG. 44C is a cross-sectional view corresponding to line C1-C2 of FIG. 31A. FIG. 44D is a cross-sectional view corresponding to line D1-D2 of FIG. 31A. FIG. 44E is a plan view. FIG. 44F is a line E1-E2 cross-sectional view of FIG. 44E.

In the magnetic memory device 133 shown in these drawings, the conductive layer 21 includes multiple layers. Otherwise, the configuration of any of the magnetic memory devices recited above is applicable. Examples of the conductive layer 21 of the magnetic memory device 133 will now be described.

At least a portion of the conductive layer 21 includes the first layer 21p and the second layer 21q. A portion of the second layer 21q is between the first layer 21p and the second magnetic layer 12. Another portion of the second layer 21q is included in the third conductive portion CR3. The second layer 21q includes the second metallic element that is different from the first metallic element included in the first layer 21p. For example, the first metallic element includes at least one selected from the group consisting of tantalum and tungsten. For example, the second metallic element includes hafnium. For example, the first metallic element includes tantalum; and the second metallic element includes HfB.

For example, a large spin polarization is obtained for the first metallic element. For example, a large spin Hall angle (absolute value) is obtained. For example, a large MR ratio is obtained for the second metallic element.

In the magnetic memory device 133, the portion where the second layer 21q is provided in the second region 21b is used to form the third conductive portion CR3. The region where the second layer 21q is not provided is used to form the first conductive portion CR1 and the second conductive portion CR2. For example, at least a portion of the first conductive portion CR1 does not include the second layer 21q. At least a portion of the second conductive portion CR2 does not include the second layer 21q. At least a portion of the third conductive portion CR3 includes the second layer 21q.

In the magnetic memory device 133, at least one of the first to third conductive portions CR1 to CR3 contacts the third region 21c. For example, the second layer 21q that is included in the thick portion (the third conductive portion CR3) contacts the third region 21c.

FIG. 45A, FIG. 45B, FIG. 46A, FIG. 46B, FIG. 47A, FIG. 47B, FIG. 48A, FIG. 48B, FIG. 49A, FIG. 49B, FIG. 50A, FIG. 50B, FIG. 51A, FIG. 51B, FIG. 52A, and FIG. 52B are schematic views illustrating portions of magnetic memory devices according to the third embodiment.

FIG. 45A, FIG. 46A, FIG. 47A, FIG. 48A, FIG. 49A, FIG. 50A, FIG. 51A, and FIG. 52A are plan views. FIG. 45B, FIG. 46B, FIG. 47B, FIG. 48B, FIG. 49B, FIG. 50B, FIG. 51B, and FIG. 52B are line E1-E2 cross-sectional views respectively of FIG. 45A, FIG. 46A, FIG. 47A, FIG. 48A, FIG. 49A, FIG. 50A, FIG. 51A, and FIG. 52A.

Figure 45A:
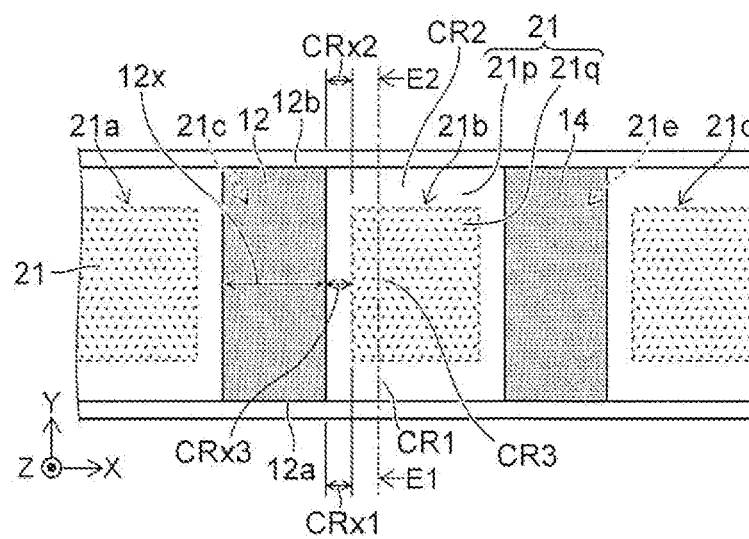
FIG. 45A and FIG. 45B are schematic views illustrating a portion of a magnetic memory device according to the third embodiment.
Figure 45B:
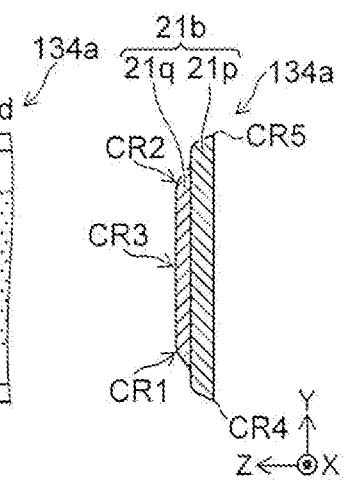

In a magnetic memory device 134a shown in FIG. 45A and FIG. 45B, the third conductive portion CR3 is separated from the third region 21c. The distance along the second direction (the X-axis direction) between the first conductive portion CR1 and the third region 21c is taken as the distance CRx1. The distance along the second direction between the second conductive portion CR2 and the third region 21c is taken as the distance CRx2. In the embodiment, at least one of the distance CRx1, the distance CRx2, or the distance CRx3 may be ½ of the length 12x or less. At least one of the distance CRx1, the distance CRx2, or the distance CRx3 may be ¼ of the length 12x or less. For example, the distance CRx3 corresponds to the distance along the second direction (the X-axis direction) between the second layer 21q and the third region 21c.

Figure 46A:
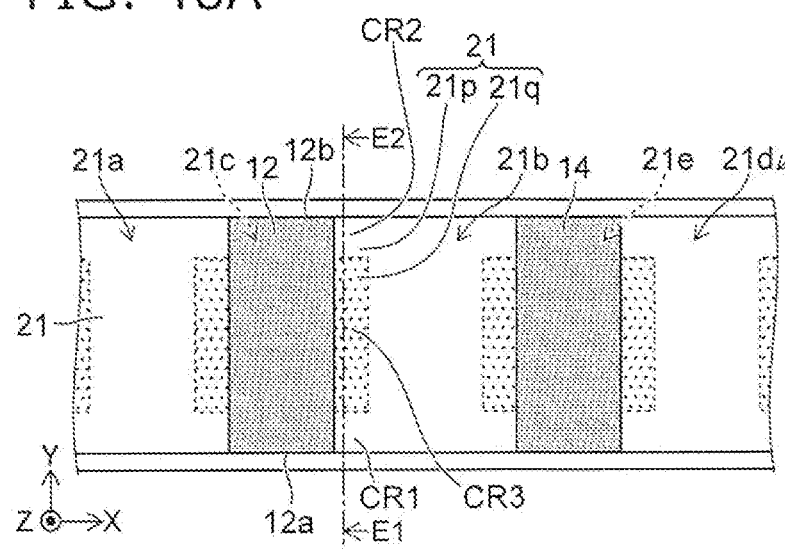
FIG. 46A and FIG. 46B are schematic views illustrating a portion of a magnetic memory device according to the third embodiment.
Figure 46B:
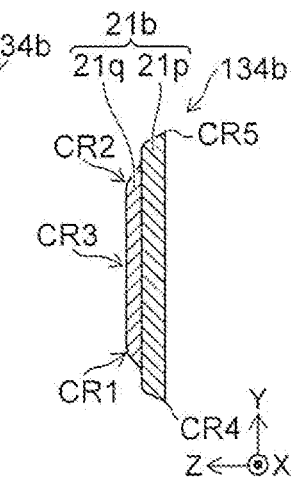

In a magnetic memory device 134b shown in FIG. 46A and FIG. 46B, the two third conductive portions CR3 that are separated from each other in the X-axis direction are provided between the two overlap regions (the third region 21c and the fifth region 21e). For example, the two second layers 21q that are separated from each other in the X-axis direction are provided between the two overlap regions (the third region 21c and the fifth region 21e).

Figure 47A:
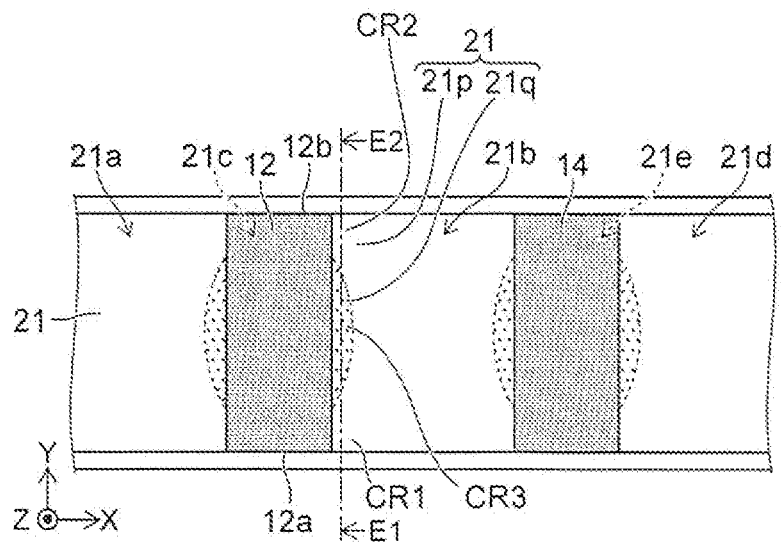
FIG. 47A and FIG. 47B are schematic views illustrating a portion of a magnetic memory device according to the third embodiment.
Figure 47B:
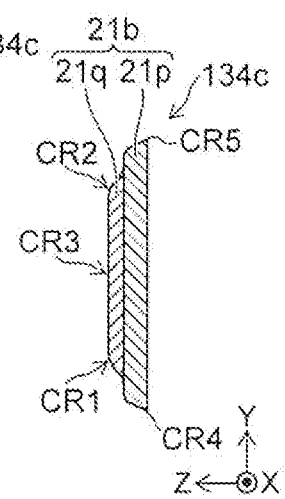
Figure 48A:
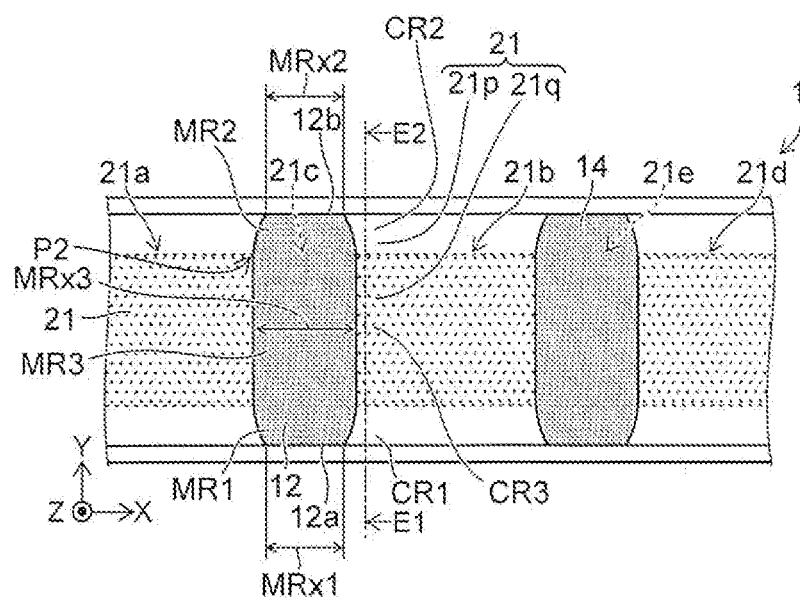
FIG. 48A and FIG. 48B are schematic views illustrating a portion of a magnetic memory device according to the third embodiment.
Figure 48B:
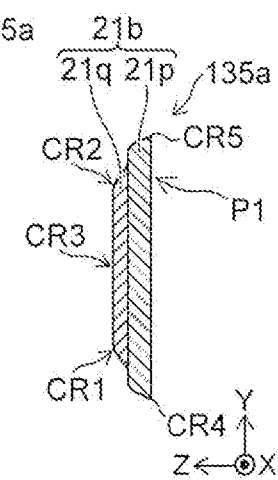
Figure 49A:
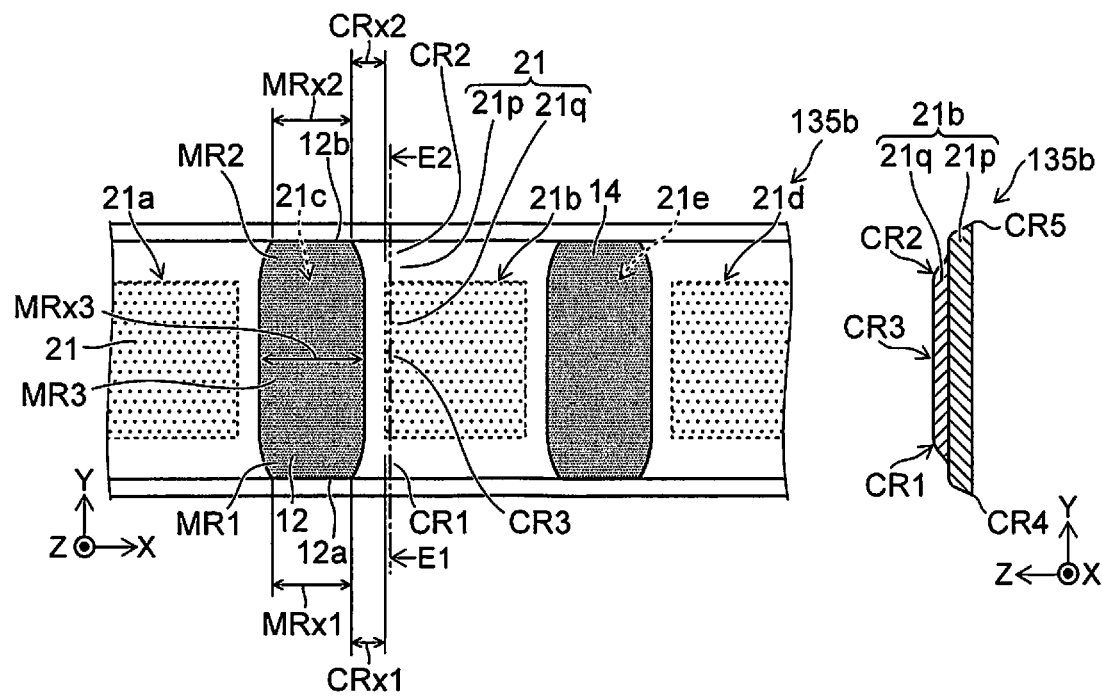
FIG. 49A and FIG. 49B are schematic views illustrating a portion of a magnetic memory device according to the third embodiment.
Figure 49B:
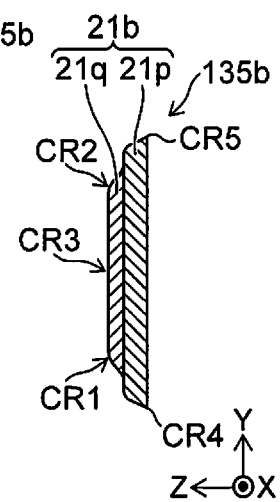

As in a magnetic memory device 134c shown in FIG. 47A and FIG. 47B, the side surface (the side surface crossing the Z-X plane) of the second layer 21q may be convex (e.g., a convex curved surface).

In magnetic memory devices 135a to 135e as shown in FIG. 48A, FIG. 49A, FIG. 50A, FIG. 51A, and FIG. 52A, the side surface (the surface crossing the Z-X plane) of the second magnetic layer 12 is convex. For example, the length MRx1 is shorter than the length MRx3. For example, the length MRx2 is shorter than the length MRx3.

In the magnetic memory devices 135a to 135e, the change of the thickness of the conductive layer 21 and the change of the width of the second magnetic layer 12 may be interrelated. For example, the position P1 of the region where the thickness of the conductive layer 21 starts to change (referring to FIG. 48B) may overlap the position P2 of the region where the length (the width) of the second magnetic layer 12 starts to change (referring to FIG. 48A). For example, the position P1 may be the end in the Y-axis direction of the second layer 21q.

Figure 50A:
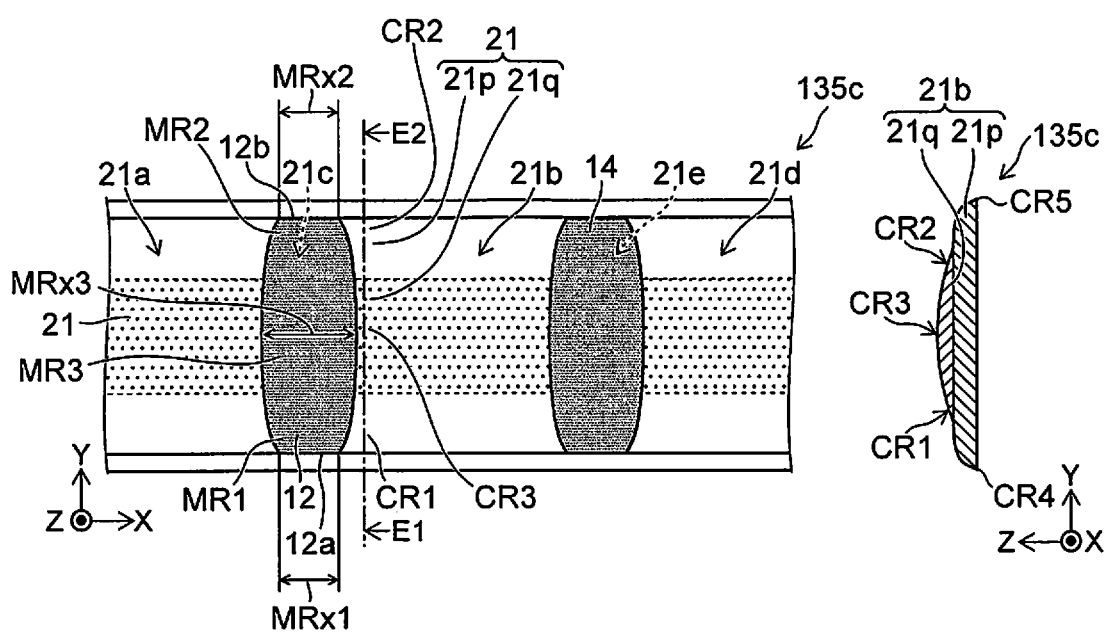
FIG. 50A and FIG. 50B are schematic views illustrating a portion of a magnetic memory device according to the third embodiment.
Figure 50B:
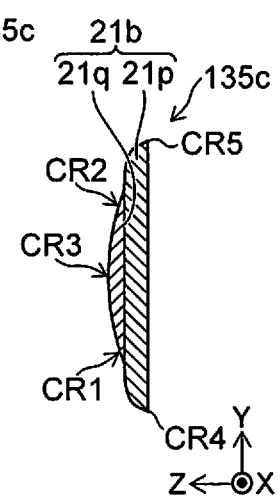
Figure 51A:
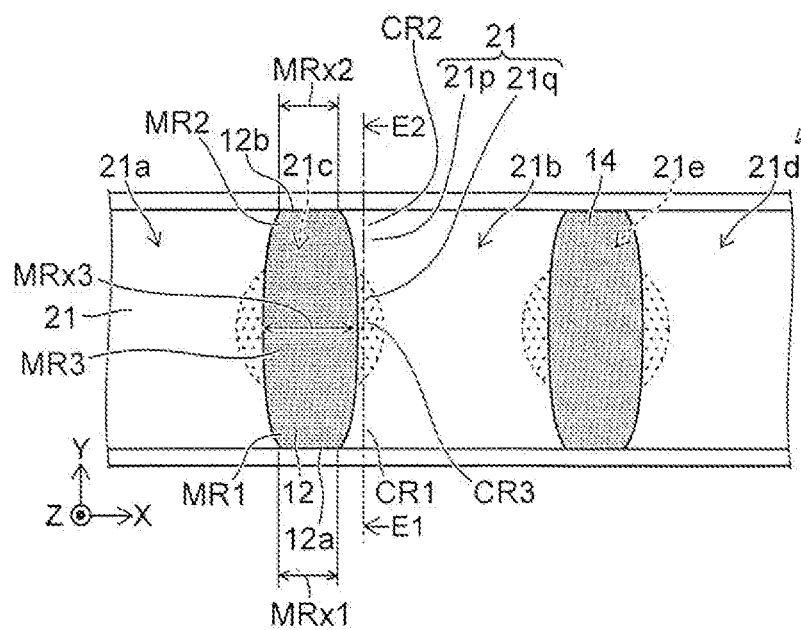
FIG. 51A and FIG. 51B are schematic views illustrating a portion of a magnetic memory device according to the third embodiment.
Figure 51B:
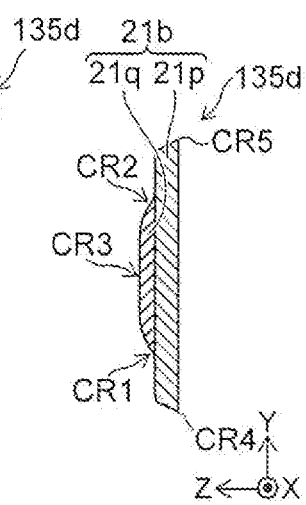
Figure 52A:
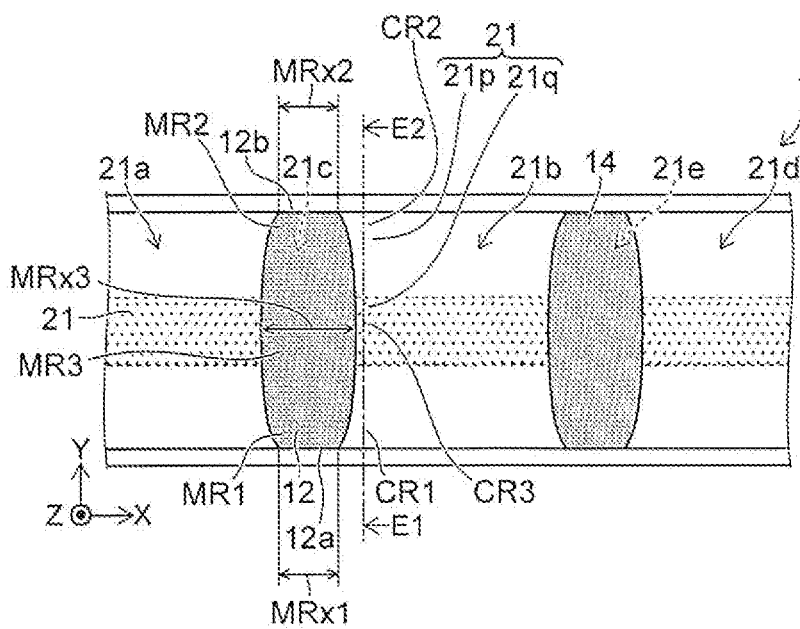
FIG. 52A and FIG. 52B are schematic views illustrating a portion of a magnetic memory device according to the third embodiment.
Figure 52B:
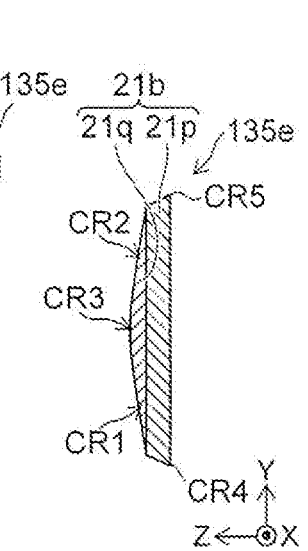

As shown in FIG. 50A, FIG. 51A, and FIG. 52A, the thickness of the second layer 21q changes in the magnetic memory devices 135c to 135e. For example, the thickness along the first direction (the Z-axis direction) of the second layer 21q included in at least a portion of the first conductive portion CR1 may be thinner than the thickness along the first direction of the second layer 21q included in the third conductive portion CR3.

An example of a method for manufacturing the magnetic memory device according to the first to third embodiments will now be described.

FIG. 53A to FIG. 53E are schematic perspective views in order of the processes, illustrating the method for manufacturing the magnetic memory device according to the embodiment.

Figure 53A:
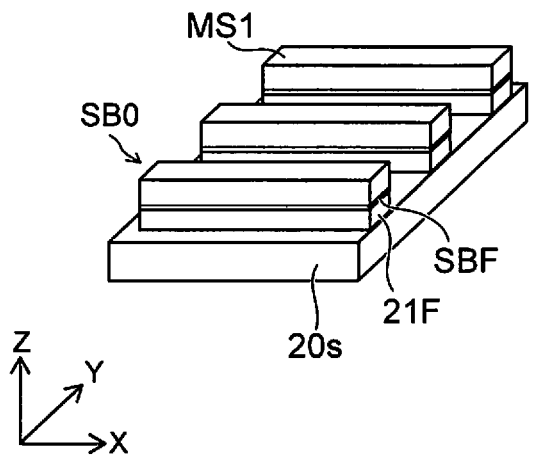
FIG. 53A to FIG. 53E are schematic perspective views in order of the processes, illustrating a method for manufacturing the magnetic memory device according to the embodiment.

As shown in FIG. 53A, multiple stacked bodies SB0 are provided on the base body 20s. For example, the multiple stacked bodies SB0 extend in the X-axis direction. The multiple stacked bodies SB0 include a conductive film 21F and a stacked film SBF. For example, a film that is used to form the conductive film 21F is formed on the base body 20s; and a film that is used to form the stacked film SBF is formed on the film used to form the conductive film 21F. A mask MS1 is further formed on the film used to form the stacked film SBF. The mask MS1 has a band configuration extending in the X-axis direction. The stacked film SBF and the film used to form the conductive film 21F are patterned using the mask MS1 as a mask. Thereby, the multiple stacked bodies SB0 are obtained. As described below, the conductive layer 21 is formed from the conductive film 21F. The first stacked body SB1, the second stacked body SB2, etc., are formed from the stacked film SBF. The stacked film SBF includes, for example, a film used to form the first magnetic layer 11, a film used to form the first nonmagnetic layer 11i, and a film used to form the second magnetic layer 12.

Figure 53B:
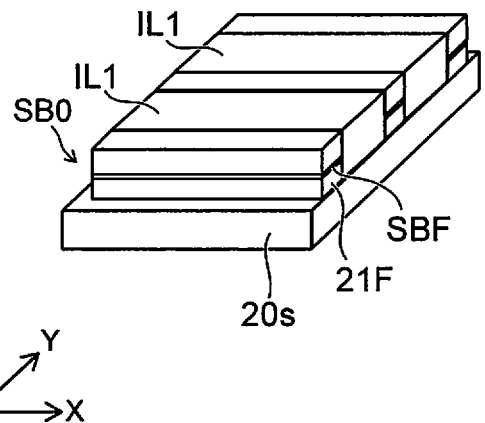

As shown in FIG. 53B, an insulating film IL1 is formed between the multiple stacked bodies SB0. The upper surface is planarized as necessary.

Figure 53C:
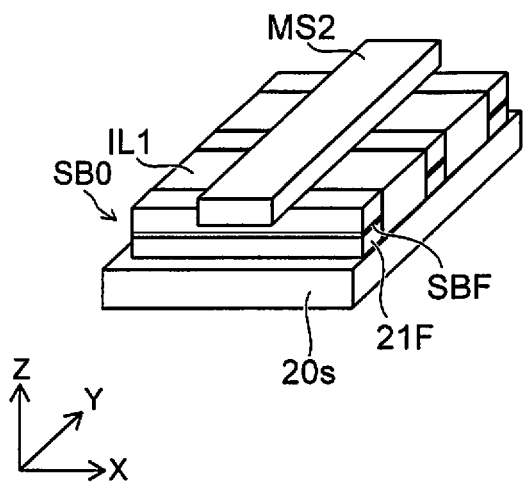

A mask MS2 is formed as shown in FIG. 53C. The mask MS2 extends in the Y-axis direction. A portion of the multiple stacked bodies SB0 and a portion of the insulating film IL1 are not covered with the mask MS2. A portion of the multiple stacked bodies SB0 is removed using the mask MS2 as a mask.

Figure 53D:
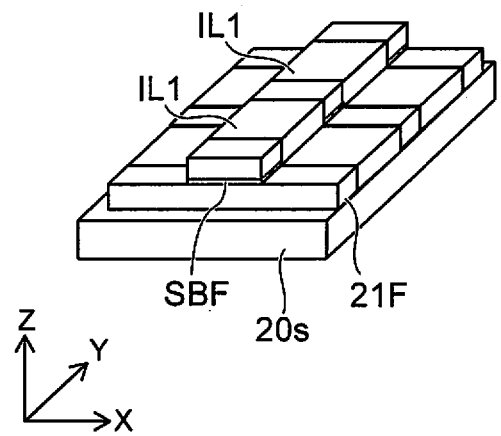

As shown in FIG. 53D, the portion of the stacked film SBF not covered with the mask MS2 is removed. The mask MS2 is removed. For example, the first stacked body SB1, the second stacked body SB2, etc., are formed from the stacked film SBF.

Figure 53E:
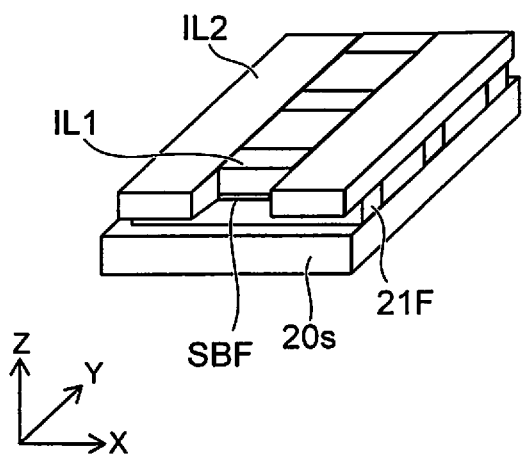

An insulating film IL2 is formed as shown in FIG. 53E. The insulating portion 41 is formed of at least a portion of the insulating film IL1 and at least a portion of the insulating film IL2.

In the embodiment, for example, the first to third conductive portions CR1 to CR3 are formed in the conductive film 21F by controlling the patterning conditions in the process illustrated in FIG. 53D. The first to third magnetic portions MR1 to MR3 are formed in the stacked film SBF by controlling the patterning conditions. The surface of the conductive film 21F becomes concave or convex due to the patterning conditions. The surface (e.g., the side surface) of the stacked film SBF becomes concave or convex due to the patterning conditions.

Examples of the conductive layer 21, the first magnetic layer 11, the second magnetic layer 12, and the first nonmagnetic layer 11i will now be described. The description of these layers is applicable to any example of the first to third embodiments recited above. The following description relating to the first magnetic layer 11 is applicable to the third magnetic layer 13. The following description relating to the second magnetic layer 12 is applicable to the fourth magnetic layer 14. The following description relating to the first nonmagnetic layer 11i is applicable to the second nonmagnetic layer 12i.

The conductive layer 21 includes, for example, at least one selected from the group consisting of tantalum and tungsten. The conductive layer 21 includes, for example, at least one selected from the group consisting of β-tantalum and β-tungsten. The conductive layer 21 may include at least one selected from the group consisting of platinum and gold.

The second magnetic layer 12 includes, for example, at least one selected from the group consisting of FePd, FePt, CoPd, and CoPt. The soft magnetic material recited above includes, for example, CoFeB. The artificial lattice recited above includes, for example, a stacked film including a first film and a second film. The first film includes, for example, at least one of NiFe, Fe, or Co. The second film includes, for example, at least one of Cu, Pd, or Pt. The first film is, for example, a magnetic material; and the second film is a nonmagnetic material.

The first nonmagnetic layer 11i includes, for example, at least one selected from the group consisting of MgO, CaO, SrO, TiO, VO, NbO, and $Al_2O_3$. The first nonmagnetic layer 11i is, for example, a tunneling barrier layer. In the case where the first nonmagnetic layer 11i includes MgO, the thickness of the first nonmagnetic layer 11i is, for example, about 1 nm.

The first magnetic layer 11 includes, for example, at least one selected from Co and CoFeB. The first magnetization 11M of the first magnetic layer 11 is fixed in substantially one direction (a direction crossing the Z-axis direction) in the plane.

For example, the thickness of the first magnetic layer 11 is thicker than the thickness of the second magnetic layer 12. Thereby, the first magnetization 11M of the first magnetic layer 11 is fixed stably in the prescribed direction.

For example, a ferromagnetic or antiferromagnetic layer may be provided. The first magnetic layer 11 is provided between the layer and the first nonmagnetic layer 11i. The layer is, for example, an IrMn-layer (having a thickness not less than 7 nm and not more than 9 nm). The layer fixes the first magnetization 11M of the first magnetic layer 11. A Ta layer may be provided on the layer.

At least one of the first magnetic layer 11 or the second magnetic layer 12 may be an in-plane magnetization film. At least one of the first magnetic layer 11 or the second magnetic layer 12 may be a perpendicular magnetization film.

Examples of operations of the magnetic memory device according to the embodiment will now be described.

As described above, the controller 70 is electrically connected to the first stacked body SB1 (the first magnetic layer 11) and the second stacked body SB2 (the third magnetic layer 13). A prescribed select voltage is applied to the first magnetic layer 11 when programming information to the first stacked body SB1. At this time, an unselect voltage is applied to the second stacked body SB2. On the other hand, the prescribed select voltage is applied to the third magnetic layer 13 when programming the information to the second stacked body SB2. At this time, the unselect voltage is applied to the first stacked body SB1. The application of a voltage of 0 volts also is included in "a voltage being applied." The potential of the select voltage is different from the potential of the unselect voltage.

For example, in a first program operation, the controller 70 sets the first magnetic layer 11 to a potential (e.g., a select potential) that is different from the potential of the third magnetic layer 13 (e.g., an unselect potential). In a second program operation, the controller 70 sets the first magnetic layer 11 to a potential (e.g., the select potential) that is different from the potential of the third magnetic layer 13 (e.g., the unselect potential).

For example, in a third program operation, the controller 70 sets the third magnetic layer 13 to a potential (e.g., the select potential) that is different from the potential of the first magnetic layer 11 (e.g., the unselect potential). In a fourth program operation, the controller 70 sets the third magnetic layer 13 to a potential (e.g., the select potential) that is different from the potential of the first magnetic layer 11 (e.g., the unselect potential).

For example, the selection of such a potential is performed by the operations of the first switch Sw1 and the second switch Sw2.

Examples of such operations will now be described.

FIG. 54A to FIG. 54D are schematic views illustrating operations of the magnetic memory device according to the embodiment.

Figure 54A:
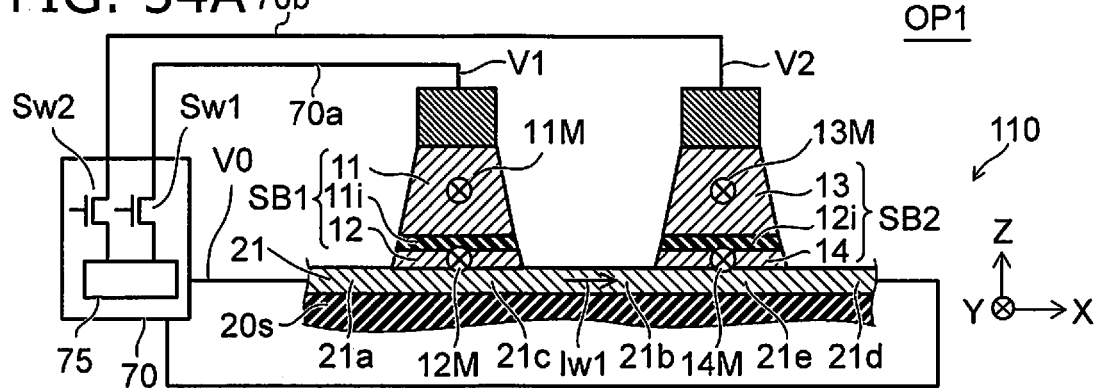
FIG. 54A to FIG. 54D are schematic views illustrating operations of the magnetic memory device according to the embodiment.

As shown in FIG. 54A, the controller 70 and the first magnetic layer 11 are electrically connected by the first interconnect 70a. The controller 70 and the third magnetic layer 13 are electrically connected by the second interconnect 70b. In the example, the first switch Sw1 is provided on the first interconnect 70a. The second switch Sw2 is provided on the second interconnect 70b. The potential of the first magnetic layer 11 is controlled by the controller 70 controlling the potential of the first interconnect 70a. The change of the potential of the first interconnect 70a is substantially small. Therefore, the potential of the first interconnect 70a can be considered to be the potential of the first magnetic layer 11. Similarly, the potential of the second interconnect 70b can be considered to be the potential of the third magnetic layer 13. Hereinbelow, the potential of the first magnetic layer 11 is considered to be the same as the potential of the first interconnect 70a. Hereinbelow, the potential of the third magnetic layer 13 is considered to be the same as the potential of the second interconnect 70b.

In the following examples, the first magnetization 11M of the first magnetic layer 11 and the third magnetization 13M of the third magnetic layer 13 are in the +Y direction. These magnetizations are fixed.

In a first operation OP1 as shown in FIG. 54A, the controller 70 sets the first region 21a of the conductive layer 21 to a potential V0. The potential V0 is, for example, a ground potential. In the first operation OP1, the controller 70 sets the first magnetic layer 11 to a first voltage V1. In other words, in the first operation OP1, the controller 70 sets a first potential difference between the first region 21a and the first magnetic layer 11 to the first voltage V1. The first voltage V1 is, for example, the select voltage.

On the other hand, in the first operation OP1, the controller 70 sets the third magnetic layer 13 to a second voltage V2. In other words, in the first operation OP1, the controller 70 sets a second potential difference between the first region 21a and the third magnetic layer 13 to the second voltage V2. The second voltage V2 is, for example, the unselect voltage. The second voltage V2 is different from the first voltage V1. For example, the absolute value of the first voltage V1 is greater than the absolute value of the second voltage V2. For example, the polarity of the first voltage V1 is different from the polarity of the second voltage V2.

In the first operation OP1, the controller 70 supplies the first current Iw1 to the conductive layer 21. The first current Iw1 has the orientation from the first region 21a toward the fourth region 21d.

In such a first operation OP1, for example, the second magnetization 12M of the second magnetic layer 12 in the selected state is oriented in the +Y direction. This is due to the magnetic effect from the conductive layer 21. On the other hand, the fourth magnetization 14M of the fourth magnetic layer 14 in the unselected state substantially does not change. In the example, the fourth magnetization 14M maintains the initial state (in the example, the +Y direction).

Figure 54B:
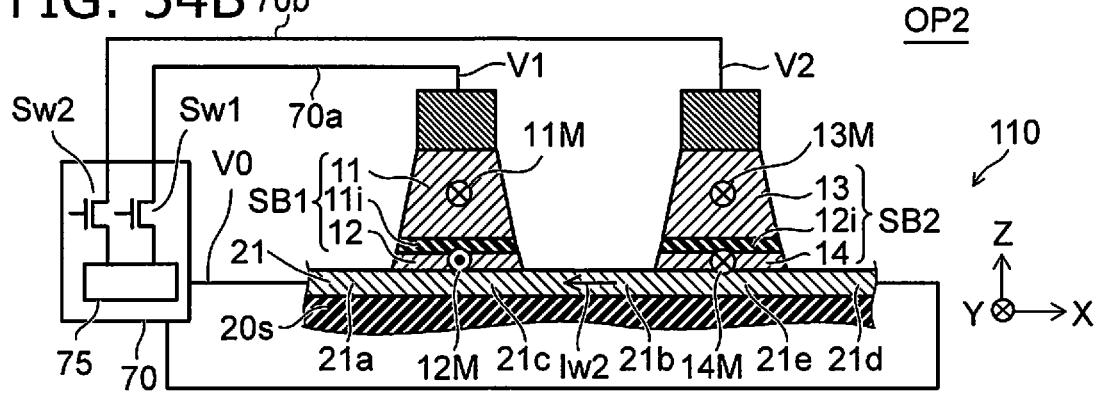

In a second operation OP2 as shown in FIG. 54B, the controller 70 sets the first region 21a of the conductive layer 21 to the potential V0. In the second operation OP2, the controller 70 sets the first potential difference between the first region 21a and the first magnetic layer 11 to the first voltage V1. In the second operation OP2, the controller 70 sets the second potential difference between the first region 21a and the third magnetic layer 13 to the second voltage V2. In the second operation OP2, the controller 70 supplies the second current Iw2 to the conductive layer 21. The second current Iw2 has the orientation from the fourth region 21d toward the first region 21a.

At this time, for example, the second magnetization 12M of the second magnetic layer 12 in the selected state changes to the −Y direction. This is due to the magnetic effect from the conductive layer 21. On the other hand, the fourth magnetization 14M of the fourth magnetic layer 14 in the unselected state substantially does not change. In the example, the fourth magnetization 14M is maintained in the initial state (in the example, the +Y direction).

The electrical resistance between the first magnetic layer 11 and the first region 21a after the first operation OP1 is taken as the first electrical resistance. The first magnetic layer 11 after the second operation OP2 and the electrical resistance between the first region 21a is taken as the second electrical resistance. The first electrical resistance is different from the second electrical resistance. In the example, the first electrical resistance is lower than the second electrical resistance.

On the other hand, the electrical resistance between the third magnetic layer 13 and the first region 21a after the first operation OP1 recited above is taken as a third resistance. The electrical resistance between the third magnetic layer 13 and the first region 21a after the second operation OP2 recited above is taken as the fourth electrical resistance. The third electrical resistance is substantially the same as the fourth electrical resistance. This is because the fourth magnetization 14M of the fourth magnetic layer 14 substantially does not change.

Thus, in the embodiment, the absolute value of the difference between the first electrical resistance and the second electrical resistance is greater than the absolute value of the difference between the third electrical resistance and the fourth electrical resistance.

Thus, in the first stacked body SB1 in the selected state, the change of the electrical resistance is formed by the first current Iw1 or the second current Iw2. In other words, the programming of information is performed. On the other hand, in the second stacked body SB2 in the unselected state, the change of the electrical resistance is not formed by the first current Iw1 or the second current Iw2.

Figure 54C:
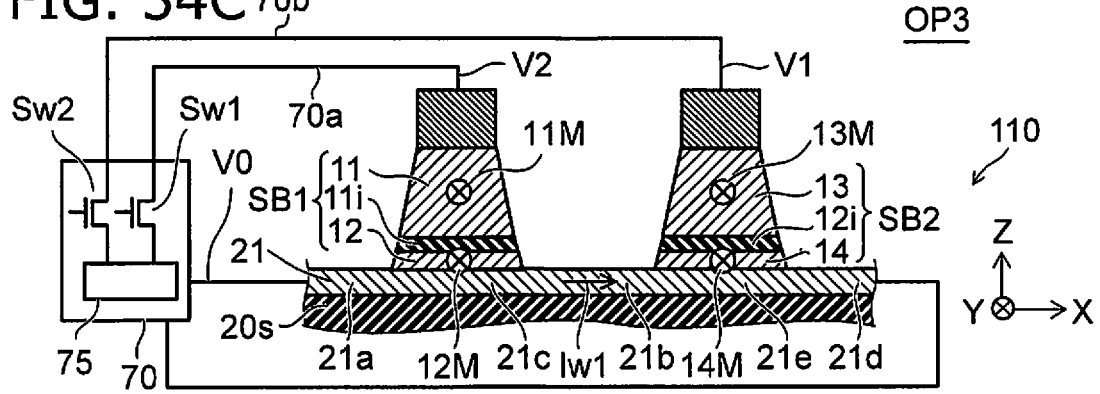

In an example of a third operation OP3 shown in FIG. 54C, the first stacked body SB1 is set to the unselected state; and the second stacked body SB2 is set to the selected state. At this time, in the first operation OP1, the controller 70 sets the first potential difference between the first region 21a and the first magnetic layer 11 to the first voltage V1 (referring to FIG. 54A). On the other hand, in the second operation OP2, the controller 70 sets the first potential difference to the first voltage V1 (referring to FIG. 54B). In the third operation OP3 as shown in FIG. 54C, the controller 70 sets the first potential difference between the first region 21a and the first magnetic layer 11 to the second voltage V2 (the unselect voltage). In the third operation OP3, the controller 70 supplies the first current Iw1 to the conductive layer 21.

At this time, the second magnetization 12M of the second magnetic layer 12 in the unselected state is the same as the state of FIG. 54A. On the other hand, the fourth magnetization 14M of the fourth magnetic layer 14 in the selected state changes from the state of FIG. 54A.

Figure 54D:
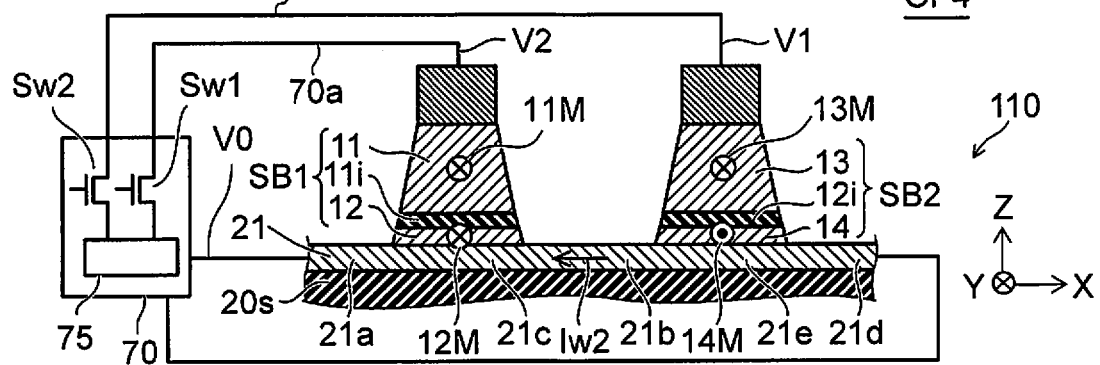

In a fourth operation OP4 shown in FIG. 54D as well, the first stacked body SB1 is set to the unselected state; and the second stacked body SB2 is set to the selected state. In the fourth operation OP4, the controller 70 sets the first potential difference to the second voltage V2. In the fourth operation OP4, the controller 70 supplies the second current Iw2 to the conductive layer 21.

In the first stacked body SB1 which is in the unselected state, the electrical resistance is substantially the same between the third operation OP3 and the fourth operation OP4. On the other hand, in the second stacked body SB2 which is in the selected state, the electrical resistance changes between the third operation OP3 and the fourth operation OP4.

Thus, the absolute value of the difference between the first electrical resistance after the first operation OP1 and the second electrical resistance after the second operation OP2 is greater than the absolute value of the difference between the electrical resistance between the first magnetic layer 11 and the first region 21a after the third operation OP3 and the electrical resistance between the first magnetic layer 11 and the first region 21a after the fourth operation OP4.

The multiple stacked bodies correspond respectively to multiple memory cells. It is possible to store mutually-different information in the multiple memory cells. When storing the information in the multiple memory cells, for example, one of "1" or "0" may be stored in the multiple memory cells; and subsequently, the other of "1" or "0" may be stored in some of the multiple memory cells as desired. For example, one of "1" or "0" may be stored in one of the multiple memory cells; and subsequently, one of "1" or "0" may be stored in another one of the multiple memory cells.

In the description recited above, the first region 21a and the fourth region 21d are interchangeable with each other. For example, the electrical resistance recited above may be the electrical resistance between the first magnetic layer 11 and the fourth region 21d. The electrical resistance recited above may be the electrical resistance between the third magnetic layer 13 and the fourth region 21d.

Examples of other operations will now be described.

Figure 55A:
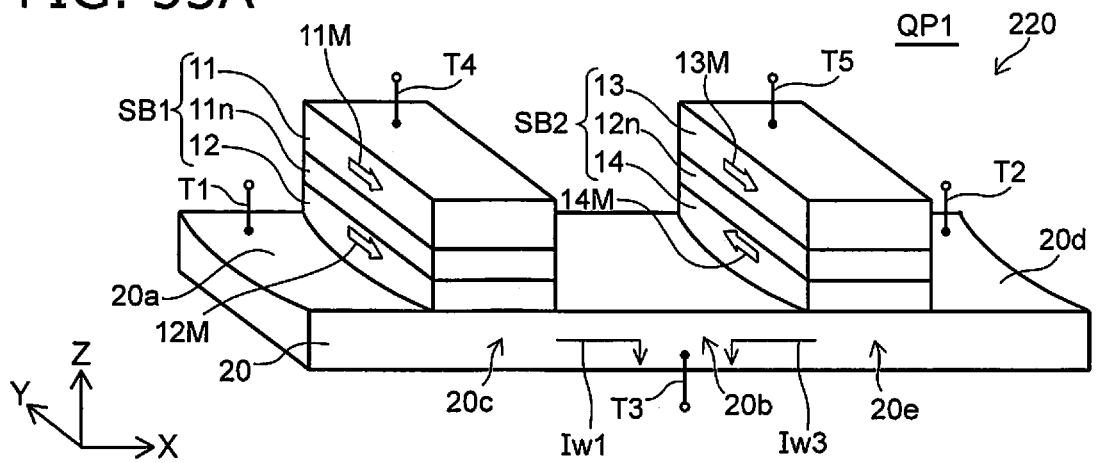
FIG. 55A to FIG. 55C are schematic perspective views illustrating a magnetic memory device according to the embodiment.
Figure 55B:
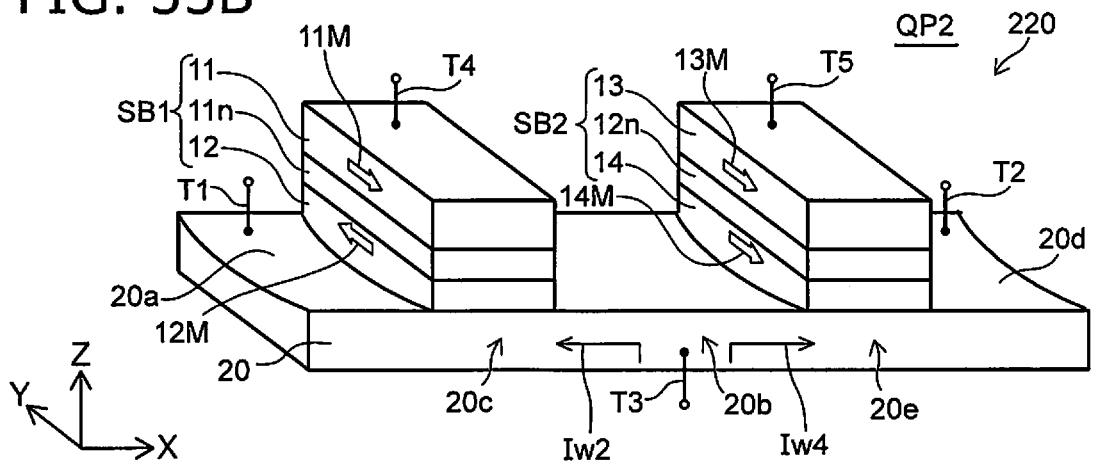
Figure 55C:
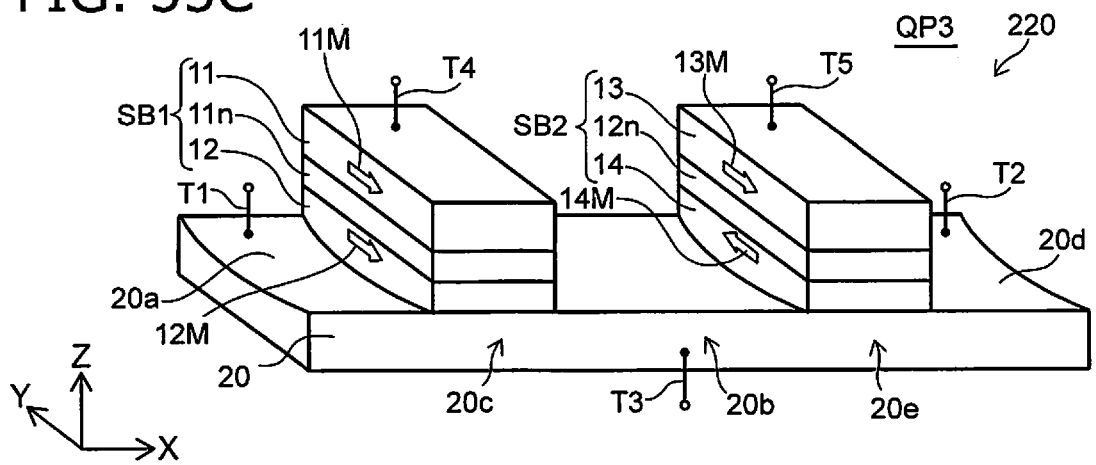

FIG. 55A to FIG. 55C are schematic perspective views illustrating a magnetic memory device according to the embodiment.

As shown in FIG. 55A, the multiple stacked bodies (the first stacked body SB1 and the second stacked body SB2) are provided in the magnetic memory device 220 according to the embodiment. In the magnetic memory device 220, the current that flows in the first stacked body SB1 and the current that flows in the second stacked body SB2 are different.

The first stacked body SB1 overlaps the third region 21c in the first direction (the Z-axis direction). The second stacked body SB2 overlaps the fifth region 21e in the first direction.

For example, a first terminal T1 is electrically connected to the first region 21a of the conductive layer 21. A second terminal T2 is electrically connected to the fourth region 21d. A third terminal T3 is electrically connected to the second region 21b. A fourth terminal T4 is electrically connected to the first magnetic layer 11. A fifth terminal T5 is electrically connected to the third magnetic layer 13.

In one operation QP1 as shown in FIG. 55A, the first current Iw1 flows from the first terminal T1 toward the third terminal T3; and a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation QP1, the orientation of the spin Hall torque effect on the second magnetic layer 12 of the first stacked body SB1 is the reverse of the orientation of the spin Hall torque effect on the fourth magnetic layer 14 of the second stacked body SB2.

In another operation QP2 shown in FIG. 55B, the second current Iw2 flows from the third terminal T3 toward the first terminal T1; and a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation QP2, the orientation of the spin Hall torque effect on the second magnetic layer 12 of the first stacked body SB1 is the reverse of the orientation of the spin Hall torque effect on the fourth magnetic layer 14 of the second stacked body SB2.

As shown in FIG. 55A and FIG. 55B, the orientation of the fourth magnetization 14M of the fourth magnetic layer 14 is the reverse of the orientation of the second magnetization 12M of the second magnetic layer 12. On the other hand, the orientation of the third magnetization 13M of the third magnetic layer 13 is the same as the orientation of the first magnetization 11M of the first magnetic layer 11. Thus, magnetization information that has reverse orientations between the first stacked body SB1 and the second stacked body SB2 is stored. For example, the information (the data) in the case of the operation QP1 corresponds to "1." For example, the information (the data) in the case of the operation QP2 corresponds to "0." By such operations, for example, the reading can be faster as described below.

In the operation QP1 and the operation QP2, the second magnetization 12M of the second magnetic layer 12 and the spin current of the electrons (the polarized electrons) flowing through the conductive layer 21 have an interaction. The orientation of the second magnetization 12M and the orientation of the spin of the polarized electrons have a parallel or antiparallel relationship. The second magnetization 12M of the second magnetic layer 12 precesses and reverses. In the operation QP1 and the operation QP2, the orientation of the fourth magnetization 14M of the fourth magnetic layer 14 and the orientation of the spin of the polarized electrons have a parallel or antiparallel relationship. The fourth magnetization 14M of the fourth magnetic layer 14 precesses and reverses.

FIG. 55C illustrates a read operation of the magnetic memory device 220.

In the read operation QP3, the potential of the fourth terminal T4 is set to a fourth potential V4. The potential of the fifth terminal T5 is set to a fifth potential V5. The fourth potential V4 is, for example, the ground potential. The potential difference between the fourth potential V4 and the fifth potential V5 is taken as ΔV. The two electrical resistances are taken as a high resistance Rh and a low resistance Rl for each of the multiple stacked bodies. The high resistance Rh is higher than the low resistance Rl. For example, the resistance when the first magnetization 11M and the second magnetization 12M are antiparallel corresponds to the high resistance Rh. For example, the resistance when the first magnetization 11M and the second magnetization 12M are parallel corresponds to the low resistance Rl. For example, the resistance when the third magnetization 13M and the fourth magnetization 14M are antiparallel corresponds to the high resistance Rh. For example, the resistance when the third magnetization 13M and the fourth magnetization 14M are parallel corresponds to the low resistance Rl.

For example, in the operation QP1 (the "1" state) illustrated in FIG. 55A, a potential Vr1 of the third terminal T3 is represented by Formula (1).

$$Vr1 = (Rl/(Rl+Rh)) \times \Delta V \quad (1)$$

On the other hand, in the state of the operation QP2 (the "0" state) illustrated in FIG. 55B, a potential Vr2 of the third terminal T3 is represented by Formula (2).

$$Vr2 = (Rh/(Rl+Rh)) \times \Delta V \quad (2)$$

Accordingly, a potential change ΔVr between the "1" state and the "0" state is represented by Formula (3).

$$\Delta Vr = Vr2 - Vr1 = ((Rh-Rl)/(Rl+Rh)) \times \Delta V \quad (3)$$

The potential change ΔVr is obtained by measuring the potential of the third terminal T3.

Compared to the case where a constant current is supplied to the stacked body (the magnetoresistive element) and the voltage (the potential difference) between the two magnetic layers of the magnetoresistive element is measured, for example, the consumed energy when reading can be reduced in the read operation QP3 recited above. In the read operation QP3 recited above, for example, high-speed reading can be performed.

Thus, the controller 70 is configured to further perform at least the read operation QP3 of applying a voltage between the first magnetic layer (the fourth terminal T4) and the third magnetic layer (the fifth terminal T5), and detecting a potential of the second region (the third terminal T3).

In the operation QP1 and the operation QP2 recited above, the perpendicular magnetic anisotropies of the second magnetic layer 12 and the fourth magnetic layer 14 can be controlled using the fourth terminal T4 and the fifth terminal T5. Thereby, the program current can be reduced. For example, the program current can be about ½ of the program current of the case where the programming is performed without using the fourth terminal T4 and the fifth terminal T5. For example, the program charge can be reduced. The relationship between the polarities of the voltages applied to the fourth terminal T4 and the fifth terminal T5 and the increase and decrease of the perpendicular magnetic anisotropy is dependent on the materials of the magnetic layers and the conductive layer 21.

Figure 56:
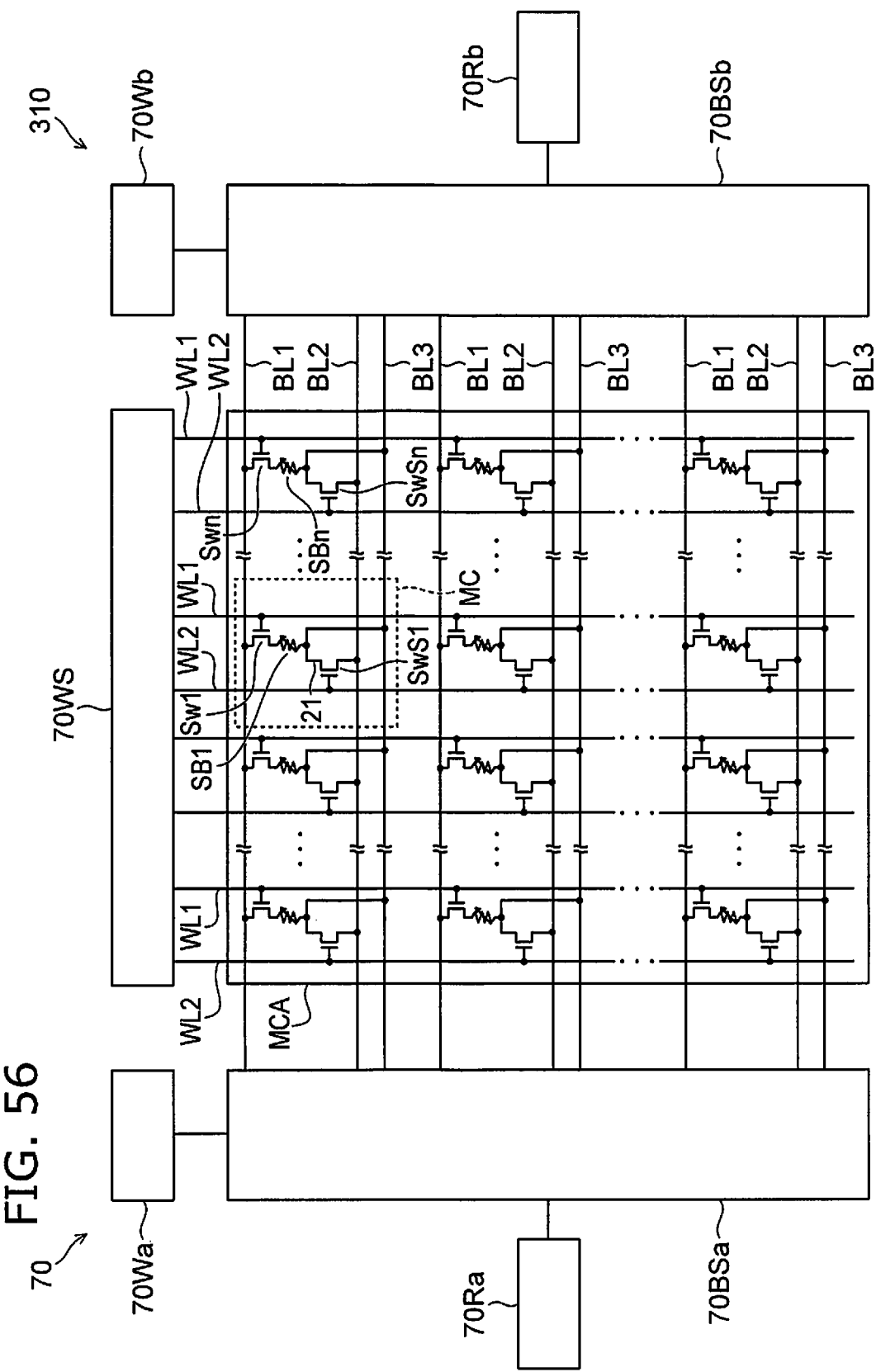
FIG. 56 is a schematic view showing a magnetic memory device according to the embodiment.

FIG. 56 is a schematic view showing a magnetic memory device according to the embodiment.

As shown in FIG. 56, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310. The multiple first interconnects extend in one direction. The multiple second interconnects extend in another one direction. The controller 70 includes a word line selection circuit 70WS, a first bit line selection circuit 70BSa, a second bit line selection circuit 70BSb, a first program circuit 70Wa, a second program circuit 70Wb, a first read circuit 70Ra, and a second read circuit 70Rb. Multiple memory cells MC are arranged in an array configuration in the memory cell array MCA.

For example, the switch Sw1 and a switch SwS1 are provided to correspond to one of the multiple memory cells MC. These switches are considered to be included in one of the multiple memory cells. These switches may be considered to be included in the controller 70. These switches are, for example, transistors. The one of the multiple memory cells MC includes, for example, a stacked body (e.g., the first stacked body SB1).

As described above, multiple stacked bodies (the first stacked body SB1, the second stacked body SB2, etc.) may be provided in one conductive layer 21. Multiple switches (the switch Sw1, the switch Sw2, etc.) may be provided respectively for the multiple stacked bodies. In FIG. 56, one stacked body (the stacked body SB1 or the like) and one switch (the switch Sw1 or the like) are drawn to correspond to one conductive layer 21 for easier viewing of the drawing.

As shown in FIG. 56, one end of the first stacked body SB1 is connected to the conductive layer 21. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first region 21a) of the conductive layer 21 is connected to one of the source or the drain of the switch SwS1. The other end (e.g., the fourth region 21d) of the conductive layer 21 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the program operation of the information to the memory cell MC will now be described.

The switch SwS1 of one memory cell MC (the selected memory cell) to which the programming is to be performed is set to the ON state. For example, in the ON state, the word line WL2 that is connected to the gate of one switch SwS1 is set to a high-level potential. The setting of the potential is performed by the word line selection circuit 70WS. The switch SwS1 of another memory cell MC (an unselected memory cell) of the column including the one memory cell MC (the selected memory cell) recited above also is set to the ON state. In one example, the word line WL1 that is connected to the gate of the switch Sw1 inside the memory cell MC (the selected memory cell) and the word lines WL1 and WL2 that correspond to the other columns are set to a low-level potential.

One stacked body and one switch Sw1 that correspond to one conductive layer 21 are drawn in FIG. 56. As described above, the multiple stacked bodies (the stacked body SB1, the second stacked body SB2, etc.) and the multiple switches (the switch Sw1, the switch Sw2, etc.) that correspond to one conductive layer 21 are provided. In such a case, for example, the switches that are connected respectively to the multiple stacked bodies are set to the ON state. The select voltage is applied to one of the multiple stacked bodies. On the other hand, the unselect voltage is applied to the other stacked bodies. Programming is performed to the one of the multiple stacked bodies recited above; and the programming is not performed to the other stacked bodies. Selective programming of the multiple stacked bodies is performed.

The bit lines BL2 and BL3 that are connected to the memory cell MC (the selected cell) to which the programming is to be performed are selected. The selection is performed by the first bit line selection circuit 70BSa and the second bit line selection circuit 70BSb. The program current is supplied to the selected bit lines BL2 and BL3. The supply of the program current is performed by the first program circuit 70Wa and the second program circuit 70Wb. The program current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12, etc.) of the MTJ element (the first stacked body SB1 or the like) is changeable by the program current. The magnetization direction of the memory layer of the MTJ element is changeable to the reverse of the direction recited above when the program current flows toward the one of the first bit line selection circuit 70BSa or the second bit line selection circuit 70BSb from the other of the first bit line selection circuit 70BSa or the second bit line selection circuit 70BSb. Thus, the programming is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON state. At this time, the switches Sw1 of the other memory cells MC (the unselected cells) of the column including the memory cell MC (the selected cell) recited above also are set to the ON state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the selected bit line BL1 and bit line BL3. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is detected by the first read circuit 70Ra and the second read circuit 70Rb. For example, the difference between the magnetization of the memory layer (the second magnetic layer 12) of the MTJ element and the magnetization of the reference layer (the first magnetic layer 11) is detected. The difference includes the orientation of the magnetization being in a mutually-parallel state (having the same orientation) or a mutually-antiparallel state (having the reverse orientation). Thus, the read operation is performed.

According to the embodiments, a magnetic memory device can be provided in which more stable operations are obtained.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch such as a transistor or the like) is inserted between multiple conductive bodies so that a state is formable in which a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in conductive layers, magnetic layers, non-magnetic layers and controller, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a conductive layer including a first region, a second region, and a third region between the first region and the second region;
   a first magnetic layer;
   a second magnetic layer provided between the third region and the first magnetic layer in a first direction crossing a second direction, the second direction being from the first region toward the second region; and
   a first nonmagnetic layer provided between the first magnetic layer and the second magnetic layer,
   the second region including first to third conductive portions,
   a direction from the first conductive portion toward the second conductive portion being aligned with a third direction, the third direction crossing a plane including the first direction and the second direction,
   the third conductive portion being between the first conductive portion and the second conductive portion in the third direction,
   a thickness along the first direction of the first conductive portion being thicker than a thickness along the first direction of the third conductive portion,
   wherein
      at least a portion of the conductive layer includes a first layer and a second layer,
      a portion of the second layer is between the first layer and the second magnetic layer,
      another portion of the second layer is included in the first conductive portion, and
      the second layer includes a second metallic element different from a first metallic element, the first metallic element being included in the first layer.

2. The device according to claim 1, wherein a thickness along the first direction of the second conductive portion is thicker than the thickness along the first direction of the third conductive portion.

3. The device according to claim 1, wherein
   at least a portion of the third conductive portion does not include the second layer, or
   a thickness along the first direction of the second layer included in the at least a portion of the third conductive portion is thinner than a thickness along the first direction of the second layer included in the first conductive portion.

4. The device according to claim 1, A magnetic memory device, comprising:
   a conductive layer including a first region, a second region, and a third region between the first region and the second region;
   a first magnetic layer;
   a second magnetic layer provided between the third region and the first magnetic layer in a first direction crossing a second direction, the second direction being from the first region toward the second region; and
   a first nonmagnetic layer provided between the first magnetic layer and the second magnetic layer,
   the second region including first to third conductive portions,
   a direction from the first conductive portion toward the second conductive portion being aligned with a third direction, the third direction crossing a plane including the first direction and the second direction,
   the third conductive portion being between the first conductive portion and the second conductive portion in the third direction, a thickness along the first direction of the first conductive portion being thicker than a thickness along the first direction of the third conductive portion, wherein the second magnetic layer includes a first end portion and a second end portion, a direction from the first end portion toward the second end portion is aligned with the third direction, and a position in the third direction of at least a portion of the first conductive portion is between a position in the third direction of the first end portion and a position in the third direction of the second end portion.

5. The device according to claim 1, wherein the second magnetic layer includes first to third magnetic portions, a direction from the first magnetic portion toward the second magnetic portion is aligned with the third direction, the third magnetic portion is between the first magnetic portion and the second magnetic portion in the third direction, and a length along the second direction of the first magnetic portion is longer than a length along the second direction of the third magnetic portion.

6. The device according to claim 1, wherein the thickness along the first direction of the first conductive portion is not less than 1.02 times and not more than 1.5 times the thickness along the first direction of the third conductive portion.

7. The device according to claim 1, wherein the second region further includes a fourth conductive portion and a fifth conductive portion, the first conductive portion is between the fourth conductive portion and the fifth conductive portion in the third direction, the third conductive portion is between the first conductive portion and the fifth conductive portion in the third direction, the second conductive portion is between the third conductive portion and the fifth conductive portion in the third direction, and a thickness along the first direction of at least a portion of the fourth conductive portion is thinner than the thickness along the first direction of the first conductive portion.

8. A magnetic memory device, comprising:

a conductive layer including a first region, a second region, and a third region between the first region and the second region;

a first magnetic layer;

a second magnetic layer provided between the third region and the first magnetic layer in a first direction crossing a second direction, the second direction being from the first region toward the second region; and a first nonmagnetic layer provided between the first magnetic layer and the second magnetic layer, the second magnetic layer including first to third magnetic portions, a direction from the first magnetic portion toward the second magnetic portion being aligned with a third direction, the third direction crossing a plane including the first direction and the second direction, the third magnetic portion being between the first magnetic portion and the second magnetic portion in the third direction, a length along the second direction of the first magnetic portion being longer than not less than 1.05 times and not more than 1.5 times a length along the second direction of the third magnetic portion.

9. The device according to claim 8, wherein a length along the second direction of the second magnetic portion is longer than the length along the second direction of the third magnetic portion.

10. The device according to claim 1, wherein the first metallic element includes at least one selected from the group consisting of tantalum and tungsten, and the second metallic element includes hafnium.

11. The device according to claim 1, wherein at least one of a distance along the second direction between the first conductive portion and the third region, a distance along the second direction between the second conductive portion and the third region, or a distance along the second direction between the third conductive portion and the third region is not more than ½ of a length along the second direction of the second magnetic layer.

12. The device according to claim 1, wherein at least one of the first to third conductive portions contacts the third region.

13. The device according to claim 1, further comprising a third magnetic layer;

a fourth magnetic layer;

a second nonmagnetic layer; and a controller, the conductive layer further including a fourth region and a fifth region, the second region being provided between the first region and the fourth region in the second direction, the fifth region being provided between the second region and the fourth region in the second direction, the fourth magnetic layer being provided between the fifth region and the third magnetic layer in the first direction, the second nonmagnetic layer being provided between the third magnetic layer and the fourth magnetic layer, the controller being electrically connected to the first region, the second region and the fourth region, the controller being configured to perform at least a first program operation of supplying a first current to the conductive layer and supplying a second current to the conductive layer, the first current having a direction from the first region toward the second region, the second current having a direction from the fourth region toward the second region.

14. The device according to claim 13, wherein the controller is configured to further perform at least a second program operation of supplying a third current to the conductive layer and supplying a fourth current to the conductive layer, the third current having a direction from the second region toward the first region, the fourth current having a direction from the second region toward the fourth region.

15. The device according to claim 14, wherein the controller is further connected to the first magnetic layer and the third magnetic layer, the controller is configured to further perform at least a read operation of applying a voltage between the first magnetic layer and the third magnetic layer, and detecting a potential of the second region.

* * * * *